(12) United States Patent
Yamazaki et al.

(10) Patent No.: US 9,515,134 B2
(45) Date of Patent: *Dec. 6, 2016

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masahiro Takahashi, Atsugi (JP); Tetsunori Maruyama, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/056,286

(22) Filed: Feb. 29, 2016

(65) Prior Publication Data

US 2016/0181434 A1 Jun. 23, 2016

Related U.S. Application Data

(60) Continuation of application No. 14/270,697, filed on May 6, 2014, now Pat. No. 9,281,358, which is a division of application No. 13/297,474, filed on Nov. 16, 2011, now Pat. No. 8,728,883.

(30) Foreign Application Priority Data

Nov. 30, 2010 (JP) .................................. 2010-267896
Nov. 30, 2010 (JP) .................................. 2010-267901

(51) Int. Cl.
*H01L 29/66* (2006.01)
*H01L 21/84* (2006.01)
(Continued)

(52) U.S. Cl.
CPC ........... *H01L 29/06* (2013.01); *H01L 21/0242* (2013.01); *H01L 21/0259* (2013.01);
(Continued)

(58) Field of Classification Search
CPC .............................. H01L 29/04; H01L 29/06
USPC .................... 257/335, 325, 67, 43, E31.034, 257/E31.047; 438/162, 104
See application file for complete search history.

(56) References Cited

U.S. PATENT DOCUMENTS 5,225,398 A 7/1993 Nakanishi et al.
5,528,032 A 6/1996 Uchiyama
(Continued)

FOREIGN PATENT DOCUMENTS

CN 001659711 A 8/2005
CN 001806322 A 7/2006
(Continued)

OTHER PUBLICATIONS
International Search Report (Application No. PCT/JP2010/069872) Dated Feb. 8, 2011.
(Continued)

*Primary Examiner* — Calvin Lee
(74) *Attorney, Agent, or Firm* — Robinson Intellectual Property Law Office; Eric J. Robinson

(57) ABSTRACT

A highly reliable semiconductor device is manufactured by giving stable electric characteristics to a transistor in which an oxide semiconductor film is used for a channel. An oxide semiconductor film which can have a first crystal structure by heat treatment and an oxide semiconductor film which can have a second crystal structure by heat treatment are formed so as to be stacked, and then heat treatment is performed; accordingly, crystal growth occurs with the use of an oxide semiconductor film having the second crystal structure as a seed, so that an oxide semiconductor film having the first crystal structure is formed. An oxide semiconductor film formed in this manner is used for an active layer of the transistor.

20 Claims, 20 Drawing Sheets

(51) Int. Cl.
*H01L 29/06* (2006.01)
*H01L 29/36* (2006.01)
*H01L 21/02* (2006.01)
*H01L 29/786* (2006.01)

(52) U.S. Cl.
CPC ... *H01L21/02422* (2013.01); *H01L 21/02472* (2013.01); *H01L 21/02483* (2013.01); *H01L 21/02502* (2013.01); *H01L 21/02513* (2013.01); *H01L 21/02554* (2013.01); *H01L 21/02565* (2013.01); *H01L 29/36* (2013.01); *H01L 29/66969* (2013.01); *H01L 29/7869* (2013.01); *H01L 29/78693* (2013.01)

(56) References Cited

U.S. PATENT DOCUMENTS

| | | |
|---|---|---|
| 5,625,202 A | 4/1997 | Chai |
| 5,731,856 A | 3/1998 | Kim et al. |
| 5,744,864 A | 4/1998 | Cillessen et al. |
| 5,817,548 A | 10/1998 | Noguchi et al. |
| 5,943,593 A | 8/1999 | Noguchi et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,838,308 B2 | 1/2005 | Haga |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,157,307 B2 | 1/2007 | Ishizaki |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 7,847,287 B2 | 12/2010 | Kim et al. |
| 7,893,495 B2 | 2/2011 | Li et al. |
| 7,935,964 B2 | 5/2011 | Kim et al. |
| 7,960,727 B2 | 6/2011 | Nakahara et al. |
| 7,994,500 B2 | 8/2011 | Kim et al. |
| 8,038,857 B2 | 10/2011 | Inoue et al. |
| 8,058,645 B2 | 11/2011 | Jeong et al. |
| 8,093,589 B2 | 1/2012 | Sugihara et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,232,551 B2 | 7/2012 | Kim et al. |
| 8,274,078 B2 | 9/2012 | Itagaki et al. |
| 8,293,661 B2 | 10/2012 | Yamazaki |
| 8,367,489 B2 | 2/2013 | Yamazaki |
| 8,432,187 B2 | 4/2013 | Kato et al. |
| 8,541,258 B2 | 9/2013 | Kim et al. |
| 8,558,233 B2 | 10/2013 | Yamazaki |
| 8,659,016 B2 | 2/2014 | Kim et al. |
| 8,728,883 B2 * | 5/2014 | Yamazaki ........... H01L 21/0242 257/335 |
| 8,809,852 B2 | 8/2014 | Yamazaki et al. |
| 9,281,358 B2 * | 3/2016 | Yamazaki ........... H01L 21/0242 257/335 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0164888 A1 | 11/2002 | Roh et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017261 A1 | 1/2005 | Ishizaki |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0056984 A1 | 3/2008 | Yoshioka et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0206332 A1 | 8/2009 | Son et al. |
| 2009/0224238 A1 | 9/2009 | Kim et al. |
| 2009/0242992 A1 | 10/2009 | Kim et al. |
| 2009/0278122 A1 | 11/2009 | Hosono et al. |
| 2009/0280600 A1 | 11/2009 | Hosono et al. |
| 2009/0283763 A1 | 11/2009 | Park et al. |

(56) References Cited

U.S. PATENT DOCUMENTS

| | | |
|---|---|---|
| 2009/0321732 A1 | 12/2009 | Kim et al. |
| 2010/0038641 A1 | 2/2010 | Imai |
| 2010/0051935 A1 | 3/2010 | Lee et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |
| 2010/0123130 A1 | 5/2010 | Akimoto et al. |
| 2010/0163874 A1 | 7/2010 | Koyama et al. |
| 2010/0176383 A1 | 7/2010 | Park et al. |
| 2010/0244022 A1 | 9/2010 | Takahashi et al. |
| 2010/0252832 A1 | 10/2010 | Asano et al. |
| 2010/0276689 A1 | 11/2010 | Iwasaki |
| 2010/0279462 A1 | 11/2010 | Iwasaki |
| 2010/0283055 A1 | 11/2010 | Inoue et al. |
| 2010/0283509 A1 | 11/2010 | Kim et al. |
| 2010/0320458 A1 | 12/2010 | Umeda et al. |
| 2010/0320459 A1 | 12/2010 | Umeda et al. |
| 2011/0042669 A1 | 2/2011 | Kim et al. |
| 2011/0049509 A1 | 3/2011 | Takahashi et al. |
| 2011/0062436 A1 | 3/2011 | Yamazaki et al. |
| 2011/0068335 A1 | 3/2011 | Yamazaki et al. |
| 2011/0068852 A1 | 3/2011 | Yamazaki et al. |
| 2011/0073856 A1 | 3/2011 | Sato et al. |
| 2011/0084271 A1 | 4/2011 | Yamazaki et al. |
| 2011/0101356 A1 | 5/2011 | Yamazaki |
| 2011/0108837 A1 | 5/2011 | Yamazaki et al. |
| 2011/0115839 A1 | 5/2011 | Takahashi et al. |
| 2011/0127521 A1 | 6/2011 | Yamazaki |
| 2011/0127522 A1 | 6/2011 | Yamazaki |
| 2011/0127523 A1 | 6/2011 | Yamazaki |
| 2011/0127579 A1 | 6/2011 | Yamazaki |
| 2011/0133180 A1 | 6/2011 | Yamazaki |
| 2011/0133191 A1 | 6/2011 | Yamazaki |
| 2011/0147739 A1 | 6/2011 | Yamazaki et al. |
| 2011/0151618 A1 | 6/2011 | Yamazaki et al. |
| 2011/0175090 A1 | 7/2011 | Sugihara et al. |
| 2011/0193083 A1 | 8/2011 | Kim et al. |
| 2011/0215328 A1 | 9/2011 | Morosawa et al. |
| 2011/0284848 A1 | 11/2011 | Yamazaki |
| 2012/0032163 A1 | 2/2012 | Yamazaki |
| 2012/0052624 A1 | 3/2012 | Yamazaki |
| 2012/0064665 A1 | 3/2012 | Yamazaki |
| 2012/0119205 A1 | 5/2012 | Taniguchi et al. |
| 2012/0132908 A1 | 5/2012 | Sugihara et al. |
| 2012/0205651 A1 | 8/2012 | Lee et al. |
| 2012/0256179 A1 | 10/2012 | Yamazaki et al. |
| 2012/0305913 A1 | 12/2012 | Yamazaki et al. |
| 2013/0082256 A1 | 4/2013 | Yamazaki |
| 2013/0099234 A1 | 4/2013 | Yamazaki |

FOREIGN PATENT DOCUMENTS

| | | |
|---|---|---|
| CN | 101304046 A | 11/2008 |
| CN | 101621076 A | 1/2010 |
| EP | 1313134 A | 5/2003 |
| EP | 1557889 A | 7/2005 |
| EP | 1737044 A | 12/2006 |
| EP | 2120267 A | 11/2009 |
| EP | 2141744 A | 1/2010 |
| EP | 2146379 A | 1/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 09-139506 A | 5/1997 |
| JP | 09-255491 A | 9/1997 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-041362 A | 2/2003 |
| JP | 2003-086000 A | 3/2003 |
| JP | 2003-086808 A | 3/2003 |
| JP | 2003-298062 A | 10/2003 |
| JP | 2004-022625 A | 1/2004 |
| JP | 2004-103957 A | 4/2004 |
| JP | 2004-153062 A | 5/2004 |
| JP | 2004-273614 A | 9/2004 |
| JP | 2004-273732 A | 9/2004 |
| JP | 2005-033172 A | 2/2005 |
| JP | 2007-096055 A | 4/2007 |
| JP | 2007-123861 A | 5/2007 |
| JP | 2008-199005 A | 8/2008 |
| JP | 2008-277665 A | 11/2008 |
| JP | 2009-231613 A | 10/2009 |
| JP | 2009-278115 A | 11/2009 |
| JP | 2010-016347 A | 1/2010 |
| JP | 2010-021555 A | 1/2010 |
| JP | 2010-040552 A | 2/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2012-099661 A | 5/2012 |
| JP | 2012-160679 A | 8/2012 |
| WO | WO-02/17368 | 2/2002 |
| WO | WO-2004/114391 | 12/2004 |
| WO | WO-2008/133345 | 11/2008 |
| WO | WO-2009/034953 | 3/2009 |

OTHER PUBLICATIONS

Written Opinion (Application No. PCT/JP2010/069872) Dated Feb. 8, 2011.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$GaZnO_4$—$ZnO$ system at 1350° C", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

(56) References Cited

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID International Symposium Digest of Technical Papers, May 31, 2009, pp. 1110-1112.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, MAy 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application". SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "SPINEL,YbFe2O4, and Yb2Fe3O7 Types of Structures for Compounds in the In2O3 and Sc2O3—A2O3—BO Systems [A; Fe; Ga; or Al; B: Mg, Mn, Fe, Ni, Cu,or Zn] at Temperaturs over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanes Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clarks et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Meiboom.S et al., "Theory of the Blue Phase of Cholesteric Liquid Crystals", Phys. Rev, Lett. (Physical Review Letters), May 4, 1981, vol. 46, No. 18, pp. 1216-1219.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Invitation to pay additional fees (Application No. PCT/JP2011/077451), International Searching Authority, Dated Dec. 20, 2011.

International Search Report (Application No. PCT/JP2011/077451) Dated Jan. 31, 2012.

Written Opinion (Application No. PCT/JP2011/077451) Dated Jan. 31, 2012.

Nakayama et al., "17a-Tl-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Chinese Office Action (Application No. 201180057486.7) Dated Aug. 4, 2015.

Kamiya.T et al., "Self-Adjusted, Three-Dimensional Lattice-Matched Buffer Layer for Growing ZnO Epitaxial Film: Homologous Series Layered Oxide, InGaO3(ZnO)5", Crystal Growth & Design, Sep. 27, 2006, vol. 6, No. 11, pp. 2451-2456.

\* cited by examiner

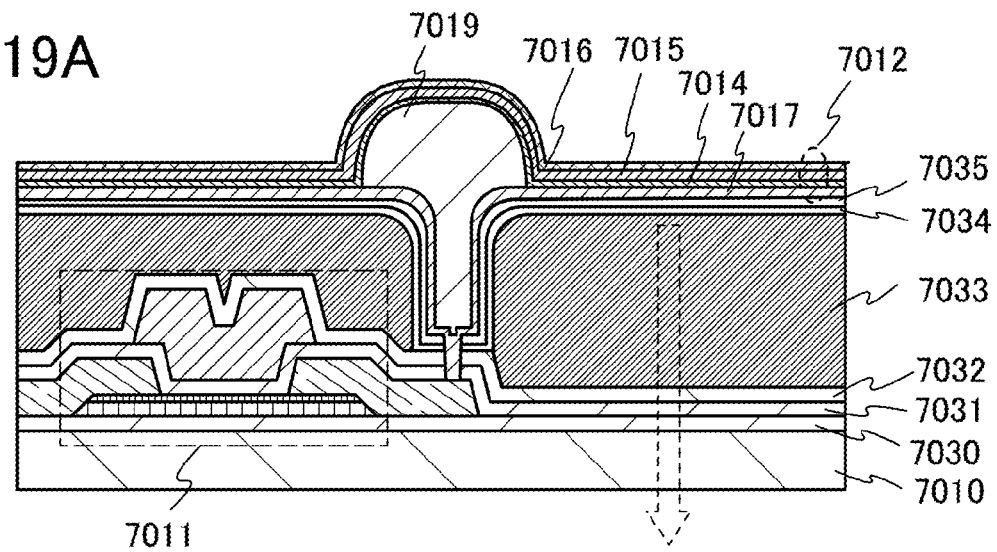
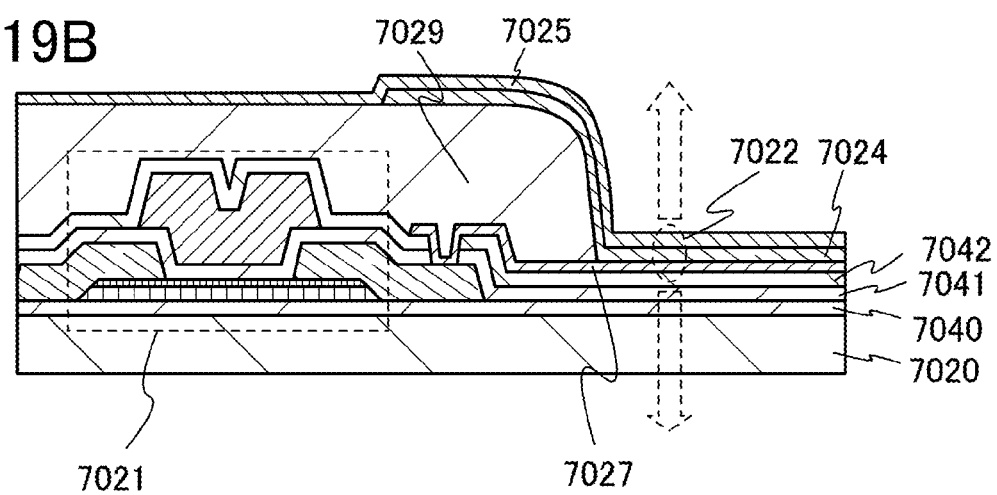
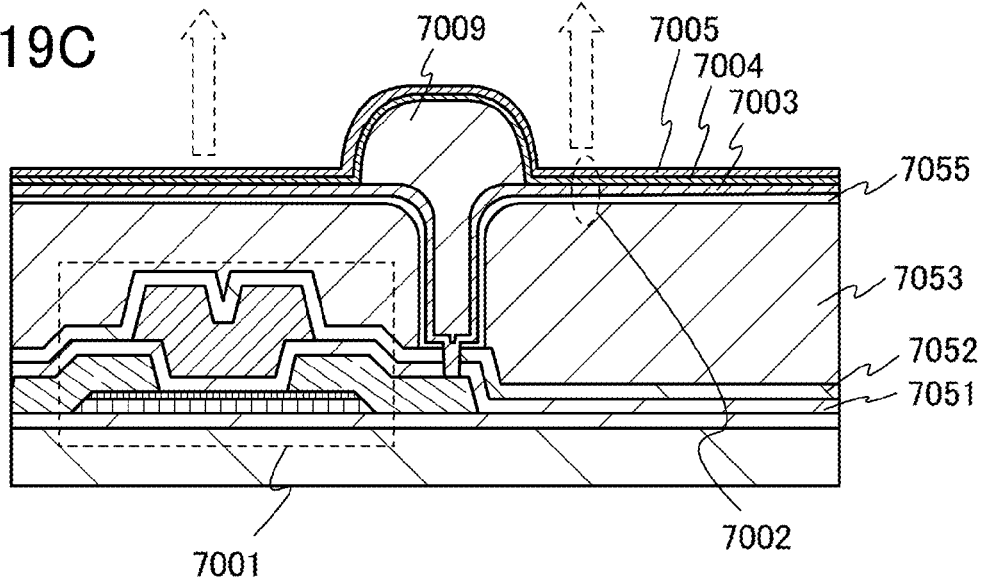

SEMICONDUCTOR DEVICE AND METHOD FOR MANUFACTURING SEMICONDUCTOR DEVICE

This application is a continuation of U.S. Ser. No. 14/270,697, filed May 6, 2014, now U.S. Pat. No. 9,281,358, issued Mar. 8, 2016, which is a divisional of U.S. Ser. No. 13/297,474 filed Nov. 16, 2011, now U.S. Pat. No. 8,728,883, issued May 20, 2014, which claims the benefit of a foreign priority application filed in Japan as Serial No. 2001-267901 on Nov. 30, 2010, and of a foreign priority application filed in Japan as Serial No. 2010-267896 on Nov. 30, 2010, all of which are incorporated by reference.

TECHNICAL FIELD

The present invention relates to a semiconductor device which includes a circuit including a semiconductor element such as a transistor, and a method for manufacturing the semiconductor device. For example, the present invention relates to a power device which is mounted on a power supply circuit; a semiconductor integrated circuit including a memory, a thyristor, a converter, an image sensor, or the like; and an electronic device on which an electro-optical device typified by a liquid crystal display panel, a light-emitting display device including a light-emitting element, or the like is mounted as a component.

In this specification, a semiconductor device means all types of devices which can function by utilizing semiconductor characteristics, and an electro-optical device, a light-emitting display device, a semiconductor circuit, and an electronic device are all semiconductor devices.

BACKGROUND ART

A transistor formed over a glass substrate or the like is manufactured using amorphous silicon, polycrystalline silicon, or the like, as typically seen in a liquid crystal display device. Although a transistor including amorphous silicon has low field effect mobility, it can be formed over a larger glass substrate. On the other hand, although a transistor including polycrystalline silicon has high field effect mobility, it is not suitable for being formed over a larger glass substrate.

In contrast to a transistor including silicon, attention has been drawn to a technique by which a transistor is manufactured using an oxide semiconductor and is applied to an electronic device or an optical device. For example, Patent Document 1 and Patent Document 2 disclose a technique by which a transistor is manufactured using zinc oxide or an In—Ga—Zn—O-based oxide as an oxide semiconductor and is used as a switching element of a pixel or the like of a display device.

REFERENCE

Patent Document

[Patent Document 1] Japanese Published Patent Application No. 2007-123861
[Patent Document 2] Japanese Published Patent Application No. 2007-96055

DISCLOSURE OF INVENTION

Electric characteristics of a transistor are easily affected by the condition of an interface between an oxide semiconductor film serving as an active layer and a gate insulating film in contact with the oxide semiconductor film. During or after manufacture of the transistor, if the interface where the gate insulating film is in contact with the oxide semiconductor film, that is, the gate-electrode-side interface of the oxide semiconductor film is in an amorphous state, the structural condition is easily changed by an influence of temperature or the like in the manufacturing process and electric characteristics of the transistor are likely to be unstable.

Further, electric characteristics of a transistor in which an oxide semiconductor film is used for a channel can be changed by irradiation with visible light or ultraviolet light.

In view of such problems, an object of one embodiment of the present invention is to provide a semiconductor device including a transistor in which the condition of an interface between an oxide semiconductor film and a gate insulating film in contact with the oxide semiconductor film is favorable, and to provide a method for manufacturing the semiconductor device. Further, an object of one embodiment of the present invention is to manufacture a highly reliable semiconductor device by giving stable electric characteristics to a transistor in which an oxide semiconductor film is used for a channel. Further, an object of one embodiment of the present invention is to provide a manufacturing process of a semiconductor device, which enables mass production of highly reliable semiconductor devices with the use of a large-sized substrate such as a mother glass.

In one embodiment of the present invention, in order to make the condition of an interface between an oxide semiconductor film and an insulating film (a gate insulating film) in contact with the oxide semiconductor film favorable, a region with high crystallinity is formed at least in the vicinity of the interface of the oxide semiconductor film. Accordingly, a highly reliable semiconductor device having stable electric characteristics can be manufactured.

Further, as a method for improving the crystallinity of the oxide semiconductor film, an oxide semiconductor film having a second crystal structure may be provided in part of the oxide semiconductor film. The second crystal structure is a wurtzite crystal structure. An oxide semiconductor film which can have the second crystal structure is easily crystallized by heat treatment and has high crystallinity as compared to an oxide semiconductor film which can have a first crystal structure, the first crystal structure being selected from a non-wurtzite structure, a $YbFe_2O_4$ structure, a $Yb_2Fe_3O_7$ structure, and deformed structures of the foregoing structures.

The oxide semiconductor film which can have the first crystal structure by heat treatment and the oxide semiconductor film which can have the second crystal structure by heat treatment are formed so as to be stacked, and then heat treatment is performed; thus, crystal growth occurs in the oxide semiconductor film which can have the first crystal structure by heat treatment with the use of the oxide semiconductor film having the second crystal structure as a seed, so that an oxide semiconductor film having the first crystal structure is formed.

The heat treatment is performed at a temperature higher than or equal to 150° C. and lower than or equal to 650° C., preferably higher than or equal to 200° C. and lower than or equal to 500° C.

Instead of performing the heat treatment for crystallization, the oxide semiconductor film can be formed by a sputtering method while being heated.

In this manner, for example, a layer including at least a second oxide semiconductor film is provided in an oxide semiconductor stack in which oxide semiconductor films are stacked and heat treatment is performed on the oxide semiconductor stack, whereby an oxide semiconductor film with high crystallinity can be obtained.

In addition, the thickness of the second oxide semiconductor film is greater than or equal to a thickness of one atomic layer and less than or equal to 10 nm, preferably greater than or equal to 2 nm and less than or equal to 5 nm.

In the above structure, the oxide semiconductor film is non-single-crystal, is not entirely in an amorphous state, and includes at least crystal having c-axis alignment.

One embodiment of the present invention is a method for manufacturing a semiconductor device including a transistor. In the method, a first oxide semiconductor film is formed over an insulating surface, and then a second oxide semiconductor film is formed; after that, first heat treatment is performed, so that an oxide semiconductor film having a first crystal structure and an oxide semiconductor film having a second crystal structure are formed. Next, a third oxide semiconductor film is formed over the oxide semiconductor film having the second crystal structure, and then second heat treatment is performed, so that an oxide semiconductor film having a third crystal structure is formed. The stack of the oxide semiconductor film having the first crystal structure, the oxide semiconductor film having the second crystal structure, and the oxide semiconductor film having the third crystal structure is used as a channel region of the transistor.

The crystal structures of the oxide semiconductor film having the first crystal structure and the oxide semiconductor film having the third crystal structure are each any one of a $YbFe_2O_4$ structure, a $Yb_2Fe_3O_7$ structure, and a non-wurtzite structure. The crystal structure of the oxide semiconductor film having the second crystal structure is a wurtzite structure.

The temperatures of the first heat treatment and the second heat treatment are each higher than or equal to 150° C. and lower than or equal to 650° C., preferably higher than or equal to 200° C. and lower than or equal to 500° C. Therefore, a mother glass which is a large-sized substrate can be used as a substrate.

Each of the oxide semiconductor film having the first crystal structure, the oxide semiconductor film having the second crystal structure, and the oxide semiconductor film having the third crystal structure is non-single-crystal, is not entirely in an amorphous state, and includes a c-axis-aligned crystal region. That is, each of the oxide semiconductor films has an amorphous region and a c-axis-aligned crystal region.

The oxide semiconductor film having the second crystal structure, which has a wurtzite crystal structure, is easily crystallized by heat treatment and has high crystallinity as compared to the oxide semiconductor film having the first crystal structure and the oxide semiconductor film having the third crystal structure. Further, the oxide semiconductor film having the second crystal structure includes bonds that form a hexagonal shape in a plane in the a-b plane. In addition, layers including hexagonal bonds are stacked and bonded in the thickness direction (the c-axis direction), so that c-axis alignment is obtained. Therefore, when crystal growth is caused in the first oxide semiconductor film and the third oxide semiconductor film by heating with the use of the oxide semiconductor film having the second crystal structure that is a wurtzite crystal structure as a seed, the oxide semiconductor film having the first crystal structure and the oxide semiconductor film having the third crystal structure can be formed so that the crystal axes thereof are generally aligned with the crystal axis of the oxide semiconductor film having the second crystal structure that is a wurtzite crystal structure. The oxide semiconductor film having the first crystal structure and the oxide semiconductor film having the third crystal structure each include bonds that form a hexagonal shape in a plane in the a-b plane as in the case of the oxide semiconductor film having the second crystal structure. In addition, layers including hexagonal bonds are stacked and bonded in the thickness direction (the c-axis direction), so that c-axis alignment is obtained.

By forming a gate insulating film over the above oxide semiconductor stack and forming a gate electrode over the gate insulating film, a transistor can be manufactured. As a result, the oxide semiconductor stack has high crystallinity and evenness at the interface with the gate insulating film and thus has stable electric characteristics; accordingly, a highly reliable transistor can be obtained.

By forming a gate insulating film over a gate electrode and forming the above oxide semiconductor stack over the gate insulating film, a transistor can be manufactured. As a result, the oxide semiconductor stack has high crystallinity and evenness at the interface with the gate insulating film and thus has stable electric characteristics; accordingly, a highly reliable transistor can be obtained.

The stack of the oxide semiconductor films each of which includes a c-axis-aligned crystal region having hexagonal bonds in the a-b plane is used for a channel region of a transistor, whereby a transistor in which the amount of change in the threshold voltage between before and after light irradiation or a bias-temperature stress (BT) test performed on the transistor is small and which has stable electric characteristics can be manufactured.

According to one embodiment of the present invention, a semiconductor device including a transistor in which the condition of an interface between an oxide semiconductor film and a gate insulating film in contact with the oxide semiconductor film is favorable can be manufactured. Further, a semiconductor device having stable electric characteristics can be manufactured. Further, mass production of highly reliable semiconductor devices can be realized with the use of a large-sized substrate such as a mother glass.

BRIEF DESCRIPTION OF DRAWINGS

In the accompanying drawings:

FIGS. 19A to 19C are each a cross-sectional view illustrating one embodiment of the present invention.

BEST MODE FOR CARRYING OUT THE INVENTION

Figure 1A:
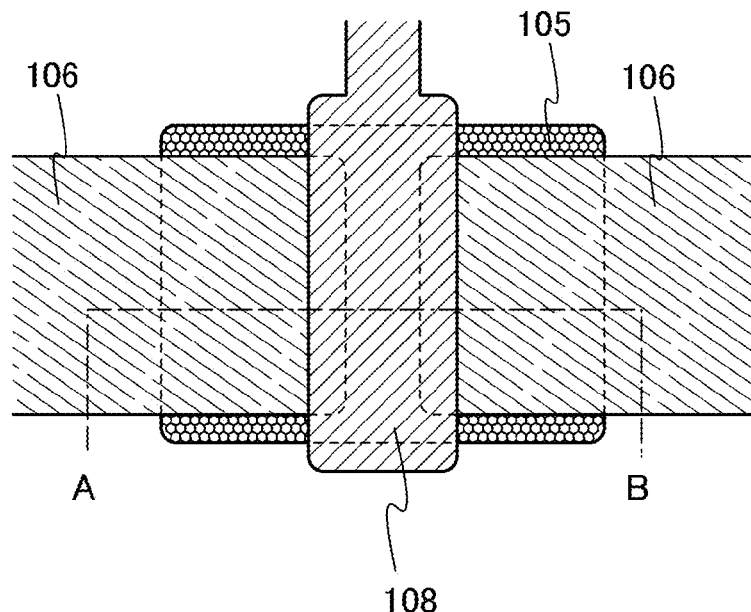
FIGS. 1A and 1B are a top view and a cross-sectional view, respectively, illustrating a semiconductor device which is one embodiment of the present invention.

Embodiments of the present invention will be described in detail with reference to the accompanying drawings. Note that the present invention is not limited to the following description and it will be easily understood by those skilled in the art that the modes and details of the present invention can be modified in various ways without departing from the spirit and scope thereof. Therefore, the present invention should not be construed as being limited to the description in the following embodiments. Note that in structures of the present invention described hereinafter, the same portions or portions having similar functions are denoted by the same reference numerals in different drawings, and description thereof is not repeated.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second" or "third" as appropriate.

(Embodiment 1)

Figure 1B:
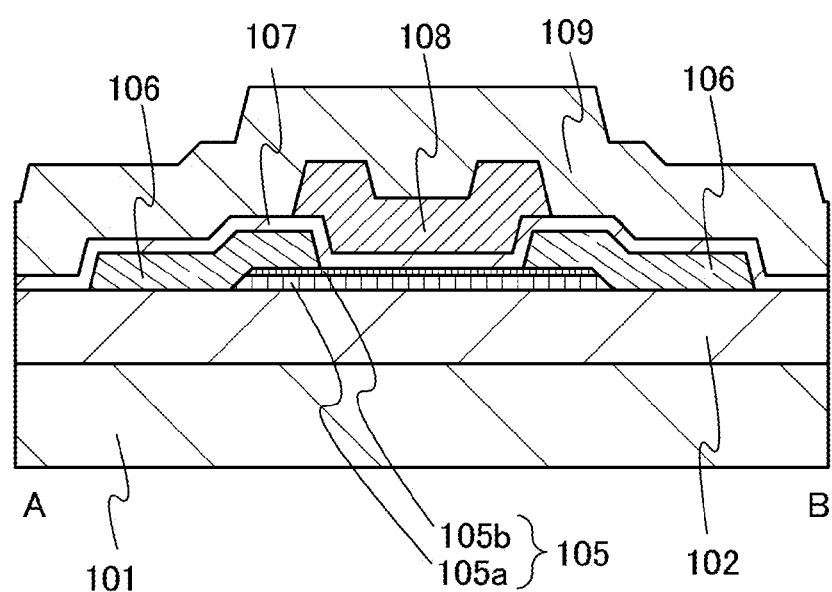
Figure 2A:
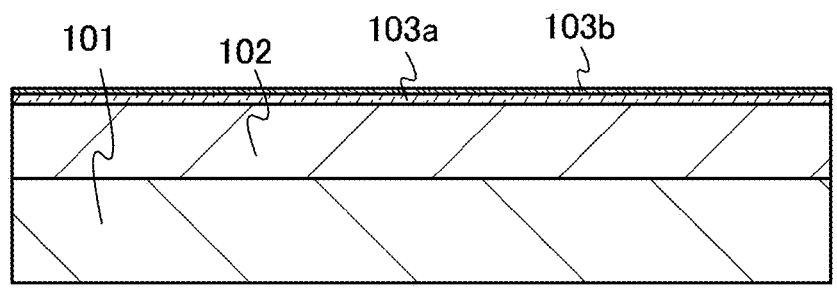
FIGS. 2A to 2C are cross-sectional views illustrating a method for manufacturing a semiconductor device which is one embodiment of the present invention.
Figure 2B:
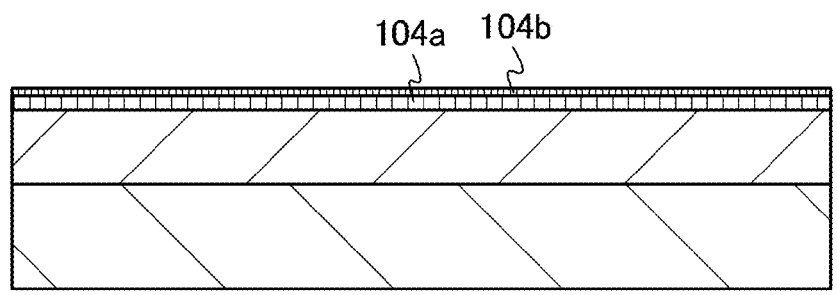
Figure 2C:
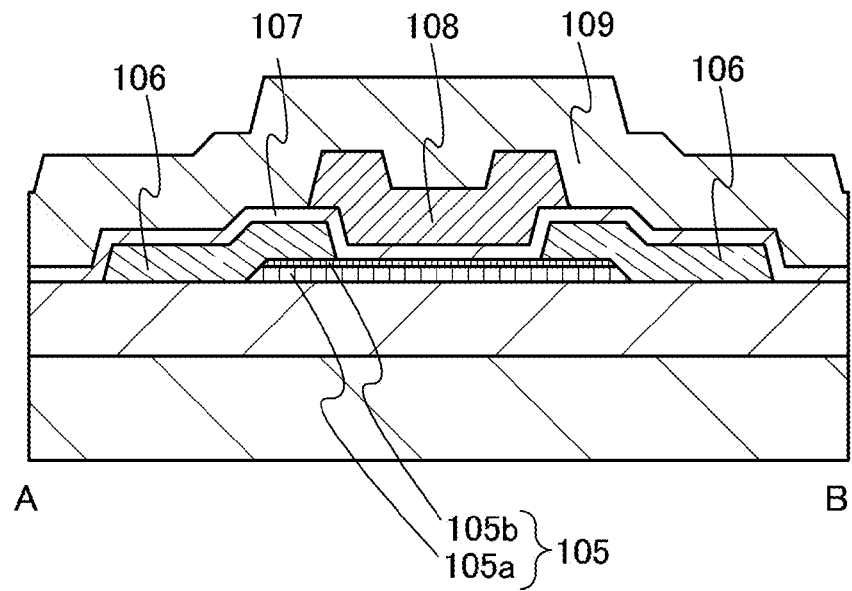

In this embodiment, a transistor in which an oxide semiconductor film over an insulating surface is used for a channel and a manufacturing method thereof will be described with reference to FIGS. 1A and 1B and FIGS. 2A to 2C. FIG. 1B is a cross-sectional view illustrating a structure of a transistor which is one embodiment of a structure of a semiconductor device, and corresponds to a cross-sectional view along dashed-dotted line A-B in FIG. 1A which is a top view. Note that in FIG. 1A, a substrate 101, an oxide insulating film 102, a gate insulating film 107, and an insulating film 109 are not illustrated. FIGS. 2A to 2C are cross-sectional views illustrating a manufacturing process of the transistor illustrated in FIG. 1B.

The transistor illustrated in FIG. 1B includes the oxide insulating film 102 formed over the substrate 101; an oxide semiconductor stack 105 formed over the oxide insulating film 102; a pair of electrodes 106 which is formed over the oxide semiconductor stack 105 and functions as a source electrode and a drain electrode; the gate insulating film 107 formed over the oxide insulating film 102, the oxide semiconductor stack 105, and the pair of electrodes 106; and a gate electrode 108 which overlaps with the oxide semiconductor stack 105 with the gate insulating film 107 positioned therebetween. Further, the insulating film 109 which covers the gate insulating film 107 and the gate electrode 108 may be provided.

The oxide semiconductor stack 105 is characterized in that an oxide semiconductor film 105a having a first crystal structure, which is in contact with the oxide insulating film 102, and an oxide semiconductor film 105b having a second crystal structure, which is in contact with the oxide semiconductor film 105a having the first crystal structure, are stacked.

Further, the oxide semiconductor stack 105 is characterized in that crystal growth has occurred in the oxide semiconductor film 105a having the first crystal structure with the use of the oxide semiconductor film 105b having the second crystal structure as seed crystal.

The oxide semiconductor film 105b having the second crystal structure includes trigonal and/or hexagonal crystals.

In other words, both the oxide semiconductor film having the second crystal structure and the oxide semiconductor film having the first crystal structure include trigonal and/or hexagonal crystal; therefore, a hexagonal lattice image can be observed from the c-axis direction.

Note that each of the oxide semiconductor film 105a having the first crystal structure and the oxide semiconductor film 105b having the second crystal structure is non-single-crystal, is not entirely in an amorphous state, and includes a c-axis-aligned crystal region.

Next, a method for manufacturing the transistor in FIG. 1B will be described with reference to FIGS. 2A to 2C.

As illustrated in FIG. 2A, after the oxide insulating film 102 is formed over the substrate 101, a first oxide semiconductor film 103a is formed over the oxide insulating film 102, and a second oxide semiconductor film 103b is formed over the first oxide semiconductor film 103a.

It is necessary that the substrate 101 have at least heat resistance high enough to withstand heat treatment to be performed later. In the case where a glass substrate is used as the substrate 101, a substrate with a strain point higher than or equal to 730° C. is preferably used. As a material for the glass substrate, a glass material such as aluminosilicate glass, aluminoborosilicate glass, or barium borosilicate glass is used, for example. Note that a glass substrate containing BaO and $B_2O_3$ so that the amount of BaO is larger than that of $B_2O_3$ is preferably used. For mass production, a mother glass of the eighth generation (2160 mm×2460 mm), the ninth generation (2400 mm×2800 mm or 2450 mm×3050 mm), the tenth generation (2950 mm×3400 mm), or the like is preferably used as the substrate 101. The mother glass drastically shrinks when the treatment temperature is high and the treatment time is long. Thus, in the case where mass production is performed with the use of the mother glass, the preferable heating temperature in the manufacturing process is lower than or equal to 600° C., further preferably lower than or equal to 450° C.

Instead of the glass substrate, a substrate formed of an insulator, such as a ceramic substrate, a quartz substrate, or a sapphire substrate can be used. Alternatively, crystallized glass or the like can be used. Further alternatively, a substrate obtained by forming an insulating film over a surface of a semiconductor substrate such as a silicon wafer or a surface of a conductive substrate formed of a metal material can be used.

Note that in the case where a glass substrate including an impurity such as an alkali metal is used as the substrate 101, a nitride insulating film such as a silicon nitride film or an aluminum nitride film may be formed between the substrate 101 and the oxide insulating film 102 in order to prevent entry of an alkali metal. The nitride insulating film can be formed by a CVD method, a sputtering method, or the like. Since an alkali metal such as lithium, sodium, or potassium is an impurity for an oxide semiconductor film to be formed later, the content of such an alkali metal is preferably small.

The oxide insulating film 102 is formed using an oxide insulating film from which part of contained oxygen is released by heating. The oxide insulating film from which part of contained oxygen is released by heating is preferably an oxide insulating film which contains oxygen at an amount exceeding the amount of oxygen in its stoichiometric composition. With the oxide insulating film from which part of contained oxygen is released by heating, oxygen can be diffused to the first oxide semiconductor film 103a and the second oxide semiconductor film 103b by heating. Typical examples of the oxide insulating film 102 include films of silicon oxide, silicon oxynitride, silicon nitride oxide, aluminum oxide, aluminum oxynitride, gallium oxide, hafnium oxide, and yttrium oxide.

From the oxide insulating film which contains oxygen at an amount exceeding the amount of oxygen in its stoichiometric composition, part of the oxygen is released by heating. The amount of oxygen released at this time which is converted into oxygen atoms is greater than or equal to $1.0 \times 10^{18}$ atoms/cm$^3$, preferably greater than or equal to $1.0 \times 10^{20}$ atoms/cm$^3$, further preferably greater than or equal to $3.0 \times 10^{20}$ atoms/cm$^3$ in thermal desorption spectroscopy (TDS) analysis.

Here, a method by which the amount of released oxygen in the case of being converted into oxygen atoms is measured using TDS analysis will be described.

The amount of released gas in TDS analysis is proportional to the integral value of a spectrum. Therefore, the amount of released gas can be calculated from the ratio of the integral value of a spectrum of an oxide insulating film to the reference value of a standard sample. The reference value of a standard sample refers to the ratio of the density of a predetermined atom contained in a sample to the integral value of a spectrum.

For example, the number of released oxygen molecules ($N(O_2)$) from an oxide insulating film can be found according to Numerical Expression 1 with the TDS analysis results of a silicon wafer containing hydrogen at a predetermined density which is the standard sample and the TDS analysis results of the oxide insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N(O_2)=N(H_2)/S(H_2) \times S(O_2) \times \alpha \quad \text{(Numerical Expression 1)}$$

$N(H_2)$ is the value obtained by conversion of the number of hydrogen molecules released from the standard sample into density. $S(H_2)$ is an integral value of a spectrum when the standard sample is analyzed by TDS. Here, the reference value of the standard sample is set to $N(H_2)/S(H_2)$. $S(O_2)$ is an integral value of a spectrum when the oxide insulating film is analyzed by TDS. $\alpha$ is a coefficient which influences the intensity of the spectrum in the TDS analysis. Refer to Japanese Published Patent Application No. H6-275697 for details of Numerical Expression 1. Note that the amount of released oxygen from the oxide insulating film is measured with a thermal desorption spectroscopy apparatus produced by ESCO Ltd., EMD-WA1000S/W with the use of a silicon wafer containing hydrogen atoms at $1 \times 10^{16}$ atoms/cm$^3$ as the standard sample.

Further, in the TDS analysis, part of oxygen is detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N(O_2)$ is the number of the released oxygen molecules. For the oxide insulating film, the amount of released oxygen in the case of being converted into oxygen atoms is twice the number of the released oxygen molecules.

The thickness of the oxide insulating film 102 is greater than or equal to 50 nm, preferably greater than or equal to 200 nm and less than or equal to 500 nm. With the use of the thick oxide insulating film 102, the amount of oxygen released from the oxide insulating film 102 can be increased, and defects at the interface between the oxide insulating film 102 and an oxide semiconductor film to be formed later can be reduced.

The oxide insulating film 102 is formed by a sputtering method, a CVD method, or the like. The oxide insulating film from which part of contained oxygen is released by heating is easily formed by a sputtering method, which is preferable.

When the oxide insulating film from which part of contained oxygen is released by heating is formed by a sputtering method, the amount of oxygen in a deposition gas is preferably large, and oxygen, a mixed gas of oxygen and a rare gas, or the like can be used. Typically, the oxygen concentration in the deposition gas is preferably higher than or equal to 6% and lower than or equal to 100%.

The first oxide semiconductor film 103a is formed using an oxide semiconductor film which can include trigonal and/or hexagonal crystal and have the first crystal structure by heating.

As the first oxide semiconductor film 103a, a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; a two-component metal oxide such as an In—Zn—O film, a Sn—Zn—O film, an Al—Zn—O film, or an In—Ga—O film; or the like can be used. Further, SiO$_2$ may be contained in the above oxide semiconductor. In this specification, for example, an In—Ga—Zn—O film means an oxide film containing indium (In), gallium (Ga), and zinc (Zn).

The first oxide semiconductor film 103a is formed using an oxide semiconductor film which can include trigonal and/or hexagonal crystal and have any one crystal structure of a non-wurtzite structure, a YbFe$_2$O$_4$ structure, a Yb$_2$Fe$_3$O$_7$ structure, and deformed structures of the foregoing structures by heating.

As an example of the oxide semiconductor film having the first crystal structure, an In—Ga—Zn—O film that is a three-component metal oxide includes trigonal and/or hexagonal non-wurtzite crystal. In addition, examples of the In—Ga—Zn—O film that is a three-component metal oxide include InGaZnO$_4$ having a YbFe$_2$O$_4$ structure and In$_2$Ga$_2$ZnO$_7$ having a Yb$_2$Fe$_3$O$_7$ structure, and the In—Ga—Zn—O film can have any of deformed structures of the foregoing structures (M. Nakamura, N. Kimizuka, and T. Mohri, "The Phase Relations in the In$_2$O$_3$—Ga$_2$ZnO$_4$—ZnO System at 1350° C.", *J. Solid State Chem.*, 1991, Vol. 93, pp. 298-315). Note that a layer containing Yb is denoted by an A layer and a layer containing Fe is denoted by a B layer, below. The YbFe$_2$O$_4$ structure is a repeated structure of ABB|ABB|ABB. As an example of a deformed structure of the YbFe$_2$O$_4$ structure, a repeated structure of ABBB|ABBB can be given. Further, the Yb$_2$Fe$_3$O$_7$ structure is a repeated structure of ABB|AB|ABB|AB. As an example of a deformed structure of the Yb$_2$Fe$_3$O$_7$ structure, a repeated structure of ABBB|ABB|ABBB|ABB|ABBB|ABB| can be given.

Note that the above metal oxide containing nitrogen at a concentration higher than or equal to 1×10$^{17}$/cm$^3$ and lower than 5×10$^{19}$/cm$^3$ may be used for the first oxide semiconductor film 103a.

Note that the energy gap of a metal oxide which can form the first oxide semiconductor film 103a is 2 eV or more, preferably 2.5 eV or more, further preferably 3 eV or more. In this manner, the off-state current of a transistor can be reduced by using an oxide semiconductor having a wide energy gap.

The second oxide semiconductor film 103b is formed using an oxide semiconductor film which can have the second crystal structure by heating. The oxide semiconductor film which can have the second crystal structure is easily crystallized by heat treatment and has high crystallinity as compared to the oxide semiconductor film which can have the trigonal and/or hexagonal first crystal structure.

The second oxide semiconductor film 103b can be formed using zinc oxide, an oxynitride semiconductor, or the like. The oxynitride semiconductor can be obtained by adding nitrogen to any of the metal oxides listed for the first oxide semiconductor film 103a at a concentration higher than or equal to 5×10$^{19}$/cm$^3$ and lower than 7 at. %.

The second oxide semiconductor film 103b is used as a seed for crystal growth of the first oxide semiconductor film 103a. Therefore, the second oxide semiconductor film 103b may have a thickness with which crystal growth is possible, typically greater than or equal to a thickness of one atomic layer and less than or equal to 10 nm, preferably greater than or equal to 2 nm and less than or equal to 5 nm.

When the second oxide semiconductor film 103b is thin, throughput in deposition treatment and heat treatment can be improved.

The first oxide semiconductor film 103a and the second oxide semiconductor film 103b can each be formed by a sputtering method, a coating method, a printing method, a pulsed laser evaporation method, or the like. When the first oxide semiconductor film 103a and the second oxide semiconductor film 103b are formed by a sputtering method, one of an AC sputtering apparatus, a DC sputtering apparatus, and an RF sputtering apparatus is used.

When the second oxide semiconductor film 103b is formed by a sputtering method with the use of an oxynitride semiconductor, the oxynitride semiconductor can be deposited by changing the kind of gas introduced into the sputtering apparatus, that is, by introducing nitrogen after the first oxide semiconductor film 103a is formed. In other words, it is possible to form the first oxide semiconductor film 103a and the second oxide semiconductor film 103b successively, which is highly productive.

Next, first heat treatment is performed. The temperature of the first heat treatment is higher than or equal to 150° C. and lower than or equal to 650° C., preferably higher than or equal to 200° C. and lower than or equal to 500° C. In addition, heating time of the first heat treatment is longer than or equal to 1 minute and shorter than or equal to 24 hours. After the temperature of the first heat treatment is gradually increased, the temperature may be set constant. When the rate at which the temperature is raised from a temperature higher than or equal to 500° C. is higher than or equal to 0.5° C./h and lower than or equal to 3° C./h, crystal growth of the second oxide semiconductor film 103b is gradually carried out; thus, the crystallinity can be further enhanced.

The first heat treatment is preferably performed in a rare gas (typically argon) atmosphere, an oxygen atmosphere, a nitrogen atmosphere, a dry air atmosphere, a mixed atmosphere of a rare gas (typically argon) and oxygen, or a mixed atmosphere of a rare gas and nitrogen. Specifically, a high-purity gas atmosphere is preferably used, in which the concentration of impurities such as hydrogen is reduced to approximately several parts per million (ppm) or several parts per billion (ppb).

A heat treatment apparatus used for the first heat treatment is not limited to a particular apparatus, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The first heat treatment allows crystal growth to begin from a surface of the second oxide semiconductor film 103b toward the first oxide semiconductor film 103a. Since the second oxide semiconductor film 103b is easily crystallized, the whole second oxide semiconductor film 103b is crystallized to be an oxide semiconductor film 104b having the second crystal structure. Further, since crystal growth proceeds from the surface of the second oxide semiconductor film 103b toward the first oxide semiconductor film 103a, a c-axis-aligned crystal region is formed. That is, the oxide semiconductor film 104b having the second crystal structure includes bonds that form a hexagonal shape in an upper plane in the a-b plane. In addition, layers including hexagonal bonds are stacked and bonded in the thickness direction (the c-axis direction), so that c-axis alignment is obtained.

When the first heat treatment is continued, crystal growth of the first oxide semiconductor film 103a proceeds from the interface with the oxide semiconductor film 104b having the second crystal structure toward the oxide insulating film 102 with the use of the oxide semiconductor film 104b having the second crystal structure as a seed. Crystals in the oxide semiconductor film 104b having the second crystal structure are aligned in the c-axis direction; therefore, by using the oxide semiconductor film 104b having the second crystal structure as a seed, crystal in the first oxide semiconductor film 103a can grow so as to be generally aligned with the crystal axis of the oxide semiconductor film 104b having the second crystal structure. That is, crystals in the first oxide semiconductor film 103a can grow while being aligned with the c-axis. That is, an oxide semiconductor film 104a having the first crystal structure includes bonds that form a hexagonal shape in an upper plane in the a-b plane. In addition, layers including hexagonal bonds are stacked and bonded in the thickness direction (the c-axis direction), so that c-axis alignment is obtained. Through the above steps, the oxide semiconductor film 104a having the c-axis-aligned first crystal structure can be formed (see FIG. 2B).

In the case where crystal growth proceeds perpendicularly from the surface of the second oxide semiconductor film 103b by the first heat treatment, the c-axes of the oxide semiconductor film 104a having the first crystal structure and the oxide semiconductor film 104b having the second crystal structure are generally perpendicular to the surface.

In addition, by the first heat treatment, hydrogen contained in the first oxide semiconductor film 103a and the second oxide semiconductor film 103b is released (i.e., dehydrogenation or dehydration occurs) and part of oxygen contained in the oxide insulating film 102 is diffused to the first oxide semiconductor film 103a, the second oxide semiconductor film 103b, and a region of the oxide insulating film 102 which is in the vicinity of the interface with the first oxide semiconductor film 103a. By this step, oxygen defects included in the first oxide semiconductor film 103a and the second oxide semiconductor film 103b can be reduced; moreover, diffusion of oxygen to the region of the oxide insulating film 102 in the vicinity of the first oxide semiconductor film 103a allows defects at the interface between the oxide insulating film 102 and the first oxide semiconductor film 103a to be reduced. As a result, the oxide semiconductor film 104a having the first crystal structure and the oxide semiconductor film 104b having the second crystal structure, in which the hydrogen concentration and oxygen defects are reduced, can be formed.

By setting the leakage rate of a treatment chamber of the sputtering apparatus to $1\times10^{-10}$ Pa·m$^3$/s or lower at the time of forming the first oxide semiconductor film 103a and the second oxide semiconductor film 103b by a sputtering method, entry of an impurity such as an alkali metal or hydrogen into the first oxide semiconductor film 103a and the second oxide semiconductor film 103b can be suppressed during the formation by a sputtering method. Further, with the use of an entrapment vacuum pump (e.g., a cryopump) as an evacuation system, counter flow of an impurity such as an alkali metal or hydrogen from the evacuation system can be reduced.

Further, the first oxide semiconductor film 103a and the second oxide semiconductor film 103b may be formed in the state where a gas introduced into the treatment chamber of the sputtering apparatus, such as a nitrogen gas, an oxygen gas, or an argon gas, is heated. Consequently, the content of hydrogen in the first oxide semiconductor film 103a and the second oxide semiconductor film 103b can be reduced.

Further, before the first oxide semiconductor film 103a and the second oxide semiconductor film 103b are formed by a sputtering method, preheat treatment may be performed in order to remove moisture or hydrogen contained in the sputtering apparatus or the surface or inside of a target. Consequently, the content of hydrogen in the first oxide semiconductor film 103a and the second oxide semiconductor film 103b can be reduced.

Through the above steps, the oxide semiconductor film 104a having the first crystal structure and the oxide semiconductor film 104b having the second crystal structure can be formed. If hydrogen is contained in the oxide semiconductor, part thereof serves as a donor to generate an electron as a carrier. In addition, an oxygen defect in the oxide semiconductor also serves as a donor to generate an electron as a carrier. Therefore, when the hydrogen concentration and oxygen defects are reduced in the oxide semiconductor film 104a having the first crystal structure and the oxide semiconductor film 104b having the second crystal structure, the carrier concentration in the oxide semiconductor can be reduced and thus negative shift of the threshold voltage of the transistor to be manufactured later can be suppressed.

<Hexagonal Crystal Structure>

Here, a hexagonal crystal structure will be described below.

Figure 3A:
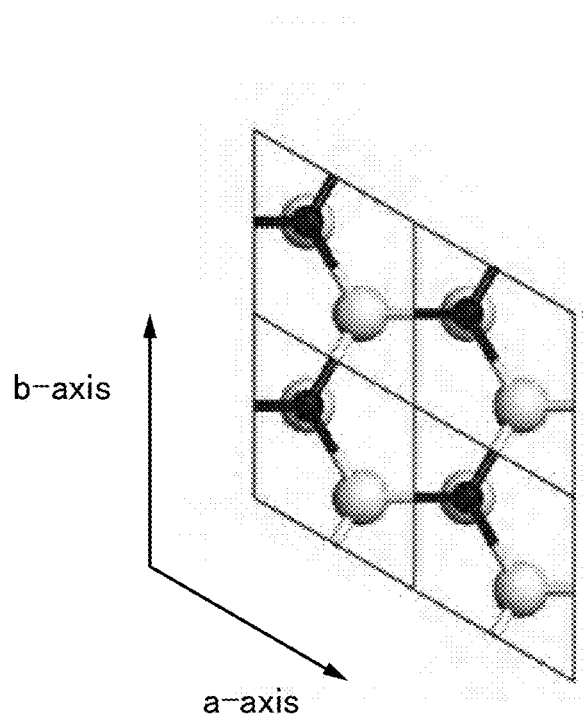
FIGS. 3A and 3B each show a crystal structure according to one embodiment of the present invention.
Figure 3B:
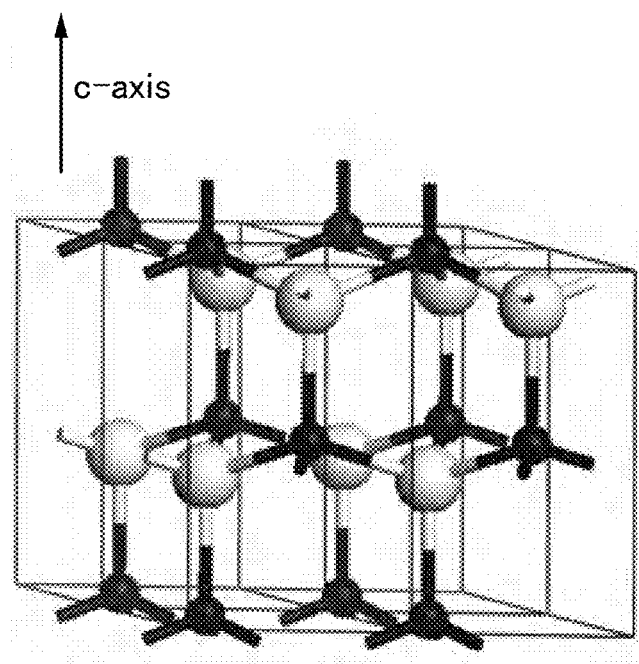

First, the c-axis-aligned second crystal structure will be described with reference to FIGS. 3A and 3B. As for the c-axis-aligned second crystal structure, FIG. 3A shows a structure in the a-b plane seen from the c-axis direction, and FIG. 3B shows a structure where the c-axis direction is the vertical direction.

Examples of crystal having the second crystal structure include crystal of zinc oxide, indium nitride, and gallium nitride. Further, an oxide semiconductor containing nitrogen, that is, an oxynitride semiconductor can be a film having the c-axis-aligned second crystal structure in some cases.

Specifically, an In—Ga—Zn—O film containing nitrogen at a concentration higher than or equal to $5\times10^{19}$/cm$^3$, preferably higher than or equal to $1\times10^{20}$/cm$^3$ and lower than 20 at. %, becomes a film having the c-axis-aligned second crystal structure, and has one layer containing Ga and Zn between an In—O crystal plane (a crystal plane containing indium and oxygen) and another In—O crystal plane (a crystal plane containing indium and oxygen).

Next, the c-axis-aligned hexagonal first crystal structure will be described.

For example, an In—Ga—Zn—O film containing nitrogen at a concentration higher than or equal to $1\times10^{17}$/cm$^3$ and lower than $5\times10^{19}$/cm$^3$ becomes a film having the c-axis-aligned hexagonal first crystal structure. The In—Ga—Zn—O film having the c-axis-aligned hexagonal first crystal structure has an In—O crystal plane (a crystal plane containing indium and oxygen) in the a-b plane and two layers containing Ga and Zn between In—O crystal planes. Note that as for the two layers containing Ga and Zn, there is no limitation on the position of Ga and Zn as long as at least one of Ga and Zn is contained in each of the layers.

The second crystal structure and the first crystal structure are both hexagonal crystal structures in which atoms are arranged in a hexagonal shape in the a-b plane. Further, the hexagonal first crystal structure is in contact with the second crystal structure, and the hexagonal first crystal structure is aligned with the second crystal structure.

Figure 4A:
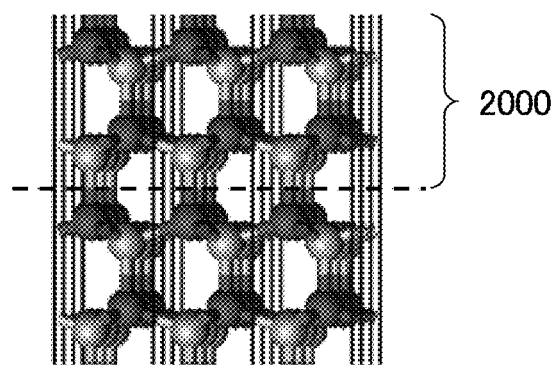
FIGS. 4A to 4C each show a crystal structure according to one embodiment of the present invention.
Figure 4C:
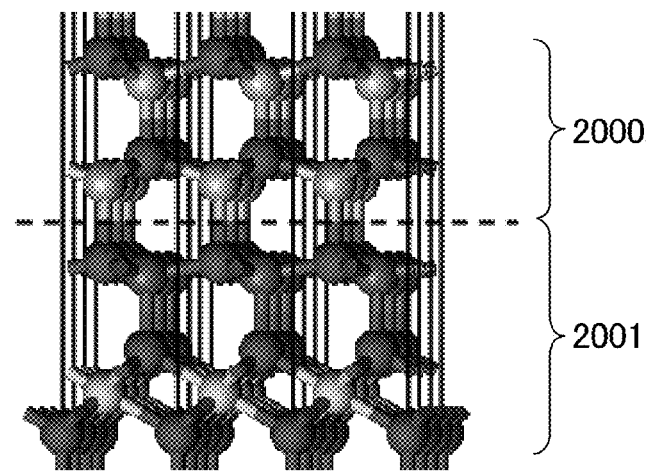
Figure 4B:
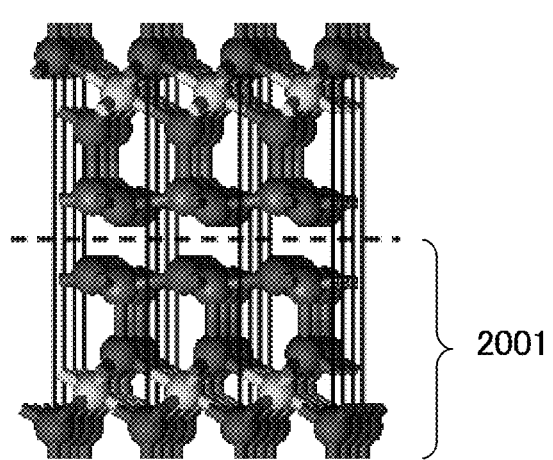

FIGS. 4A to 4C show a manner in which the c-axis-aligned hexagonal second crystal structure is aligned on the c-axis-aligned first crystal structure having the same lattice constant. FIG. 4A shows a c-axis-aligned hexagonal second crystal structure 2000, and FIG. 4B shows a c-axis-aligned first crystal structure 2001. In addition, FIG. 4C is a schematic view showing a manner in which the hexagonal second crystal structure 2000 is in contact with the first crystal structure 2001 and the hexagonal first crystal structure 2001 is aligned with the second crystal structure 2000.

In this manner, the hexagonal first crystal structure 2001 is in contact with the second crystal structure 2000 and the hexagonal first crystal structure 2001 is aligned with the second crystal structure 2000. That is, a layer including the c-axis-aligned second crystal structure 2000 which has high crystallinity and is easily crystallized is formed as a seed crystal layer, and an oxide semiconductor film is formed in contact with the seed crystal layer, whereby the second crystal structure 2000 included in the seed crystal layer facilitates crystallization of the oxide semiconductor film.

<Seed Crystal Layer>

Next, a seed crystal layer will be described. The seed crystal layer includes the c-axis-aligned second crystal structure. In particular, the seed crystal layer is formed using a material that has high crystallinity and is easily crystallized as compared to the oxide semiconductor film.

The c-axis-aligned second crystal structure which can be applied to the seed crystal layer will be described below.

As examples of a compound which has the c-axis-aligned second crystal structure and can be used for the seed crystal layer, zinc oxide, indium nitride, and gallium nitride can be given. An oxide semiconductor containing nitrogen at a concentration higher than or equal to $5 \times 10^{19}/cm^3$, preferably higher than or equal to $1 \times 10^{20}/cm^3$ and lower than 7 at. %, can be a film including the c-axis-aligned second crystal structure in some cases.

In the case of using an oxide semiconductor containing nitrogen for the seed crystal layer, nitrogen is intentionally contained so that the nitrogen concentration becomes higher than or equal to $5 \times 10^{19}/cm^3$, preferably higher than or equal to $1 \times 10^{20}/cm^3$ and lower than 7 at. %. An oxide semiconductor film in which nitrogen is intentionally contained in this range has a smaller energy gap than an oxide semiconductor film in which nitrogen is not contained intentionally, and thus carriers easily flow therein.

Note that a diffraction image where bright points appear alternately may be observed in an observation image of the c-axis-aligned second crystal structure, which is obtained using a high-angle annular dark field (HAADF)-STEM.

Figure 5A:
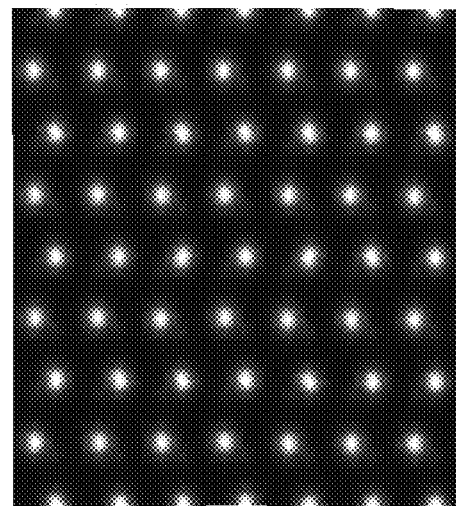
FIGS. 5A and 5B are each a HAADF-STEM image showing a crystal structure according to one embodiment.

FIG. 5A shows a HAADF-STEM observation image obtained by calculation based on the c-axis-aligned second crystal structure.

Figure 5B:
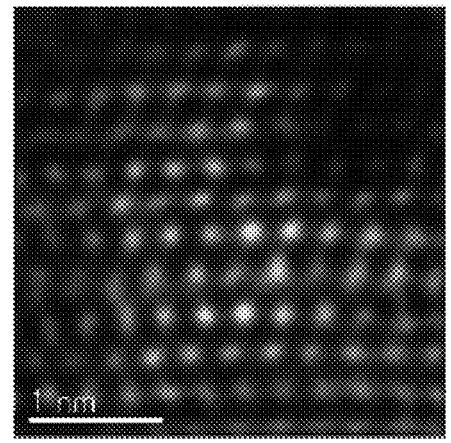

FIG. 5B shows a HAADF-STEM observation image of an In—Ga—Zn—O film formed using a deposition gas containing only nitrogen.

From each of the HAADF-STEM observation images in FIGS. 5A and 5B, it can be confirmed that the c-axis-aligned second crystal structure has a two-cycle layer structure.

Note that the In—Ga—Zn—O film containing nitrogen was formed by a sputtering method over a quartz glass substrate to a thickness of 300 nm. Deposition was performed under conditions where a target containing In, Ga, and Zn at 1:1:1 [atomic ratio] was used, the distance between the substrate and the target was 60 mm, a DC power source was used, the power was 0.5 kw, and the pressure was 0.4 Pa. In addition, the substrate temperature during deposition was 400° C., and only nitrogen was introduced as a sputtering gas into a deposition chamber at a flow rate of 40 sccm.

<Oxide Semiconductor Film>

Next, an oxide semiconductor film will be described. The oxide semiconductor film is non-single-crystal and is not entirely in an amorphous state. The oxide semiconductor film includes at least the c-axis-aligned hexagonal first crystal structure and crystal which has anisotropically grown from the seed crystal layer. Since the oxide semiconductor film is not entirely in an amorphous state, formation of an amorphous portion whose electric characteristics are unstable is suppressed.

The c-axis-aligned first crystal structure having anisotropy which can be applied to the oxide semiconductor film will be described.

As examples of the hexagonal first crystal structure, a $YbFe_2O_4$ structure, a $Yb_2Fe_3O_7$ structure, and deformed structures of the foregoing structures can be given. For example, In—Ga—Zn—O that is a three-component metal oxide has the hexagonal first crystal structure and can be used for the oxide semiconductor film. Note that the In—Ga—Zn—O film which can be used as the oxide semiconductor film may contain nitrogen at a concentration higher than or equal to $1 \times 10^{17}/cm^3$ and lower than or equal to $5 \times 10^{19}/cm^3$.

Examples of In—Ga—Zn—O that is a three-component metal oxide include $InGaZnO_4$ having a $YbFe_2O_4$ structure and $In_2Ga_2ZnO_7$ having a $Yb_2Fe_3O_7$ structure, and the In—Ga—Zn—O can have any of deformed structures of the foregoing structures, which is disclosed in the following document: M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315.

Further, as the oxide semiconductor film, a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; a two-component metal oxide such as an In—Zn—O film, a Sn—Zn—O film, an Al—Zn—O film, or an In—Ga—O film; or the like can be used. Further, silicon may be contained in the above oxide semiconductor film. In this specification, for example, an In—Ga—Zn—O film means an oxide film containing indium (In), gallium (Ga), and zinc (Zn).

Crystal in the oxide semiconductor film grows anisotropically from the seed crystal layer. Accordingly, a highly crystalline region of the semiconductor film having a hetero structure can be in contact with an insulating surface, and interface states due to dangling bonds can be reduced, so that a semiconductor film which has a hetero structure and a favorable interface condition can be provided.

Note that a diffraction pattern where one bright spot appears every three spots may be observed in an observation image of the c-axis-aligned hexagonal first crystal structure, which is obtained using a high-angle annular dark field (HAADF)-STEM.

Figure 6A:
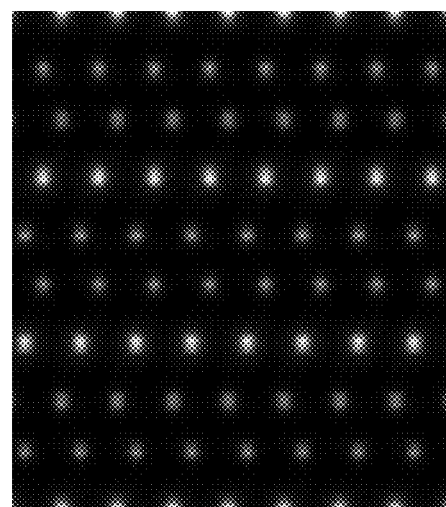
FIGS. 6A and 6B are each a HAADF-STEM image showing a crystal structure according to one embodiment.

FIG. 6A shows a HAADF-STEM observation image obtained by calculation based on the c-axis-aligned hexagonal first crystal structure.

Figure 6B:
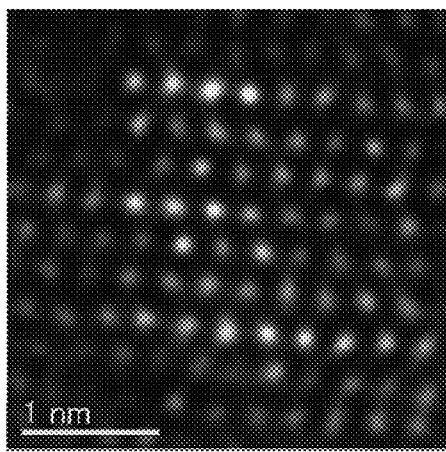

FIG. 6B shows a HAADF-STEM observation image of an In—Ga—Zn—O film.

From each of the HAADF-STEM observation images in FIGS. 6A and 6B, it can be confirmed that one bright spot appears every three spots and that the c-axis-aligned hexagonal first crystal structure has a nine-cycle layer structure.

Note that the In—Ga—Zn—O film was formed by a sputtering method over a quartz glass substrate to a thickness of 300 nm. Deposition was performed under conditions where a target containing In, Ga, and Zn at 1:1:1 [atomic ratio] was used, the distance between the substrate and the target was 60 mm, a DC power source was used, the power was 0.5 kw, and the pressure was 0.4 Pa. In addition, the substrate temperature during deposition was 400° C., and only oxygen was introduced as a sputtering gas into a deposition chamber at a flow rate of 40 sccm.

Next, a mask is formed over the oxide semiconductor film 104b having the second crystal structure, and then the oxide semiconductor film 104a having the first crystal structure and the oxide semiconductor film 104b having the second crystal structure are selectively etched using the mask, so that the oxide semiconductor film 105a having the first crystal structure and the oxide semiconductor film 105b having the second crystal structure are formed. Note that the oxide semiconductor film 105a having the first crystal structure and the oxide semiconductor film 105b having the second crystal structure are collectively referred to as the oxide semiconductor stack 105. After that, the mask is removed.

A mask used for etching of the oxide semiconductor film 104a having the first crystal structure and the oxide semiconductor film 104b having the second crystal structure can be formed through a photolithography process or by an inkjet method, a printing method, or the like as appropriate. In addition, the oxide semiconductor film 104a having the first crystal structure and the oxide semiconductor film 104b having the second crystal structure can be etched by wet etching or dry etching as appropriate.

Next, the pair of electrodes 106 is formed in contact with the oxide semiconductor stack 105. Then, the gate insulating film 107 is formed over the oxide insulating film 102, the oxide semiconductor stack 105, and the pair of electrodes 106. After that, the gate electrode 108 is formed over the gate insulating film 107. The insulating film 109 may be formed over the gate insulating film 107 and the gate electrode 108 (see FIG. 2C).

The pair of electrodes 106 functions as a source electrode and a drain electrode.

The pair of electrodes 106 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese, magnesium, zirconium, and beryllium may be used. In addition, the pair of electrodes 106 can have a single-layer structure or a stacked-layer structure having two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, and a three-layer structure in which a titanium film, an aluminum film, and a titanium film are stacked in this order can be given. Alternatively, a film, an alloy film, or a nitride film which contains aluminum and one or more elements selected from titanium, tantalum, tungsten, molybdenum, chromium, neodymium, and scandium may be used. In the case where copper is used as a material for the pair of electrodes 106, a copper-magnesium-aluminum alloy layer may be provided in contact with the oxide semiconductor stack 105, and a copper layer may be stacked in contact with the copper-magnesium-aluminum alloy layer.

The pair of electrodes 106 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using the above light-transmitting conductive material and the above metal element.

The pair of electrodes 106 is formed by a printing method or an inkjet method. Alternatively, after a conductive film is formed by a sputtering method, a CVD method, an evaporation method, or the like, a mask is formed over the conductive film and the conductive film is etched, and thereby the pair of electrodes 106 is formed. The mask formed over the conductive film can be formed by a printing method, an inkjet method, or a photolithography method as appropriate.

Note that the oxide semiconductor stack 105 and the pair of electrodes 106 can be formed in the following manner. After a conductive film is formed over the oxide semiconductor film 104b having the second crystal structure, a concavo-convex shaped mask is formed using a multi-tone photomask. The oxide semiconductor film 104a having the first crystal structure, the oxide semiconductor film 104b having the second crystal structure, and the conductive film are etched using the mask. Then, the concavo-convex shaped mask is divided by ashing. The conductive film is selectively etched using the separated masks. In this process, the number of photomasks and the number of steps in the photolithography process can be reduced.

The gate insulating film 107 can be formed to have a single-layer structure or a stacked-layer structure using any of a silicon oxide film, a silicon oxynitride film, a silicon nitride film, a silicon nitride oxide film, an aluminum oxide film, an aluminum oxynitride film, and a gallium oxide film. It is preferable that a portion in the gate insulating film 107, which is in contact with the oxide semiconductor stack 105, contain oxygen. It is further preferable that the gate insulating film 107 be formed using an oxide insulating film from which contained oxygen is released by heating, which is similar to the oxide insulating film 102. The use of a silicon oxide film makes diffusion of oxygen to the oxide semiconductor stack 105 possible; thus, favorable characteristics can be obtained.

When a high-k material film such as a hafnium silicate ($HfSiO_x$) film, a film of hafnium silicate to which nitrogen is added ($HfSi_xO_yN_z$), a film of hafnium aluminate to which nitrogen is added ($HfAl_xO_yN_z$), a hafnium oxide film, or an yttrium oxide film is used as the gate insulating film 107, gate leakage current can be reduced. Further, a stacked-layer structure in which a high-k material film and one or more of a silicon oxide film, a silicon oxynitride film, a silicon nitride film, a silicon nitride oxide film, an aluminum oxide film, an aluminum oxynitride film, and a gallium oxide film are stacked can be used. The thickness of the gate insulating film 107 is preferably greater than or equal to 1 nm and less than or equal to 300 nm, further preferably greater than or equal to 5 nm and less than or equal to 50 nm.

The gate insulating film 107 is formed by a sputtering method, a CVD method, or the like.

Before the gate insulating film 107 is formed, the surface of the oxide semiconductor stack 105 may be exposed to plasma of an oxidizing gas such as oxygen, ozone, or dinitrogen monoxide so as to be oxidized, thereby reducing oxygen defects.

The gate electrode 108 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese, magnesium, zirconium, and beryllium may be used. In addition, the gate electrode 108 can have a single-layer structure or a stacked-layer structure having two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, and a three-layer structure in which a titanium film, an aluminum film, and a titanium film are stacked in this order can be given. Alternatively, a film, an alloy film, or a nitride film which contains aluminum and one or more elements selected from titanium, tantalum, tungsten, molybdenum, chromium, neodymium, and scandium may be used.

The gate electrode 108 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using the above light-transmitting conductive material and the above metal element.

As a material layer in contact with the gate insulating film, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the gate electrode 108 and the gate insulating film. These films each have a work function of 5 eV or higher, preferably 5.5 eV or higher; thus, the threshold voltage of the electric characteristics of the transistor can be positive. Accordingly, a so-called normally-off switching element can be realized. For example, in the case of using an In—Ga—Zn—O film containing nitrogen, an In—Ga—Zn—O film having a nitrogen concentration at least higher than that of the oxide semiconductor stack 105 is used; specifically, an In—Ga—Zn—O film having a nitrogen concentration of 7 at. % or higher is used.

The gate electrode 108 is formed by a printing method or an inkjet method. Alternatively, after a conductive film is formed by a sputtering method, a CVD method, an evaporation method, or the like, a mask is formed over the conductive film and the conductive film is etched, and thereby the gate electrode 108 is formed. The mask formed over the conductive film can be formed by a printing method, an inkjet method, or a photolithography method as appropriate.

The insulating film 109 can be formed as appropriate by using any of the insulating films listed for the gate insulating film 107. When a silicon nitride film is formed as the insulating film 109 by a sputtering method, entry of moisture and an alkali metal from the outside can be prevented, and thus the number of impurities included in the oxide semiconductor stack 105 can be reduced.

Note that, after formation of the gate insulating film 107 or the insulating film 109, heat treatment (temperature range: higher than or equal to 150° C. and lower than or equal to 650° C., preferably higher than or equal to 200° C. and lower than or equal to 500° C.) may be performed in an atmosphere which contains little hydrogen and moisture (such as a nitrogen atmosphere, an oxygen atmosphere, or a dry air atmosphere (in terms of moisture, for example, the dew point is lower than or equal to −40° C., preferably lower than or equal to −60° C.)).

Through the above steps, a transistor whose channel includes an oxide semiconductor stack including crystal which has hexagonal bonds in the a-b plane and a c-axis-aligned trigonal and/or hexagonal structure can be manufactured.

The oxide semiconductor stack described in this embodiment has high crystallinity and evenness in a region in the vicinity of the interface with the gate insulating film and thus has stable electric characteristics; accordingly, a highly reliable transistor can be obtained. The oxide semiconductor stack including crystal which has hexagonal bonds in the a-b plane and a c-axis-aligned trigonal and/or hexagonal structure is used for a channel region of a transistor, whereby a transistor in which the amount of change in the threshold voltage between before and after light irradiation or a bias-temperature stress (BT) test performed on the transistor is small and which has stable electric characteristics can be manufactured.

(Embodiment 2)

Figure 7A:
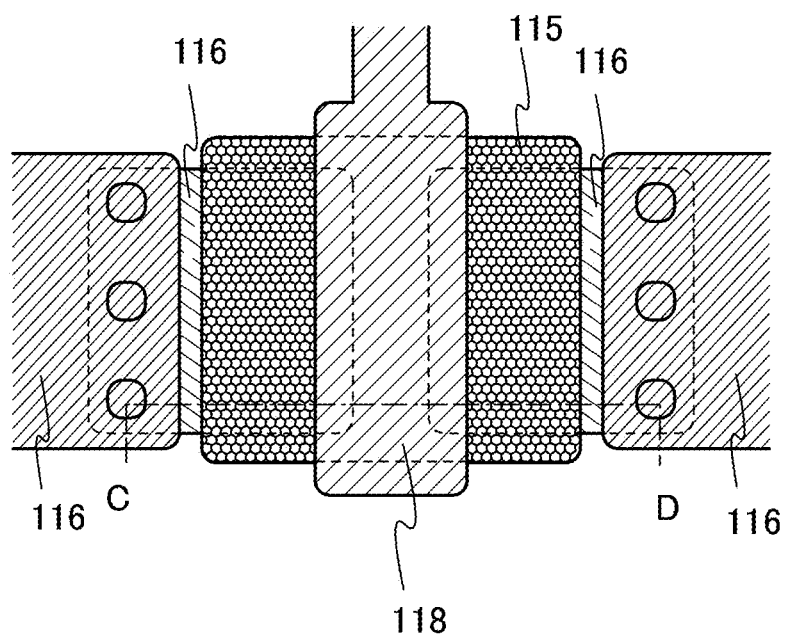
FIGS. 7A and 7B are a top view and a cross-sectional view, respectively, illustrating a semiconductor device which is one embodiment of the present invention.

In this embodiment, a structure of a transistor which is different from that in Embodiment 1 and a manufacturing method thereof will be described with reference to FIGS. 7A and 7B and FIGS. 8A to 8C. This embodiment is different from Embodiment 1 in that a pair of electrodes is provided between an oxide insulating film and an oxide semiconductor stack. Note that FIG. 7B corresponds to a cross-sectional view along dashed-dotted line C-D in FIG. 7A which is a top view. In FIG. 7A, the substrate 101, the oxide insulating film 102, a gate insulating film 117, and an insulating film 119 are not illustrated. FIGS. 8A to 8C are cross-sectional views illustrating a manufacturing process of the transistor illustrated in FIG. 7B.

Figure 7B:
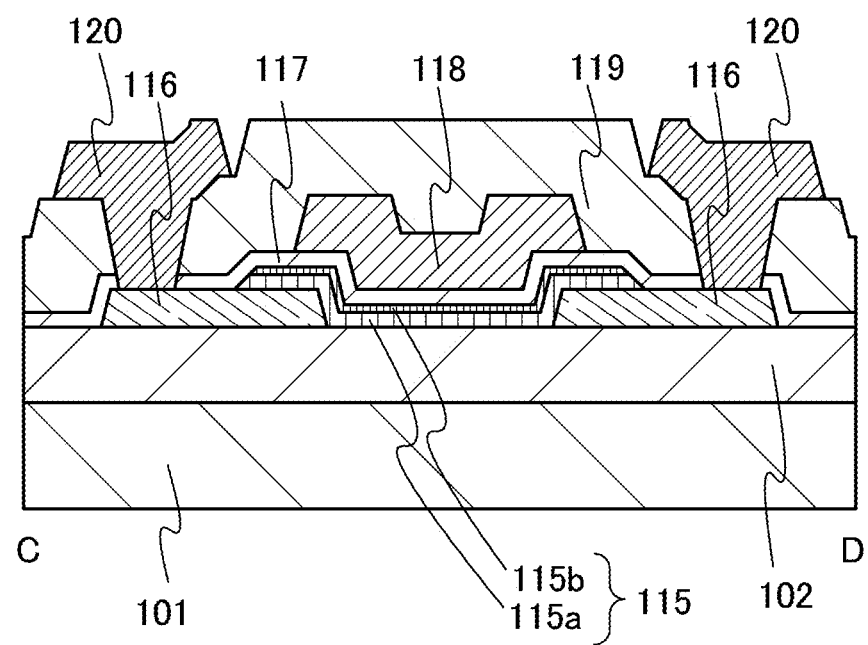
Figure 8A:
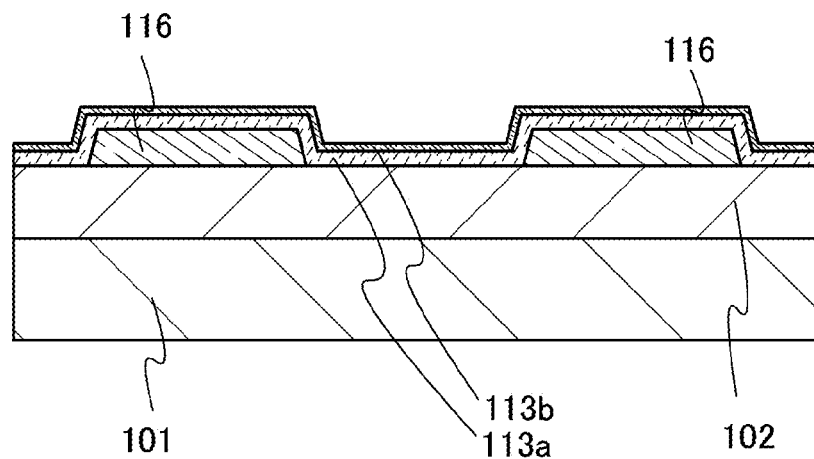
FIGS. 8A to 8C are cross-sectional views illustrating a method for manufacturing a semiconductor device which is one embodiment of the present invention.
Figure 8B:
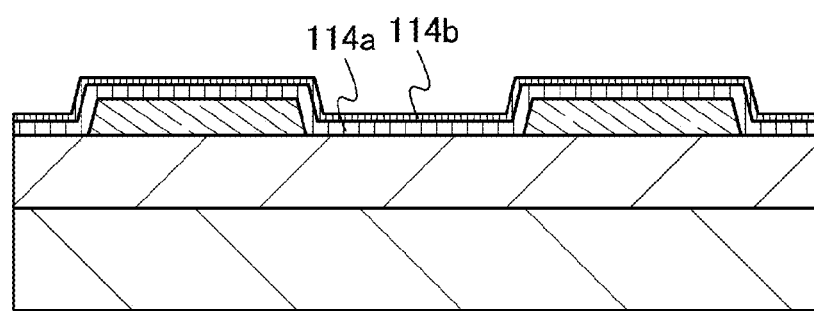
Figure 8C:
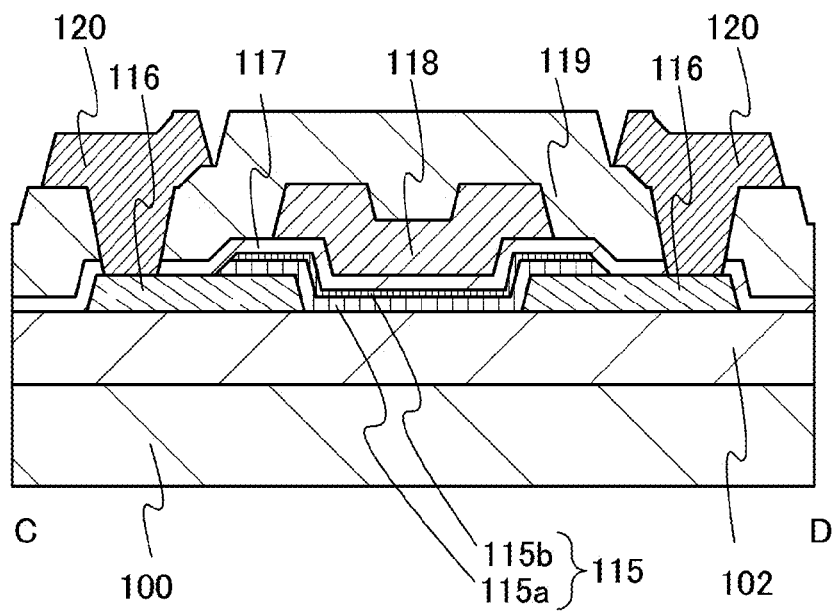

The transistor illustrated in FIG. 7B includes the oxide insulating film 102 formed over the substrate 101; a pair of electrodes 116 which is formed over the oxide insulating film 102 and functions as a source electrode and a drain electrode; an oxide semiconductor stack 115 which covers the oxide insulating film 102 and the pair of electrodes 116 functioning as the source electrode and the drain electrode; the gate insulating film 117 formed over the oxide insulating film 102, the pair of electrodes 116, and the oxide semiconductor stack 115; and a gate electrode 118 which overlaps with the oxide semiconductor stack 115 with the gate insulating film 117 positioned therebetween. Further, the insulating film 119 which covers the gate insulating film 117 and the gate electrode 118 may be provided. Furthermore, a pair of wirings 120 may be provided in contact with the pair of electrodes 116 in openings in the insulating film 119.

The oxide semiconductor stack 115 is characterized in that an oxide semiconductor film 115a having a first crystal structure, which is in contact with the oxide insulating film 102 and the pair of electrodes 116, and an oxide semiconductor film 115b having a second crystal structure, which is in contact with the oxide semiconductor film 115a having the first crystal structure, are stacked.

Further, the oxide semiconductor stack 115 is characterized in that crystal growth has occurred in the oxide semiconductor film 115a having the first crystal structure with the use of the oxide semiconductor film 115b having the second crystal structure as seed crystal.

As in Embodiment 1, both the oxide semiconductor film having the second crystal structure and the oxide semiconductor film having the first crystal structure include trigonal and/or hexagonal crystal; therefore, a hexagonal lattice image can be observed from the c-axis direction.

Note that each of the oxide semiconductor film 115a having the first crystal structure and the oxide semiconductor film 115b having the second crystal structure is non-single-crystal, is not entirely in an amorphous state, and includes c-axis-aligned crystals.

Next, a method for manufacturing the transistor in FIG. 7B will be described with reference to FIGS. 8A to 8C.

As illustrated in FIG. 8A, the oxide insulating film 102 is formed over the substrate 101 as in Embodiment 1. Next, the pair of electrodes 116 is formed over the oxide insulating film 102. Then, a first oxide semiconductor film 113a and a second oxide semiconductor film 113b are formed over the pair of electrodes 116 and the oxide insulating film 102.

The pair of electrodes 116 can be formed as appropriate by using a material and a formation method which are similar to those of the pair of electrodes 106 described in Embodiment 1.

The first oxide semiconductor film 113a and the second oxide semiconductor film 113b can be formed as appropriate by using materials and formation methods which are similar to those of the first oxide semiconductor film 103a and the second oxide semiconductor film 103b described in Embodiment 1.

Next, in a manner similar to that in Embodiment 1, first heat treatment is performed. The first heat treatment allows crystal growth to begin from a surface of the second oxide semiconductor film 113b toward the first oxide semiconductor film 113a, so that the second oxide semiconductor film 113b becomes an oxide semiconductor film 114b having the second crystal structure. The oxide semiconductor film 114b having the second crystal structure includes c-axis-aligned crystal.

When the first heat treatment is continued, crystal growth of the first oxide semiconductor film 113a proceeds from the interface with the oxide semiconductor film 114b having the second crystal structure toward the oxide insulating film 102 with the use of the oxide semiconductor film 114b having the second crystal structure as a seed, so that an oxide semiconductor film 114a having the first crystal structure is formed. The oxide semiconductor film 114a having the first crystal structure includes c-axis-aligned crystal (see FIG. 8B).

Through the above steps, the oxide semiconductor film 114a having the first crystal structure and the oxide semiconductor film 114b having the second crystal structure can be formed.

Next, a mask is formed over the oxide semiconductor film 114b having the second crystal structure, and then the oxide semiconductor film 114a having the first crystal structure and the oxide semiconductor film 114b having the second crystal structure are selectively etched using the mask, so that the oxide semiconductor film 115a having the first crystal structure and the oxide semiconductor film 115b having the second crystal structure are formed. Note that the oxide semiconductor film 115a having the first crystal structure and the oxide semiconductor film 115b having the second crystal structure are collectively referred to as the oxide semiconductor stack 115. After that, the mask is removed.

Next, the gate insulating film 117 is formed over the oxide insulating film 102, the pair of electrodes 116, and the oxide semiconductor stack 115. Then, the gate electrode 118 is formed over the gate insulating film 117.

After that, the insulating film 119 is formed over the gate insulating film 117 and the gate electrode 118. Then, after a mask is formed over the insulating film 119, the gate insulating film 117 and the insulating film 119 are partly etched to form openings. Then, the wirings 120 which are connected to the pair of electrodes 116 through the openings may be formed (see FIG. 8C).

The gate insulating film 117 can be formed as appropriate by using a material and a formation method which are similar to those of the gate insulating film 107 described in Embodiment 1.

The gate electrode 118 can be formed as appropriate by using a material and a formation method which are similar to those of the gate electrode 108 described in Embodiment 1.

The insulating film 119 can be formed as appropriate by using a material and a formation method which are similar to those of the insulating film 109 described in Embodiment 1.

The wirings 120 can be formed as appropriate by using a material and a formation method which are similar to those of the pair of electrodes 116.

Through the above steps, a transistor whose channel region includes an oxide semiconductor stack including crystal which has hexagonal bonds in the a-b plane and a c-axis-aligned trigonal and/or hexagonal structure can be manufactured.

The oxide semiconductor stack described in this embodiment has high crystallinity and evenness in a region in the vicinity of the interface with the gate insulating film and thus has stable electric characteristics; accordingly, a highly reliable transistor can be obtained. The oxide semiconductor stack including crystal which has hexagonal bonds in the a-b plane and a c-axis-aligned trigonal and/or hexagonal structure is used for a channel region of a transistor, whereby a transistor in which the amount of change in the threshold voltage between before and after light irradiation or a bias-temperature stress (BT) test performed on the transistor is small and which has stable electric characteristics can be manufactured.

Note that this embodiment can be combined with any of the other embodiments as appropriate.

(Embodiment 3)

Figure 9A:
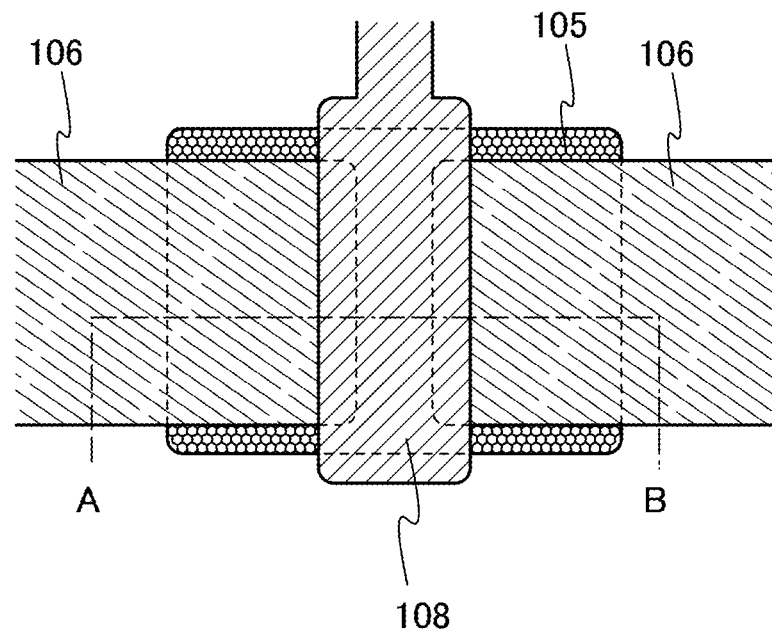
FIGS. 9A and 9B are a top view and a cross-sectional view, respectively, illustrating a semiconductor device which is one embodiment of the present invention.
Figure 9B:
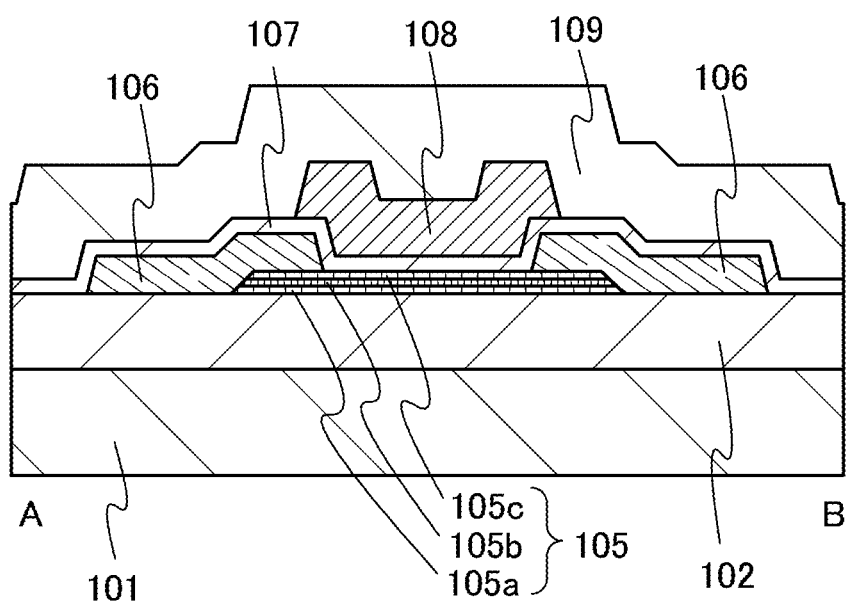

In this embodiment, a transistor in which an oxide semiconductor film is used for a channel and a manufacturing method thereof will be described with reference to FIGS. 9A and 9B and FIGS. 10A to 10E. FIG. 9B is a cross-sectional view illustrating a structure of a transistor which is one embodiment of a structure of a semiconductor device, and corresponds to a cross-sectional view along dashed-dotted line A-B in FIG. 9A which is a top view. Note that in FIG. 9A, the substrate 101, the oxide insulating film 102, the gate insulating film 107, and the insulating film 109 are not illustrated. FIGS. 10A to 10E are cross-sectional views illustrating a manufacturing process of the transistor illustrated in FIG. 9B.

The transistor illustrated in FIG. 9B includes the oxide insulating film 102 formed over the substrate 101; the oxide semiconductor stack 105 formed over the oxide insulating film 102; the pair of electrodes 106 which is formed over the oxide semiconductor stack 105 and functions as a source electrode and a drain electrode; the gate insulating film 107 formed over the oxide insulating film 102, the oxide semiconductor stack 105, and the pair of electrodes 106; and the gate electrode 108 which overlaps with the oxide semiconductor stack 105 with the gate insulating film 107 positioned therebetween. Further, the insulating film 109 which covers the gate insulating film 107 and the gate electrode 108 may be provided.

The oxide semiconductor stack 105 is characterized in that the oxide semiconductor film 105a having a first crystal structure, which is in contact with the oxide insulating film 102; the oxide semiconductor film 105b having a second crystal structure, which is in contact with the oxide semiconductor film 105a having the first crystal structure; and an oxide semiconductor film 105c having a third crystal structure, which is in contact with the oxide semiconductor film 105b having the second crystal structure and the gate insulating film 107, are stacked.

That is, the oxide semiconductor film 105a having the first crystal structure and the oxide semiconductor film 105c having the third crystal structure are provided under and over the oxide semiconductor film 105b having the second crystal structure.

Further, the oxide semiconductor stack 105 is characterized in that crystal growth has occurred in each of the oxide semiconductor film 105a having the first crystal structure and the oxide semiconductor film 105c having the third crystal structure with the use of the oxide semiconductor film 105b having the second crystal structure as seed crystal.

The crystal structures of the oxide semiconductor film 105a having the first crystal structure and the oxide semiconductor film 105c having the third crystal structure are each a trigonal and/or hexagonal crystal structure and any one of a $YbFe_2O_4$ structure, a $Yb_2Fe_3O_7$ structure, and a non-wurtzite structure. Note that the non-wurtzite structure is a crystal structure which is not a trigonal and/or hexagonal wurtzite type.

Further, the crystal structure of the oxide semiconductor film 105b having the second crystal structure is a wurtzite structure which is one of trigonal and/or hexagonal crystal structures.

In other words, since all of the oxide semiconductor film having the first crystal structure, the oxide semiconductor film having the second crystal structure, and the oxide semiconductor film having the third crystal structure include trigonal and/or hexagonal crystal, a hexagonal lattice image can be observed from the c-axis direction.

Note that each of the oxide semiconductor film 105a having the first crystal structure, the oxide semiconductor film 105b having the second crystal structure, and the oxide semiconductor film 105c having the third crystal structure is non-single-crystal, is not entirely in an amorphous state, and includes a c-axis-aligned crystal region. That is, each of the oxide semiconductor films has an amorphous region and a c-axis-aligned crystal region.

Next, a method for manufacturing the transistor in FIG. 9B will be described with reference to FIGS. 10A to 10E.

Figure 10A:
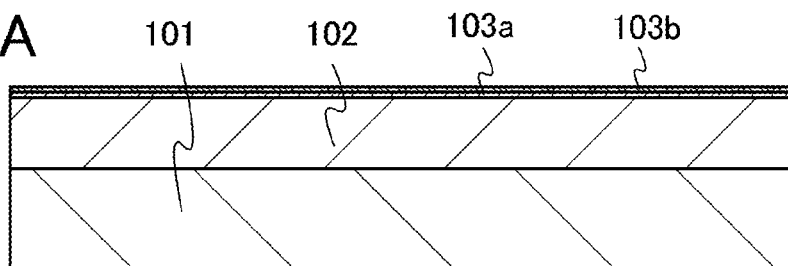
FIGS. 10A to 10E are cross-sectional views illustrating a method for manufacturing a semiconductor device which is one embodiment of the present invention.
Figure 10B:
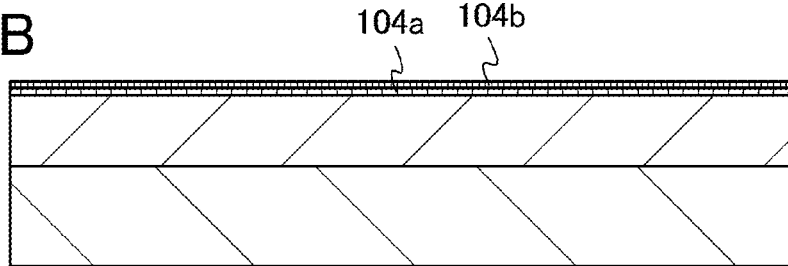

As illustrated in FIG. 10A, in a manner similar to that in Embodiment 1, after the oxide insulating film 102 is formed over the substrate 101, the first oxide semiconductor film 103a is formed over the oxide insulating film 102, and the second oxide semiconductor film 103b is formed over the first oxide semiconductor film 103a.

The oxide insulating film 102 is formed using an oxide insulating film from which part of contained oxygen is released by heating. The oxide insulating film from which part of contained oxygen is released by heating is preferably an oxide insulating film which contains oxygen at an amount exceeding the amount of oxygen in its stoichiometric composition. With the oxide insulating film from which part of contained oxygen is released by heating, oxygen can be diffused to the first oxide semiconductor film 103a and the second oxide semiconductor film 103b by heating. Typical examples of the oxide insulating film 102 include films of silicon oxide, silicon oxynitride, silicon nitride oxide, aluminum oxide, aluminum oxynitride, gallium oxide, hafnium oxide, and yttrium oxide.

The thickness of the oxide insulating film 102 is greater than or equal to 50 nm, preferably greater than or equal to 200 nm and less than or equal to 500 nm. With the use of the thick oxide insulating film 102, the amount of oxygen released from the oxide insulating film 102 can be increased, and defects at the interface between the oxide insulating film 102 and an oxide semiconductor film to be formed later can be reduced.

The oxide insulating film 102 is formed by a sputtering method, a CVD method, or the like. The oxide insulating film from which part of contained oxygen is released by heating is easily formed by a sputtering method, which is preferable.

When the oxide insulating film from which part of contained oxygen is released by heating is formed by a sputtering method, the amount of oxygen in a deposition gas is preferably large, and oxygen, a mixed gas of oxygen and a rare gas, or the like can be used. Typically, the oxygen concentration in the deposition gas is preferably higher than or equal to 6% and lower than or equal to 100%.

The first oxide semiconductor film 103a is formed using an oxide semiconductor film which can include trigonal and/or hexagonal crystal and have any one crystal structure of a non-wurtzite structure, a $YbFe_2O_4$ structure, a $Yb_2Fe_3O_7$ structure, and deformed structures of the foregoing structures by heating.

As an example of the oxide semiconductor film having the first crystal structure, an In—Ga—Zn—O film that is a three-component metal oxide includes trigonal and/or hexagonal non-wurtzite crystal. In addition, examples of the In—Ga—Zn—O film that is a three-component metal oxide include $InGaZnO_4$ having a $YbFe_2O_4$ structure and $In_2Ga_2ZnO_7$ having a $Yb_2Fe_3O_7$ structure, and the In—Ga—Zn—O film can have any of deformed structures of the foregoing structures (M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315).

As the first oxide semiconductor film 103a, a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; a two-component metal oxide such as an In—Zn—O film, a Sn—Zn—O film, an Al—Zn—O film, or an In—Ga—O film; or the like can be used. Further, $SiO_2$ may be contained in the above oxide semiconductor. In this specification, for example, an In—Ga—Zn—O film means an oxide film containing indium (In), gallium (Ga), and zinc (Zn). Note that the above metal oxide containing nitrogen at a concentration higher than or equal to $1×10^{17}/cm^3$ and lower than $5×10^{19}/cm^3$ may be used for the first oxide semiconductor film 103a.

Note that the energy gap of a metal oxide which can form the first oxide semiconductor film 103a is 2 eV or more, preferably 2.5 eV or more, further preferably 3 eV or more. In this manner, the off-state current of a transistor can be reduced by using an oxide semiconductor having a wide energy gap.

The second oxide semiconductor film 103b is formed using an oxide semiconductor film which can have a wurtzite crystal structure by heating. The oxide semiconductor film which can have a wurtzite crystal structure is easily crystallized by heat treatment and has high crystallinity as compared to an oxide semiconductor film which can have a trigonal and/or hexagonal crystal structure.

The second oxide semiconductor film 103b can be formed using zinc oxide, an oxynitride semiconductor, or the like. The oxynitride semiconductor can be obtained by adding nitrogen to any of the metal oxides listed for the first oxide semiconductor film 103a at a concentration higher than or equal to $5\times10^{19}/cm^3$, preferably higher than or equal to $1\times10^{20}/cm^3$ and lower than 7 at. %.

The second oxide semiconductor film 103b is used as a seed for crystal growth of the first oxide semiconductor film 103a and a third oxide semiconductor film 103c which is formed later. Therefore, the second oxide semiconductor film 103b may have a thickness with which crystal growth is possible, typically greater than or equal to a thickness of one atomic layer and less than or equal to 10 nm, preferably greater than or equal to 2 nm and less than or equal to 5 nm. When the second oxide semiconductor film 103b is thin, throughput in deposition treatment and heat treatment can be improved.

The first oxide semiconductor film 103a and the second oxide semiconductor film 103b can each be formed by a sputtering method, a coating method, a printing method, a pulsed laser evaporation method, or the like. When the first oxide semiconductor film 103a and the second oxide semiconductor film 103b are formed by a sputtering method, one of an AC sputtering apparatus, a DC sputtering apparatus, and an RF sputtering apparatus is used.

When the second oxide semiconductor film 103b is formed by a sputtering method with the use of an oxynitride semiconductor, the oxynitride semiconductor can be deposited by changing the kind of gas introduced into the sputtering apparatus, that is, by introducing nitrogen after the first oxide semiconductor film 103a is formed. In other words, it is possible to form the first oxide semiconductor film 103a and the second oxide semiconductor film 103b successively, which is highly productive.

Next, in a manner similar to that in Embodiment 1, first heat treatment is performed.

The first heat treatment allows crystal growth to begin from a surface of the second oxide semiconductor film 103b toward the first oxide semiconductor film 103a.

Since the second oxide semiconductor film 103b is easily crystallized, the whole second oxide semiconductor film 103b is crystallized to be the oxide semiconductor film 104b having the second crystal structure that is a wurtzite crystal structure. Further, since crystal growth proceeds from the surface of the second oxide semiconductor film 103b toward the first oxide semiconductor film 103a, a c-axis-aligned crystal region is formed. That is, the oxide semiconductor film 104b having the second crystal structure includes bonds that form a hexagonal shape in a plane in the a-b plane. In addition, layers including hexagonal bonds are stacked and bonded in the thickness direction (the c-axis direction), so that c-axis alignment is obtained.

When the first heat treatment is continued, crystal growth of the first oxide semiconductor film 103a proceeds from the interface with the oxide semiconductor film 104b having the second crystal structure toward the oxide insulating film 102 with the use of the oxide semiconductor film 104b having the second crystal structure as a seed. Crystals in the oxide semiconductor film 104b having the second crystal structure are c-axis aligned; therefore, by using the oxide semiconductor film 104b having the second crystal structure as a seed, crystal in the first oxide semiconductor film 103a can grow so as to be generally aligned with the crystal axis of the oxide semiconductor film 104b having the second crystal structure. That is, crystals in the first oxide semiconductor film 103a can grow while being aligned with the c-axis. That is, the oxide semiconductor film 104a having the first crystal structure includes bonds that form a hexagonal shape in a plane in the a-b plane. In addition, layers including hexagonal bonds are stacked and bonded in the thickness direction (the c-axis direction), so that c-axis alignment is obtained. Through the above steps, the oxide semiconductor film 104a having the c-axis-aligned first crystal structure can be formed (see FIG. 10B).

In the case where crystal growth proceeds perpendicularly from the surface of the second oxide semiconductor film 103b by the first heat treatment, the c-axes of the oxide semiconductor film 104a having the first crystal structure and the oxide semiconductor film 104b having the second crystal structure are generally perpendicular to the surface.

In addition, by the first heat treatment, hydrogen contained in the first oxide semiconductor film 103a and the second oxide semiconductor film 103b is released (i.e., dehydrogenation or dehydration occurs) and part of oxygen contained in the oxide insulating film 102 is diffused to the first oxide semiconductor film 103a, the second oxide semiconductor film 103b, and a region of the oxide insulating film 102 which is in the vicinity of the interface with the first oxide semiconductor film 103a. By this step, oxygen defects included in the first oxide semiconductor film 103a and the second oxide semiconductor film 103b can be reduced; moreover, diffusion of oxygen to the region of the oxide insulating film 102 in the vicinity of the first oxide semiconductor film 103a allows defects at the interface between the oxide insulating film 102 and the first oxide semiconductor film 103a to be reduced. As a result, the oxide semiconductor film 104a having the first crystal structure and the oxide semiconductor film 104b having the second crystal structure, in which the hydrogen concentration and oxygen defects are reduced, can be formed.

Figure 10C:
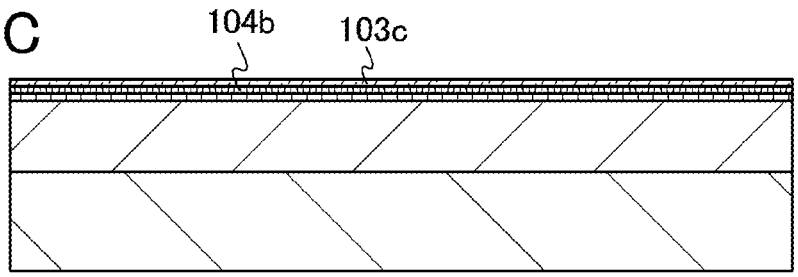
Figure 10D:
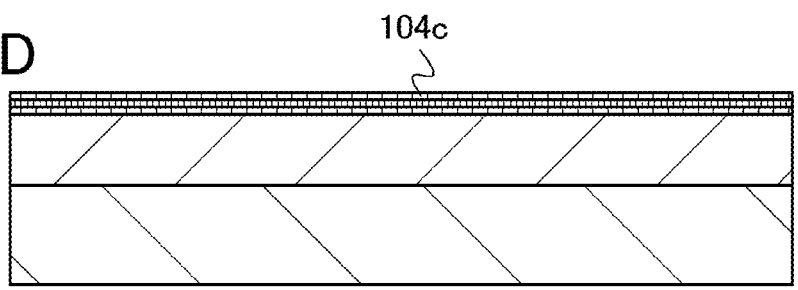
Figure 10E:
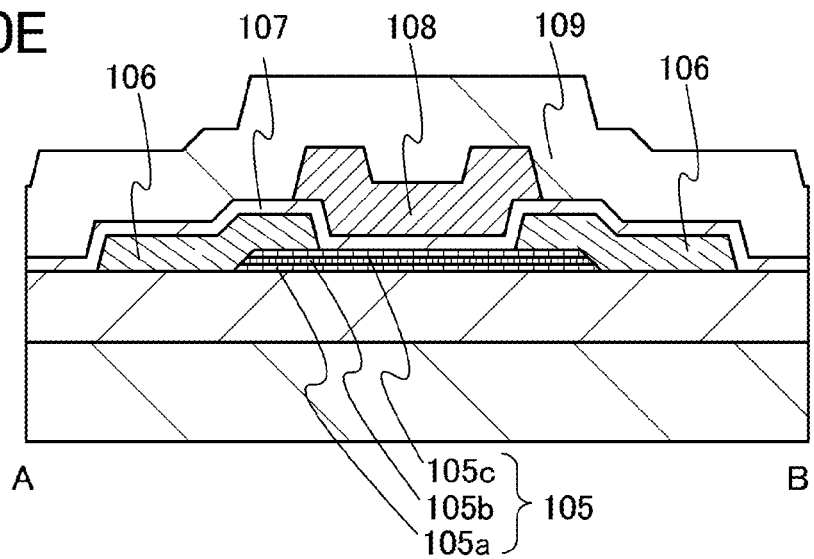

Next, as illustrated in FIG. 10C, the third oxide semiconductor film 103c is formed over the oxide semiconductor film 104b having the second crystal structure. The third oxide semiconductor film 103c can be formed by using a material and a formation method which are similar to those of the first oxide semiconductor film 103a. The thickness of the third oxide semiconductor film 103c may be determined as appropriate by a practitioner in accordance with a device to be manufactured. For example, the total thickness of the first oxide semiconductor film 103a, the second oxide semiconductor film 103b, and the third oxide semiconductor film 103c can be greater than or equal to 10 nm and less than or equal to 200 nm.

By setting the leakage rate of a treatment chamber of the sputtering apparatus to $1\times10^{-10}$ Pa·m$^3$/s or lower at the time of forming one or more of the first oxide semiconductor film 103a, the second oxide semiconductor film 103b, and the third oxide semiconductor film 103c by a sputtering method, entry of an impurity such as an alkali metal or hydrogen into the first oxide semiconductor film 103a, the second oxide semiconductor film 103b, and the third oxide semiconductor film 103c can be suppressed during the formation by a sputtering method. Further, with the use of an entrapment vacuum pump (e.g., a cryopump) as an evacuation system, counter flow of an impurity such as an alkali metal or hydrogen from the evacuation system can be reduced.

Further, one or more of the first oxide semiconductor film 103a, the second oxide semiconductor film 103b, and the third oxide semiconductor film 103c may be formed in the state where a gas introduced into the treatment chamber of the sputtering apparatus, such as a nitrogen gas, an oxygen gas, or an argon gas, is heated. Consequently, the content of hydrogen in one or more of the first oxide semiconductor film 103a, the second oxide semiconductor film 103b, and the third oxide semiconductor film 103c can be reduced.

Further, before one or more of the first oxide semiconductor film 103a, the second oxide semiconductor film 103b, and the third oxide semiconductor film 103c are formed by a sputtering method, preheat treatment may be performed in order to remove moisture or hydrogen contained in the sputtering apparatus or the surface or inside of a target. Consequently, the content of hydrogen in one or more of the first oxide semiconductor film 103a, the second oxide semiconductor film 103b, and the third oxide semiconductor film 103c can be reduced.

Next, second heat treatment is performed. The temperature of the second heat treatment is higher than or equal to 150° C. and lower than or equal to 650° C., preferably higher than or equal to 200° C. and lower than or equal to 500° C. In addition, heating time of the second heat treatment is longer than or equal to 1 minute and shorter than or equal to 24 hours.

The second heat treatment can be performed in an atmosphere similar to that of the first heat treatment. In addition, a heating apparatus similar to that of the first heat treatment can be used as appropriate for the second heat treatment.

The second heat treatment allows crystal growth to begin from the oxide semiconductor film 104b having the second crystal structure that is a wurtzite crystal structure toward the third oxide semiconductor film 103c. Crystals in the oxide semiconductor film 104b having the second crystal structure are c-axis aligned; therefore, by using the oxide semiconductor film 104b having the second crystal structure as a seed, crystals in the third oxide semiconductor film 103c can grow so as to be generally aligned with the crystal axis of the oxide semiconductor film 104b having the second crystal structure as in the case of the first oxide semiconductor film 103a. That is, crystals in the third oxide semiconductor film 103c can grow while being aligned with the c-axis. That is, an oxide semiconductor film 104c having the third crystal structure includes bonds that form a hexagonal shape in a plane in the a-b plane. In addition, layers including hexagonal bonds are stacked and bonded in the thickness direction (the c-axis direction), so that c-axis alignment is obtained. Through the above steps, the oxide semiconductor film 104c having the c-axis-aligned third crystal structure can be formed. Moreover, since crystal growth occurs with the use of the oxide semiconductor film 104b having the second crystal structure as a seed, crystal growth of the third oxide semiconductor film 103c is enhanced, so that a surface of the oxide semiconductor film 104c having the third crystal structure has high evenness as well as high crystallinity (see FIG. 10D).

In the case where crystal growth proceeds perpendicularly from the surface of the oxide semiconductor film 104b having the second crystal structure by the second heat treatment, the c-axis of the oxide semiconductor film 104c having the third crystal structure is generally perpendicular to the surface of the oxide semiconductor film 104b having the second crystal structure.

Furthermore, by the second heat treatment, hydrogen contained in the third oxide semiconductor film 103c is released (i.e., dehydrogenation or dehydration occurs) as in the case of the first heat treatment. As a result, the oxide semiconductor film 104c having the third crystal structure, in which the hydrogen concentration is reduced, can be formed.

Through the above steps, the oxide semiconductor film 104a having the first crystal structure, the oxide semiconductor film 104b having the second crystal structure, and the oxide semiconductor film 104c having the third crystal structure can be formed; note that the first to third crystal structures are trigonal and/or hexagonal crystal structures. The hydrogen concentration and oxygen defects in the oxide semiconductor film 104a having the first crystal structure, the oxide semiconductor film 104b having the second crystal structure, and the oxide semiconductor film 104c having the third crystal structure can be reduced. If hydrogen is contained in the oxide semiconductor, part thereof serves as a donor to generate an electron as a carrier. In addition, an oxygen defect in the oxide semiconductor also serves as a donor to generate an electron as a carrier. Therefore, when the hydrogen concentration and oxygen defects are reduced in the oxide semiconductor film 104a having the first crystal structure, the oxide semiconductor film 104b having the second crystal structure, and the oxide semiconductor film 104c having the third crystal structure, the carrier concentration in the oxide semiconductor can be reduced and thus negative shift of the threshold voltage of the transistor to be manufactured later can be suppressed. For those reasons, reduction in the hydrogen concentration and the number of oxygen defects in the oxide semiconductor film 104a having the first crystal structure, the oxide semiconductor film 104b having the second crystal structure, and the oxide semiconductor film 104c having the third crystal structure leads to suppression of negative shift of the threshold voltage of the transistor to be manufactured later.

Next, in a manner similar to that in Embodiment 1, a mask is formed over the oxide semiconductor film 104c having the third crystal structure, and then the oxide semiconductor film 104a having the first crystal structure, the oxide semiconductor film 104b having the second crystal structure, and the oxide semiconductor film 104c having the third crystal structure are selectively etched using the mask, so that the oxide semiconductor film 105a having the first crystal structure, the oxide semiconductor film 105b having the second crystal structure, and the oxide semiconductor film 105c having the third crystal structure are formed. Note that the oxide semiconductor film 105a having the first crystal structure, the oxide semiconductor film 105b having the second crystal structure, and the oxide semiconductor film 105c having the third crystal structure are collectively referred to as the oxide semiconductor stack 105. After that, the mask is removed.

Next, the pair of electrodes 106 is formed in contact with the oxide semiconductor stack 105. Then, the gate insulating film 107 is formed over the oxide insulating film 102, the oxide semiconductor stack 105, and the pair of electrodes 106. After that, the gate electrode 108 is formed over the gate insulating film 107. The insulating film 109 may be formed over the gate insulating film 107 and the gate electrode 108 (see FIG. 10E).

The pair of electrodes 106 can be formed as appropriate by using a material and a formation method which are similar to those of the pair of electrodes 106 described in Embodiment 1.

Note that the oxide semiconductor stack 105 and the pair of electrodes 106 can be formed in the following manner. After a conductive film is formed over the oxide semiconductor film 104c having the third crystal structure, a concavo-convex shaped mask is formed using a multi-tone photomask. The oxide semiconductor film 104a having the first crystal structure, the oxide semiconductor film 104b having the second crystal structure, the oxide semiconductor film 104c having the third crystal structure, and the conductive film are etched using the mask. Then, the concavo-convex shaped mask is separated by ashing. The conductive film is selectively etched using the separated masks. In this process, the number of photomasks and the number of steps in the photolithography process can be reduced.

The gate insulating film 107 can be formed as appropriate by using a material and a formation method which are similar to those of the gate insulating film 107 described in Embodiment 1.

Before the gate insulating film 107 is formed, the surface of the oxide semiconductor stack 105 may be exposed to plasma of an oxidizing gas such as oxygen, ozone, or dinitrogen monoxide so as to be oxidized, thereby reducing oxygen defects.

The gate electrode 108 can be formed as appropriate by using a material and a formation method which are similar to those of the gate electrode 108 described in Embodiment 1.

Note that, after formation of the gate insulating film 107 or the insulating film 109, heat treatment (temperature range: higher than or equal to 150° C. and lower than or equal to 650° C., preferably higher than or equal to 200° C. and lower than or equal to 500° C.) may be performed in an atmosphere which contains little hydrogen and moisture (such as a nitrogen atmosphere, an oxygen atmosphere, or a dry air atmosphere (in terms of moisture, for example, the dew point is lower than or equal to −40° C., preferably lower than or equal to −60° C.)).

Through the above steps, a transistor whose channel includes an oxide semiconductor stack including a crystal region which has hexagonal bonds in the a-b plane and a c-axis-aligned trigonal and/or hexagonal structure can be manufactured.

The oxide semiconductor stack described in this embodiment has high crystallinity and evenness in a region in the vicinity of the interface with the gate insulating film and thus has stable electric characteristics; accordingly, a highly reliable transistor can be obtained. The oxide semiconductor stack including a crystal region which has hexagonal bonds in the a-b plane and a c-axis-aligned trigonal and/or hexagonal structure is used for a channel region of a transistor, whereby a transistor in which the amount of change in the threshold voltage between before and after light irradiation or a bias-temperature stress (BT) test performed on the transistor is small and which has stable electric characteristics can be manufactured.

Note that an oxynitride semiconductor has a smaller energy gap than an oxide semiconductor, and thus carriers easily flow therein. Therefore, by reducing the thickness of the oxide semiconductor film 105c having the third crystal structure in the transistor, a buried channel transistor in which the oxide semiconductor film 105b having the second crystal structure serves as a channel is obtained. As a result, a transistor which has favorable electric characteristics without an influence of the condition of the interface between the gate insulating film 107 and the oxide semiconductor film 105c having the third crystal structure can be manufactured.

(Embodiment 4)

Figure 11A:
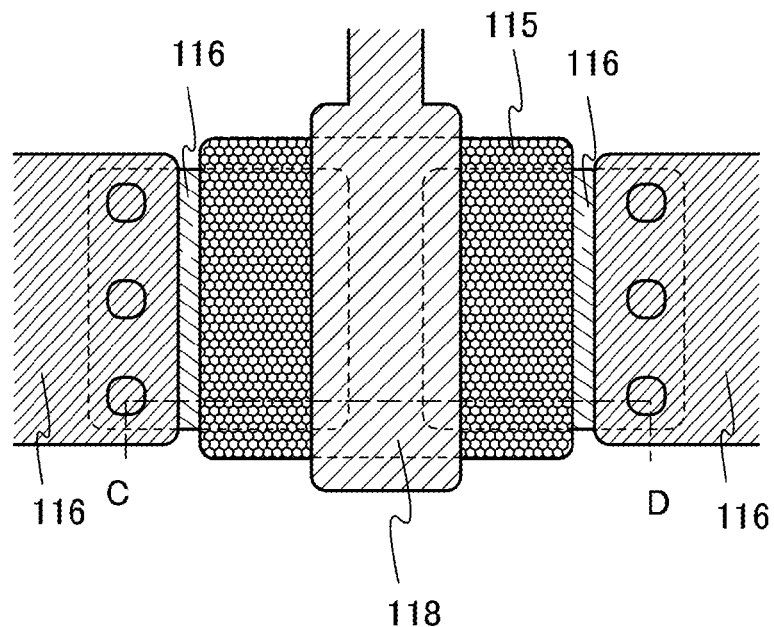
FIGS. 11A and 11B are a top view and a cross-sectional view, respectively, illustrating a semiconductor device which is one embodiment of the present invention.

In this embodiment, a structure of a transistor which is different from that in Embodiment 3 and a manufacturing method thereof will be described with reference to FIGS. 11A and 11B and FIGS. 12A to 12D. This embodiment is different from Embodiment 3 in that a pair of electrodes is provided between an oxide insulating film and an oxide semiconductor stack. Note that FIG. 11B corresponds to a cross-sectional view along dashed-dotted line C-D in FIG. 11A which is a top view. In FIG. 11A, the substrate 101, the oxide insulating film 102, the gate insulating film 117, and the insulating film 119 are not illustrated. FIGS. 12A to 12D are cross-sectional views illustrating a manufacturing process of the transistor illustrated in FIG. 11B.

Figure 11B:
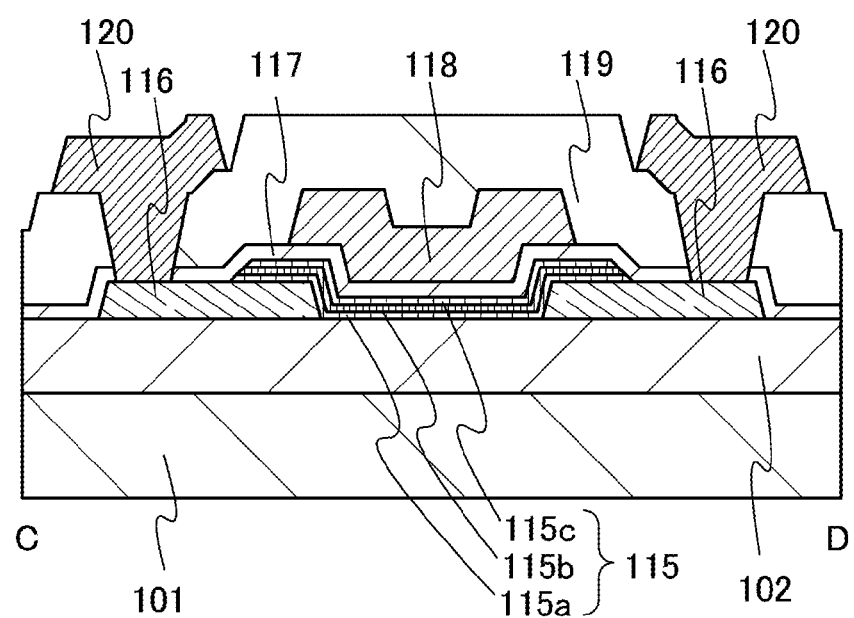

The transistor illustrated in FIG. 11B includes the oxide insulating film 102 formed over the substrate 101; the pair of electrodes 116 which is formed over the oxide insulating film 102 and functions as a source electrode and a drain electrode; the oxide semiconductor stack 115 which covers the oxide insulating film 102 and the pair of electrodes 116 functioning as the source electrode and the drain electrode; the gate insulating film 117 formed over the oxide insulating film 102, the pair of electrodes 116, and the oxide semiconductor stack 115; and the gate electrode 118 which overlaps with the oxide semiconductor stack 115 with the gate insulating film 117 positioned therebetween. Further, the insulating film 119 which covers the gate insulating film 117 and the gate electrode 118 may be provided. Furthermore, the pair of wirings 120 may be provided in contact with the pair of electrodes 116 in openings in the insulating film 119.

The oxide semiconductor stack 115 is characterized in that the oxide semiconductor film 115a having a first crystal structure, which is in contact with the oxide insulating film 102 and the pair of electrodes 116; the oxide semiconductor film 115b having a second crystal structure, which is in contact with the oxide semiconductor film 115a having the first crystal structure; and an oxide semiconductor film 115c having a third crystal structure, which is in contact with the oxide semiconductor film 115b having the second crystal structure and the gate insulating film 117, are stacked.

That is, the oxide semiconductor film 115a having the first crystal structure and the oxide semiconductor film 115c having the third crystal structure are provided under and over the oxide semiconductor film 115b having the second crystal structure.

Further, the oxide semiconductor stack 115 is characterized in that crystal growth has occurred in each of the oxide semiconductor film 115a having the first crystal structure and the oxide semiconductor film 115c having the third crystal structure with the use of the oxide semiconductor film 115b having the second crystal structure as seed crystal.

The crystal structures of the oxide semiconductor film 115a having the first crystal structure and the oxide semiconductor film 115c having the third crystal structure are each a trigonal and/or hexagonal crystal structure and any one of a non-wurtzite structure, a $YbFe_2O_4$ structure, a $Yb_2Fe_3O_7$ structure, and deformed structures of the foregoing structures. Note that the non-wurtzite structure is a crystal structure which is not a trigonal and/or hexagonal wurtzite type.

Further, the crystal structure of the oxide semiconductor film 115b having the second crystal structure is a wurtzite structure which is one of trigonal and/or hexagonal crystal structures.

As in Embodiment 3, since all of the oxide semiconductor film 115a having the first crystal structure, the oxide semiconductor film 115b having the second crystal structure, and the oxide semiconductor film 115c having the third crystal structure include trigonal and/or hexagonal crystal, a hexagonal lattice image can be observed from the c-axis direction.

Note that each of the oxide semiconductor film 115a having the first crystal structure, the oxide semiconductor film 115b having the second crystal structure, and the oxide semiconductor film 115c having the third crystal structure is non-single-crystal, is not entirely in an amorphous state, and includes a c-axis-aligned crystal region. That is, each of the oxide semiconductor films has an amorphous region and a c-axis-aligned crystal region.

Next, a method for manufacturing the transistor in FIG. 11B will be described with reference to FIGS. 12A to 12D.

Figure 12A:
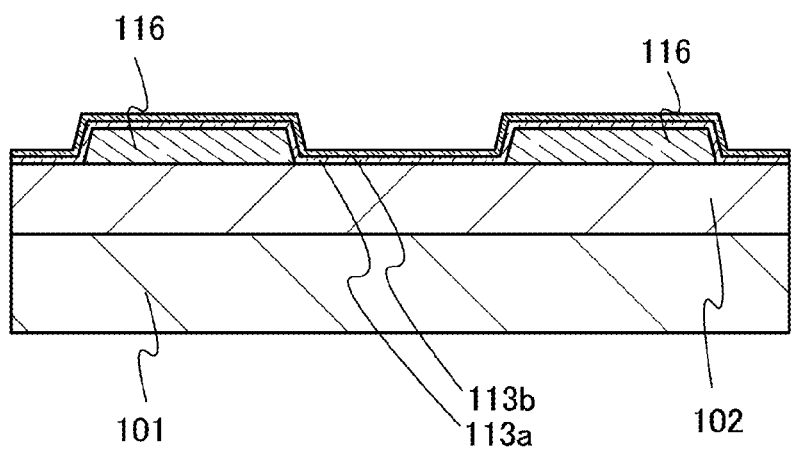
FIGS. 12A to 12D are cross-sectional views illustrating a method for manufacturing a semiconductor device which is one embodiment of the present invention.

As illustrated in FIG. 12A, the oxide insulating film 102 is formed over the substrate 101 as in Embodiment 1. Next, the pair of electrodes 116 is formed over the oxide insulating film 102. Then, the first oxide semiconductor film 113a and the second oxide semiconductor film 113b are formed over the pair of electrodes 116 and the oxide insulating film 102.

The pair of electrodes 116 can be formed as appropriate by using a material and a formation method which are similar to those of the pair of electrodes 106 described in Embodiment 1.

The first oxide semiconductor film 113a and the second oxide semiconductor film 113b can be formed as appropriate by using materials and formation methods which are similar to those of the first oxide semiconductor film 103a and the second oxide semiconductor film 103b described in Embodiment 1.

Next, in a manner similar to that in Embodiment 1, first heat treatment is performed. The first heat treatment allows crystal growth to begin from a surface of the second oxide semiconductor film 113b toward the first oxide semiconductor film 113a, so that the second oxide semiconductor film 113b becomes the oxide semiconductor film 114b having the second crystal structure that is a wurtzite crystal structure. The oxide semiconductor film 114b having the second crystal structure includes c-axis-aligned crystal.

When the first heat treatment is continued, crystal growth of the first oxide semiconductor film 113a proceeds from the interface with the oxide semiconductor film 114b having the second crystal structure toward the oxide insulating film 102 with the use of the oxide semiconductor film 114b having the second crystal structure as a seed, so that the oxide semiconductor film 114a having the first crystal structure is formed. The oxide semiconductor film 114a having the first crystal structure includes a c-axis-aligned crystal region.

Figure 12B:
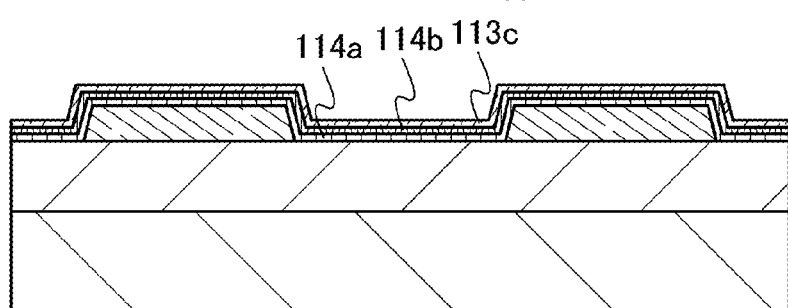
Figure 12C:
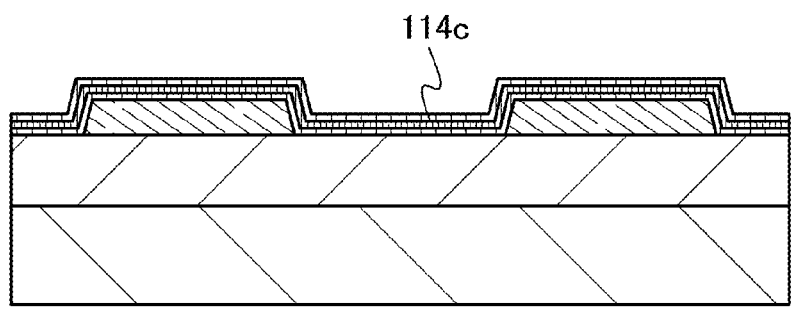
Figure 12D:
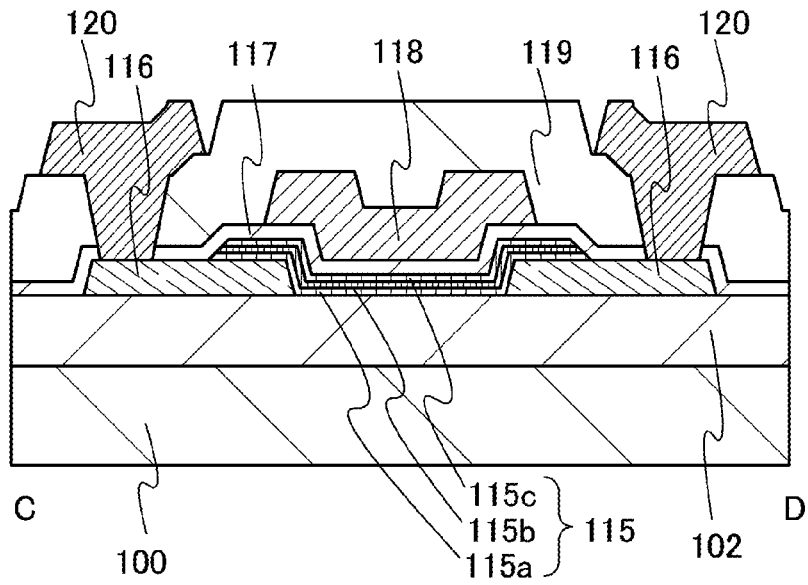

Next, a third oxide semiconductor film 113c is formed over the oxide semiconductor film 114b having the second crystal structure (see FIG. 12B). The third oxide semiconductor film 113c can be formed as appropriate by using a material and a formation method which are similar to those of the third oxide semiconductor film 103c described in Embodiment 3.

Next, in a manner similar to that in Embodiment 3, second heat treatment is performed. The second heat treatment allows crystal growth to begin from the interface with the oxide semiconductor film 114b having the second crystal structure that is a wurtzite crystal structure toward the third oxide semiconductor film 113c, so that the third oxide semiconductor film 113c becomes an oxide semiconductor film 114c having the third crystal structure. The oxide semiconductor film 114c having the third crystal structure includes a c-axis-aligned crystal region (see FIG. 12C).

Through the above steps, the oxide semiconductor film 114a having the first crystal structure, the oxide semiconductor film 114b having the second crystal structure, and the oxide semiconductor film 114c having the third crystal structure can be formed; note that the first to third crystal structures are trigonal and/or hexagonal crystal structures.

Next, a mask is formed over the oxide semiconductor film 114c having the third crystal structure, and then the oxide semiconductor film 114a having the first crystal structure, the oxide semiconductor film 114b having the second crystal structure, and the oxide semiconductor film 114c having the third crystal structure are selectively etched using the mask, so that the oxide semiconductor film 115a having the first crystal structure, the oxide semiconductor film 115b having the second crystal structure, and the oxide semiconductor film 115c having the third crystal structure are formed. Note that the oxide semiconductor film 115a having the first crystal structure, the oxide semiconductor film 115b having the second crystal structure, and the oxide semiconductor film 115c having the third crystal structure are collectively referred to as the oxide semiconductor stack 115. After that, the mask is removed.

Next, the gate insulating film 117 is formed over the oxide insulating film 102, the pair of electrodes 116, and the oxide semiconductor stack 115. Then, the gate electrode 118 is formed over the gate insulating film 117.

After that, the insulating film 119 is formed over the gate insulating film 117 and the gate electrode 118. Then, after a mask is formed over the insulating film 119, the gate insulating film 117 and the insulating film 119 are partly etched to form openings. Then, the wirings 120 which are connected to the pair of electrodes 116 through the openings may be formed (see FIG. 12D).

The gate insulating film 117 can be formed as appropriate by using a material and a formation method which are similar to those of the gate insulating film 107 described in Embodiment 1.

The gate electrode 118 can be formed as appropriate by using a material and a formation method which are similar to those of the gate electrode 108 described in Embodiment 1.

The insulating film 119 can be formed as appropriate by using a material and a formation method which are similar to those of the insulating film 109 described in Embodiment 1.

The wirings 120 can be formed as appropriate by using a material and a formation method which are similar to those of the pair of electrodes 116.

Through the above steps, a transistor whose channel region includes an oxide semiconductor stack including a crystal region which has hexagonal bonds in the a-b plane and a c-axis-aligned trigonal and/or hexagonal structure can be manufactured.

The oxide semiconductor stack described in this embodiment has high crystallinity and evenness in a region in the vicinity of the interface with the gate insulating film and thus has stable electric characteristics; accordingly, a highly reliable transistor can be obtained. The oxide semiconductor stack including a crystal region which has hexagonal bonds in the a-b plane and a c-axis-aligned trigonal and/or hexagonal structure is used for a channel region of a transistor, whereby a transistor in which the amount of change in the threshold voltage between before and after light irradiation or a bias-temperature stress (BT) test performed on the transistor is small and which has stable electric characteristics can be manufactured.

Note that this embodiment can be combined with any of the other embodiments as appropriate.

(Embodiment 5)

Figure 13A:
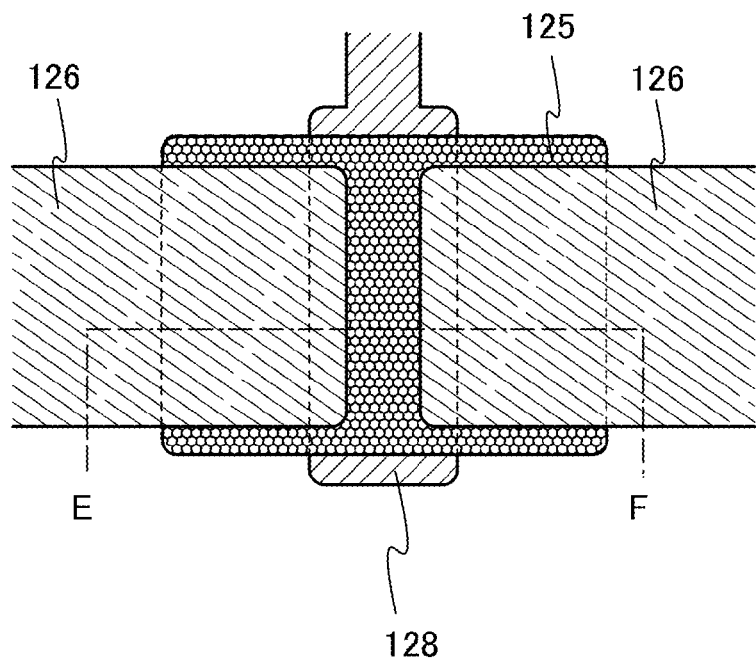
FIGS. 13A and 13B are a top view and a cross-sectional view, respectively, illustrating a semiconductor device which is one embodiment of the present invention.

In this embodiment, a structure of a transistor which is different from the structures of the transistors in Embodiments 1 to 4 and a manufacturing method thereof will be described with reference to FIGS. 13A and 13B and FIGS. 14A to 14D. This embodiment is different from Embodiments 1 to 4 in that a gate electrode is provided between an oxide insulating film and a gate insulating film. That is, although top-gate transistors are described in Embodiments 1 to 4, a bottom-gate transistor will be described in this embodiment. Note that FIG. 13B corresponds to a cross-sectional view along dashed-dotted line E-F in FIG. 13A which is a top view. In FIG. 13A, the substrate 101, the oxide insulating film 102, a gate insulating film 127, and an insulating film 129 are not illustrated. FIGS. 14A to 14D are cross-sectional views illustrating a manufacturing process of the transistor illustrated in FIG. 13B.

Figure 13B:
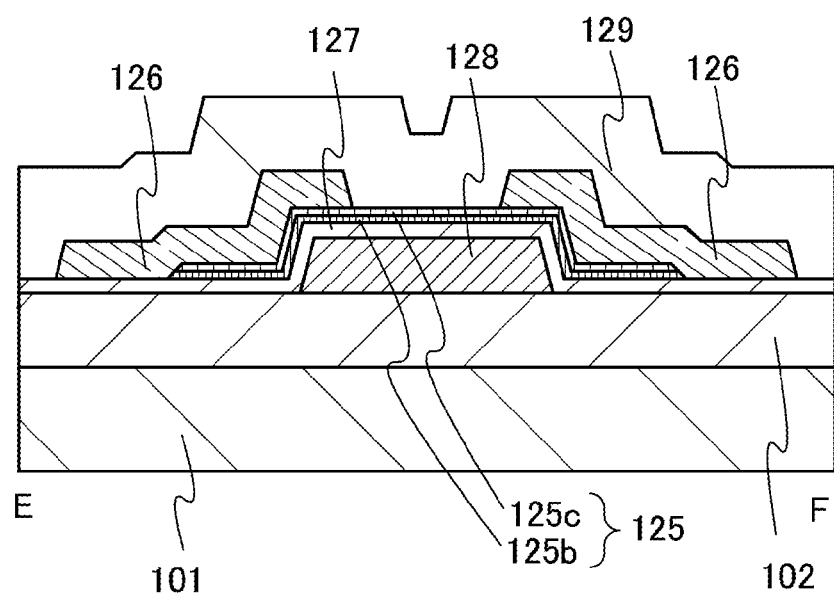

The transistor illustrated in FIG. 13B includes the oxide insulating film 102 formed over the substrate 101; a gate electrode 128 formed over the oxide insulating film 102; the gate insulating film 127 which covers the oxide insulating film 102 and the gate electrode 128; an oxide semiconductor stack 125 which overlaps with the gate electrode 128 with the gate insulating film 127 positioned therebetween; and a pair of electrodes 126 which is in contact with the oxide semiconductor stack 125 and functions as a source electrode and a drain electrode. Further, the insulating film 129 which covers the gate insulating film 127, the oxide semiconductor stack 125, and the pair of electrodes 126 may be provided.

The oxide semiconductor stack 125 is characterized in that an oxide semiconductor film 125b having a first crystal structure, which is in contact with the gate insulating film 127, and an oxide semiconductor film 125c having a second crystal structure, which is in contact with the oxide semiconductor film 125b having the first crystal structure, are stacked.

Further, the oxide semiconductor stack 125 is characterized in that crystal growth has occurred in the oxide semiconductor film 125c having the second crystal structure with the use of the oxide semiconductor film 125b having the first crystal structure as seed crystal.

The oxide semiconductor film 125b having the first crystal structure has a wurtzite crystal structure which is one of trigonal and/or hexagonal crystal structures.

The oxide semiconductor film 125c having the second crystal structure includes trigonal and/or hexagonal crystal and has any one crystal structure of a $YbFe_2O_4$ structure, a $Yb_2Fe_3O_7$ structure, and a non-wurtzite structure.

Since both the oxide semiconductor film having the first crystal structure and the oxide semiconductor film having the second crystal structure include trigonal and/or hexagonal crystal, a hexagonal lattice image can be observed from the c-axis direction.

Each of the oxide semiconductor film 125b having the first crystal structure and the oxide semiconductor film 125c having the second crystal structure is non-single-crystal, is not entirely in an amorphous state, and includes a c-axis-aligned crystal region. That is, each of the oxide semiconductor films has an amorphous region and a c-axis-aligned crystal region.

Note that the oxide semiconductor stack 125 has a two-layer structure including the oxide semiconductor film 125b having the first crystal structure and the oxide semiconductor film 125c having the second crystal structure, here; however, a three-layer oxide semiconductor stack may be formed as in Embodiments 3 and 4.

Next, a method for manufacturing the transistor in FIG. 13B will be described with reference to FIGS. 14A to 14D.

Figure 14A:
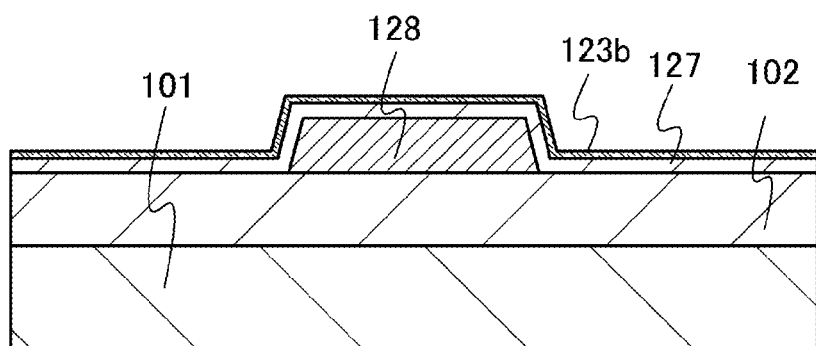
FIGS. 14A to 14D are cross-sectional views illustrating a method for manufacturing a semiconductor device which is one embodiment of the present invention.

As illustrated in FIG. 14A, the oxide insulating film 102 is formed over the substrate 101 as in Embodiment 1. Next, the gate electrode 128 is formed over the oxide insulating film 102. Then, the gate insulating film 127 is formed over the oxide insulating film 102 and the gate electrode 128. After that, a first oxide semiconductor film 123b is formed over the gate insulating film 127.

The gate electrode 128 and the gate insulating film 127 can be formed as appropriate by using materials and formation methods which are similar to those of the gate electrode 108 and the gate insulating film 107 described in Embodiment 1.

The first oxide semiconductor film 123b can be formed as appropriate by using a material and a formation method which are similar to those of the second oxide semiconductor film 103b described in Embodiment 1.

Next, in a manner similar to that in Embodiment 1, first heat treatment is performed. The first heat treatment allows crystal growth to begin from a surface of the first oxide semiconductor film 123b toward the gate insulating film 127, so that an oxide semiconductor film 124b having the first crystal structure is formed. The oxide semiconductor film 124b having the first crystal structure includes a c-axis-aligned crystal region.

Figure 14B:
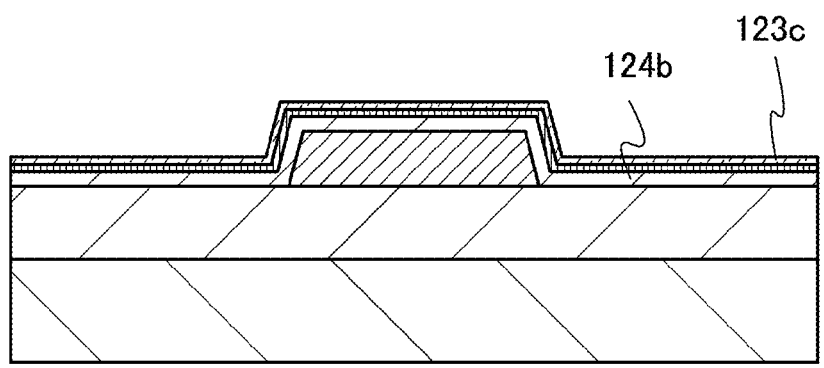
Figure 14C:
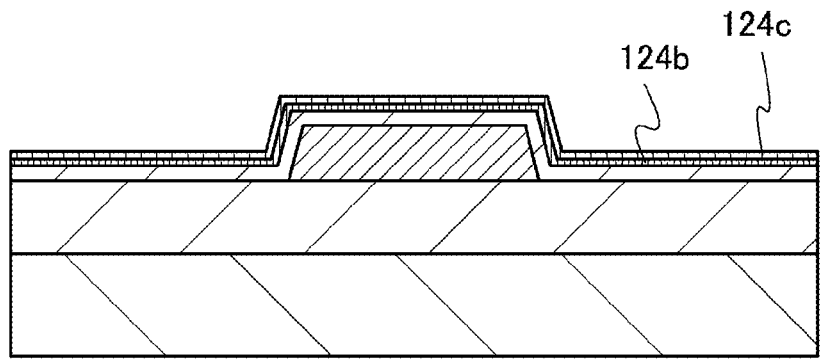

Next, a second oxide semiconductor film 123c is formed over the oxide semiconductor film 124b having the first crystal structure (see FIG. 14B). The second oxide semiconductor film 123c can be formed as appropriate by using a material and a formation method which are similar to those of the third oxide semiconductor film 103c described in Embodiment 3.

Next, in a manner similar to that in Embodiment 3, second heat treatment is performed. This heat treatment allows crystal growth to begin from the interface with the oxide semiconductor film 124b having the first crystal structure toward the second oxide semiconductor film 123c, so that the second oxide semiconductor film 123c becomes an oxide semiconductor film 124c having the second crystal structure. The oxide semiconductor film 124c having the second crystal structure includes a c-axis-aligned crystal region (see FIG. 14C).

Through the above steps, the oxide semiconductor film 124b having the first crystal structure and the oxide semiconductor film 124c having the second crystal structure can be formed.

Next, a mask is formed over the oxide semiconductor film 124c having the second crystal structure, and then the oxide semiconductor film 124b having the first crystal structure and the oxide semiconductor film 124c having the second crystal structure are selectively etched using the mask, so that the oxide semiconductor film 125b having the first crystal structure and the oxide semiconductor film 125c having the second crystal structure are formed. Note that the oxide semiconductor film 125b having the first crystal structure and the oxide semiconductor film 125c having the second crystal structure are collectively referred to as the oxide semiconductor stack 125. After that, the mask is removed.

Next, in a manner similar to that in Embodiment 1, the pair of electrodes 126 is formed.

Figure 14D:
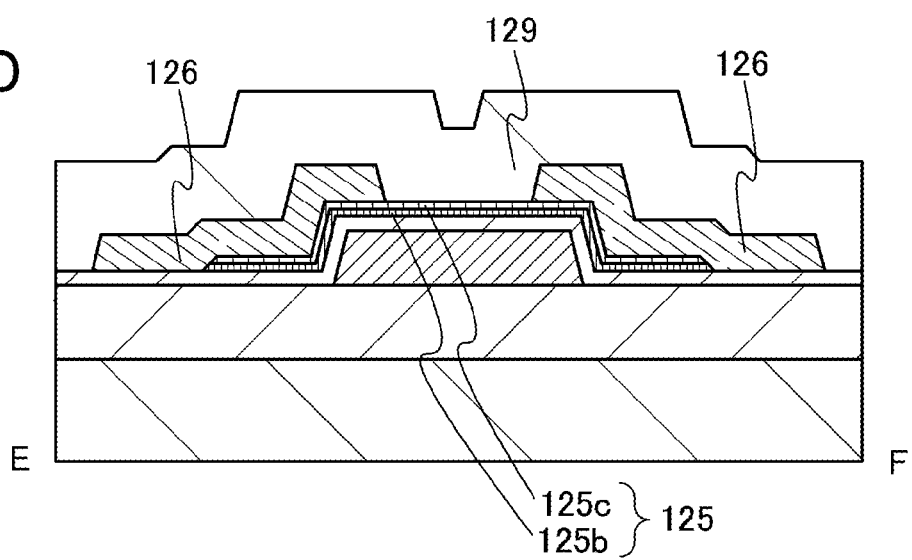

Next, the insulating film 129 may be formed over the gate insulating film 127, the pair of electrodes 126, and the oxide semiconductor stack 125 (see FIG. 14D).

The insulating film 129 can be formed as appropriate by using a material and a formation method which are similar to those of the insulating film 109 described in Embodiment 1.

Through the above steps, a transistor whose channel region includes an oxide semiconductor stack including a crystal region which has hexagonal bonds in the a-b plane and a c-axis-aligned trigonal and/or hexagonal structure can be manufactured.

Note that a channel-etched transistor is described in this embodiment; however, this embodiment can be applied to a channel protective transistor.

The oxide semiconductor stack has high crystallinity and evenness in a region in the vicinity of the interface with the gate insulating film and thus has stable electric characteristics; accordingly, a highly reliable transistor can be obtained. The oxide semiconductor stack including crystal which has hexagonal bonds in the a-b plane and a c-axis-aligned trigonal and/or hexagonal structure is used for a channel region of a transistor, whereby a transistor in which the amount of change in the threshold voltage between before and after light irradiation or a bias-temperature stress (BT) test performed on the transistor is small and which has stable electric characteristics can be manufactured.

Note that an oxynitride semiconductor has a smaller energy gap than an oxide semiconductor, and thus carriers easily flow therein. Therefore, by forming the oxide semiconductor film 125b having the first crystal structure, which is in contact with the gate insulating film 127, with the use of an oxynitride semiconductor film, a transistor having favorable electric characteristics can be manufactured.

Note that this embodiment can be combined with any of the other embodiments as appropriate.

(Embodiment 6)

Figure 15A:
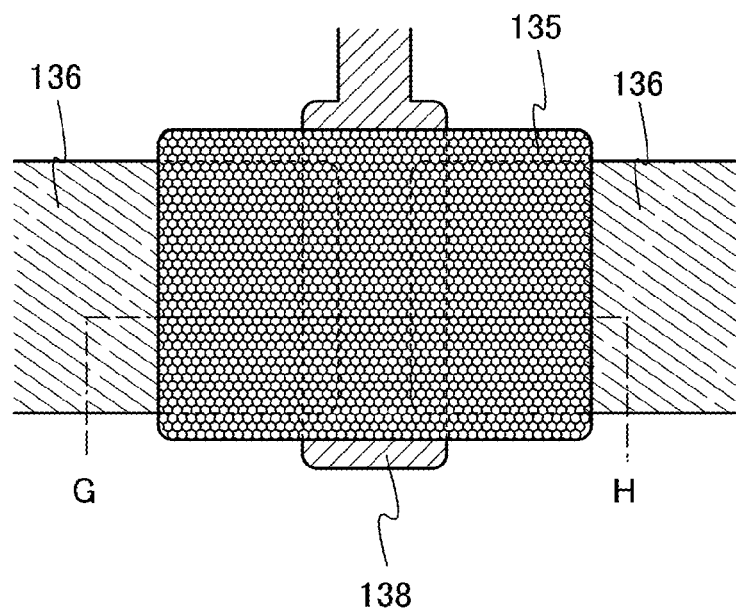
FIGS. 15A and 15B are a top view and a cross-sectional view, respectively, illustrating a semiconductor device which is one embodiment of the present invention.

In this embodiment, a structure of a transistor which is different from the structures of the transistors in Embodiments 1 to 5 and a manufacturing method thereof will be described with reference to FIGS. 15A and 15B and FIGS. 16A to 16D. In this embodiment, a bottom-gate transistor will be described. The transistor is different from that in Embodiment 5 in that a pair of electrodes is provided between a gate insulating film and an oxide semiconductor stack. Note that FIG. 15B corresponds to a cross-sectional view along dashed-dotted line G-H in FIG. 15A which is a top view. In FIG. 15A, the substrate 101, the oxide insulating film 102, a gate insulating film 137, and an insulating film 139 are not illustrated. FIGS. 16A to 16D are cross-sectional views illustrating a manufacturing process of the transistor illustrated in FIG. 15B.

Figure 15B:
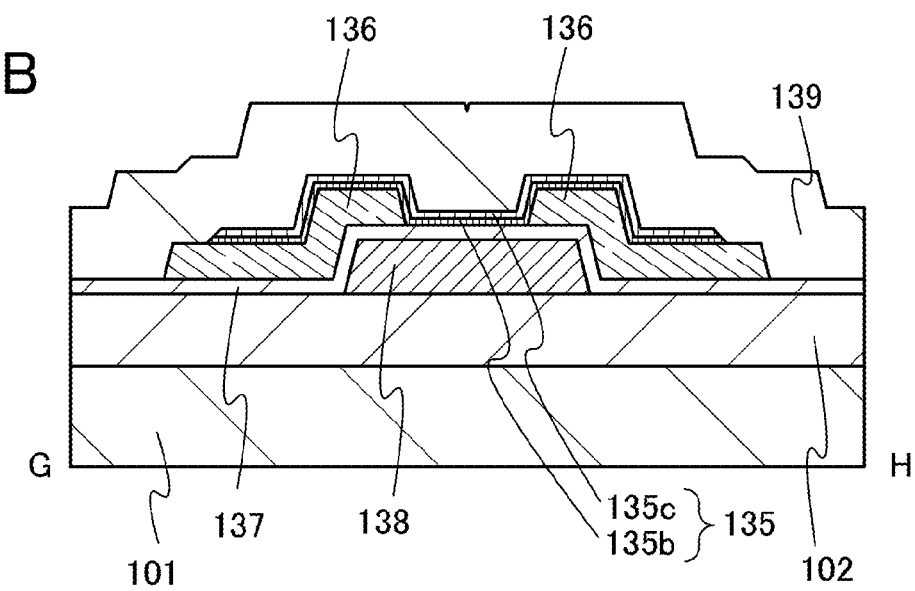

The transistor illustrated in FIG. 15B includes the oxide insulating film 102 formed over the substrate 101; a gate electrode 138 formed over the oxide insulating film 102; the gate insulating film 137 which covers the oxide insulating film 102 and the gate electrode 138; a pair of electrodes 136 which functions as a source electrode and a drain electrode; and an oxide semiconductor stack 135 which is in contact with the gate insulating film 137 and the pair of electrodes 136. Further, the insulating film 139 which covers the gate insulating film 137, the oxide semiconductor stack 135, and the pair of electrodes 136 may be provided.

The oxide semiconductor stack 135 is characterized in that an oxide semiconductor film 135b having a first crystal structure, which is in contact with the gate insulating film 137, and an oxide semiconductor film 135c having a second crystal structure, which is in contact with the oxide semiconductor film 135b having the first crystal structure, are stacked.

Further, the oxide semiconductor stack 135 is characterized in that crystal growth has occurred in the oxide semiconductor film 135c having the second crystal structure with the use of the oxide semiconductor film 135b having the first crystal structure as seed crystal.

The oxide semiconductor film 135b having the first crystal structure has a wurtzite crystal structure which is one of trigonal and/or hexagonal crystal structures.

The oxide semiconductor film 135c having the second crystal structure includes trigonal and/or hexagonal crystal and has any one crystal structure of a $YbFe_2O_4$ structure, a $Yb_2Fe_3O_7$ structure, and a non-wurtzite structure.

Since both the oxide semiconductor film having the first crystal structure and the oxide semiconductor film having the second crystal structure include trigonal and/or hexagonal crystal, a hexagonal lattice image can be observed from the c-axis direction.

Each of the oxide semiconductor film 135b having the first crystal structure and the oxide semiconductor film 135c having the second crystal structure is non-single-crystal, is not entirely in an amorphous state, and includes a c-axis-aligned crystal region. That is, each of the oxide semiconductor films has an amorphous region and a c-axis-aligned crystal region.

Note that the oxide semiconductor stack 135 has a two-layer structure including the oxide semiconductor film 135b having the first crystal structure and the oxide semiconductor film 135c having the second crystal structure, here; however, a three-layer oxide semiconductor stack may be formed as in Embodiments 3 and 4.

Next, a method for manufacturing the transistor in FIG. 15B will be described with reference to FIGS. 16A to 16D.

Figure 16A:
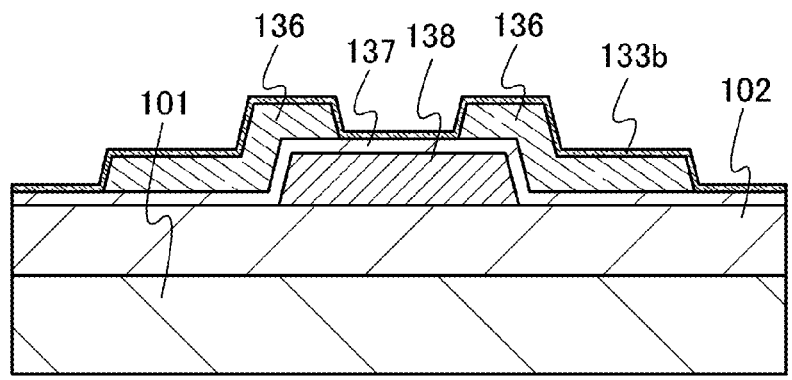
FIGS. 16A to 16D are cross-sectional views illustrating a method for manufacturing a semiconductor device which is one embodiment of the present invention.

As illustrated in FIG. 16A, the oxide insulating film 102 is formed over the substrate 101 as in Embodiment 1. Next, the gate electrode 138 is formed over the oxide insulating film 102. Then, the gate insulating film 137 is formed over the oxide insulating film 102 and the gate electrode 138. After that, the pair of electrodes 136 is formed over the gate insulating film 137. Then, a first oxide semiconductor film 133b is formed over the gate insulating film 137 and the pair of electrodes 136.

The gate electrode 138, the gate insulating film 137, and the first oxide semiconductor film 133b can be formed as appropriate by using materials and formation methods which are similar to those of the gate electrode 108, the gate insulating film 107, and the second oxide semiconductor film 103b described in Embodiment 3.

Next, in a manner similar to that in Embodiment 1, first heat treatment is performed. The first heat treatment allows crystal growth to begin from a surface of the first oxide semiconductor film 133b toward the gate insulating film 137, so that the first oxide semiconductor film 133b becomes an oxide semiconductor film 134b having the first crystal structure. The oxide semiconductor film 134b having the first crystal structure includes a c-axis-aligned crystal region.

Figure 16B:
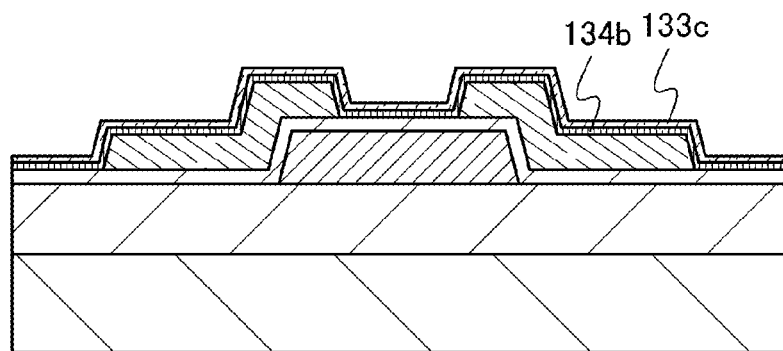
Figure 16C:
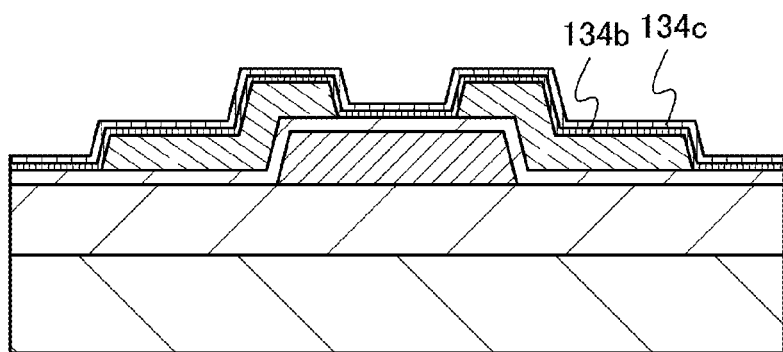

Next, a second oxide semiconductor film 133c is formed over the oxide semiconductor film 134b having the first crystal structure (see FIG. 16B). The second oxide semiconductor film 133c can be formed as appropriate by using a material and a formation method which are similar to those of the third oxide semiconductor film 103c described in Embodiment 3.

Next, in a manner similar to that in Embodiment 3, second heat treatment is performed. This heat treatment allows crystal growth to begin from the interface with the oxide semiconductor film 134b having the first crystal structure toward the second oxide semiconductor film 133c, so that the second oxide semiconductor film 133c becomes an oxide semiconductor film 134c having the second crystal structure. The oxide semiconductor film 134c having the second crystal structure includes a c-axis-aligned crystal region (see FIG. 16C).

Through the above steps, the oxide semiconductor film 134b having the first crystal structure and the oxide semiconductor film 134c having the second crystal structure can be formed.

Next, a mask is formed over the oxide semiconductor film 134c having the second crystal structure, and then the oxide semiconductor film 134*b* having the first crystal structure and the oxide semiconductor film 134*c* having the second crystal structure are selectively etched using the mask, so that the oxide semiconductor film 135*b* having the first crystal structure and the oxide semiconductor film 135*c* having the second crystal structure are formed. Note that the oxide semiconductor film 135*b* having the first crystal structure and the oxide semiconductor film 135*c* having the second crystal structure are collectively referred to as the oxide semiconductor stack 135. After that, the mask is removed.

Figure 16D:
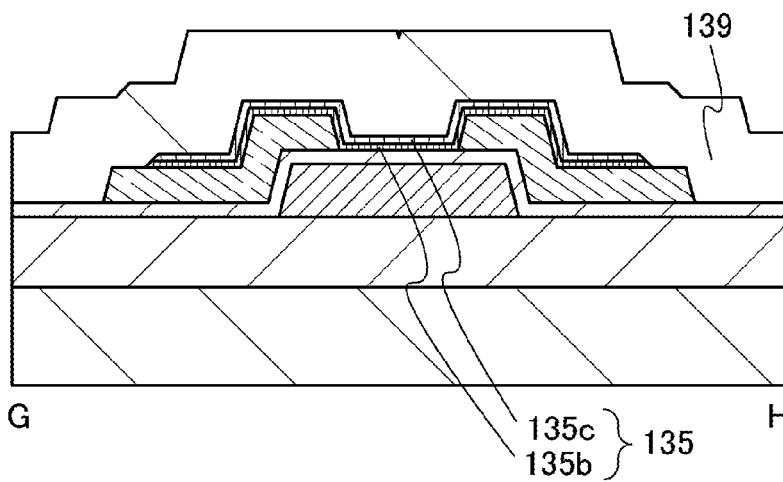

Next, the insulating film 139 may be formed over the oxide insulating film 102, the pair of electrodes 136, and the oxide semiconductor stack 135 (see FIG. 16D).

The insulating film 139 can be formed as appropriate by using a material and a formation method which are similar to those of the insulating film 109 described in Embodiment 3.

Through the above steps, a transistor whose channel region includes an oxide semiconductor stack including crystal which has hexagonal bonds in the a-b plane and a c-axis-aligned trigonal and/or hexagonal structure can be manufactured.

Note that a channel-etched transistor is described in this embodiment; however, this embodiment can be applied to a channel protective transistor.

The oxide semiconductor stack has high crystallinity and evenness in a region in the vicinity of the interface with the gate insulating film and thus has stable electric characteristics; accordingly, a highly reliable transistor can be obtained. The oxide semiconductor stack including a crystal region which has hexagonal bonds in the a-b plane and a c-axis-aligned trigonal and/or hexagonal structure is used for a channel region of a transistor, whereby a transistor in which the amount of change in the threshold voltage between before and after light irradiation or a bias-temperature stress (BT) test performed on the transistor is small and which has stable electric characteristics can be manufactured.

Note that this embodiment can be combined with any of the other embodiments as appropriate.

(Embodiment 7)

In this embodiment, the case where the transistor described in any of Embodiments 1 to 6 has a plurality of gate electrodes will be described. Although the transistor described in Embodiment 5 is used in this embodiment, this embodiment can be applied to the transistors described in Embodiments 1 to 4 and Embodiment 6 as appropriate.

Figure 17:
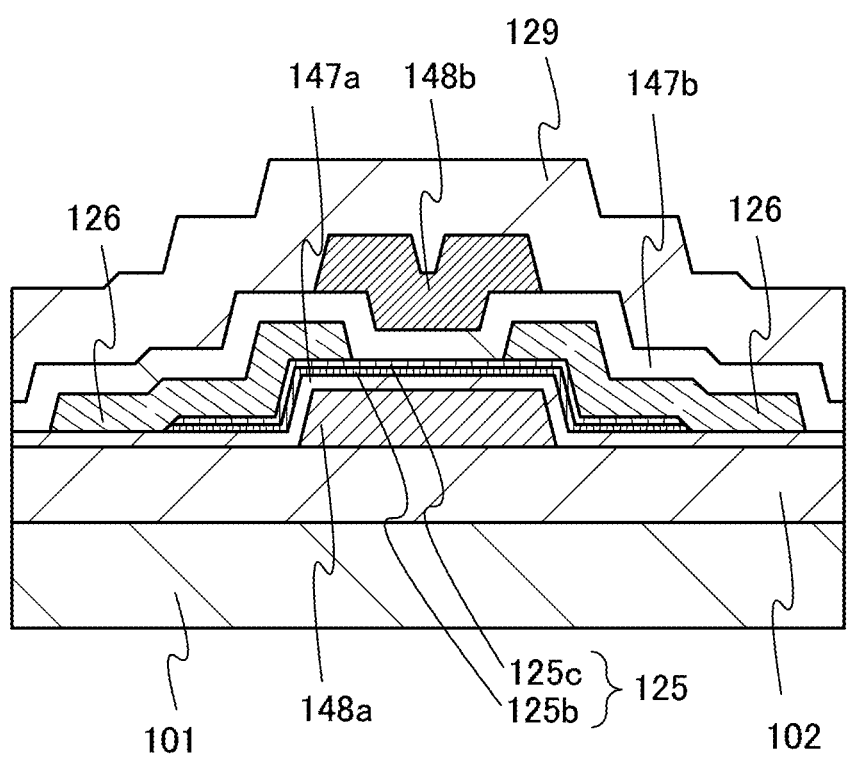
FIG. 17 is a cross-sectional view illustrating a semiconductor device which is one embodiment of the present invention.

In a manner similar to that in Embodiment 5, the oxide insulating film 102 is formed over the substrate 101, and a first gate electrode 148*a* and a first gate insulating film 147*a* are formed over the oxide insulating film 102 as illustrated in FIG. 17. Then, the oxide semiconductor stack 125 in which the oxide semiconductor film 125*b* having a first crystal structure and the oxide semiconductor film 125*c* having a second crystal structure are stacked, the pair of electrodes 126, and a second gate insulating film 147*b* are formed over the first gate insulating film 147*a*.

Next, a second gate electrode 148*b* is formed over the second gate insulating film 147*b* in a region overlapping with the oxide semiconductor stack 125. The insulating film 129 may be formed over the second gate insulating film 147*b* and the second gate electrode 148*b* as a protective film.

The first gate electrode 148*a* and the second gate electrode 148*b* can be formed in a manner similar to that of the gate electrode 108 described in Embodiment 1.

The first gate insulating film 147*a* and the second gate insulating film 147*b* can be formed in a manner similar to that of the gate insulating film 107 described in Embodiment 1.

The first gate electrode 148*a* and the second gate electrode 148*b* may be connected. In this case, the first gate electrode 148*a* and the second gate electrode 148*b* have the same potential and channel regions are formed on the first gate electrode 148*a* side and the second gate electrode 148*b* side of the oxide semiconductor stack 125, and thereby the on-state current and field effect mobility of the transistor can be increased.

Alternatively, it is also possible that the first gate electrode 148*a* and the second gate electrode 148*b* are not connected and supplied with different potentials. In this case, the threshold voltage of the transistor can be controlled.

In this embodiment, the pair of electrodes 126 is formed between the oxide semiconductor stack 125 and the second gate insulating film 147*b*, but the pair of electrodes 126 may be formed between the first gate insulating film 147*a* and the oxide semiconductor stack 125.

Through the above steps, a transistor having a plurality of gate electrodes can be manufactured.

(Embodiment 8)

In this embodiment, an embodiment will be described below, in which a display device including at least part of a driver circuit and a transistor disposed in a pixel portion are provided over one substrate is manufactured.

A transistor disposed in the pixel portion is formed in accordance with any of Embodiments 1 to 7. Further, the transistor described in any of Embodiments 1 to 7 is an n-channel transistor, and thus part of a driver circuit that can be formed using n-channel transistors among driver circuits is formed over the same substrate as the transistor in the pixel portion.

Figure 18A:
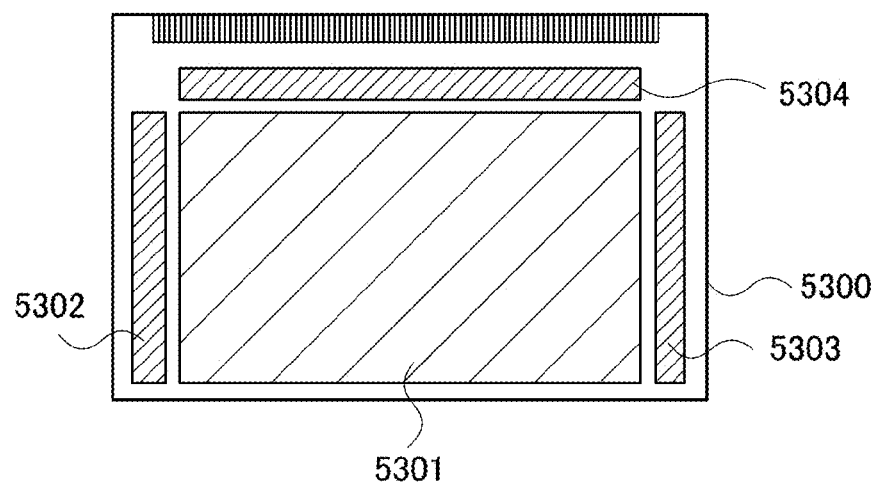
FIGS. 18A to 18C are a block diagram and circuit diagrams illustrating one embodiment of the present invention.

FIG. 18A is one embodiment of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are provided in a matrix form in respective regions where the scan lines and the signal lines intersect with each other. Further, the substrate 5300 in the display device is connected to a timing control circuit (also referred to as a controller or a controller IC) through a connection portion such as a flexible printed circuit (FPC).

In FIG. 18A, the first scan line driver circuit 5302, the second scan line driver circuit 5303, and the signal line driver circuit 5304 are formed over the same substrate 5300 as the pixel portion 5301. Accordingly, the number of components of a driver circuit and the like provided outside is reduced, so that reduction in cost can be achieved.

Further, if the driver circuit is provided outside the substrate 5300, wirings would need to be extended and the number of wiring connections would be increased. However, if the driver circuit is provided over the substrate 5300, the number of wiring connections can be reduced. Consequently, improvement in reliability and yield can be achieved.

Figure 18B:
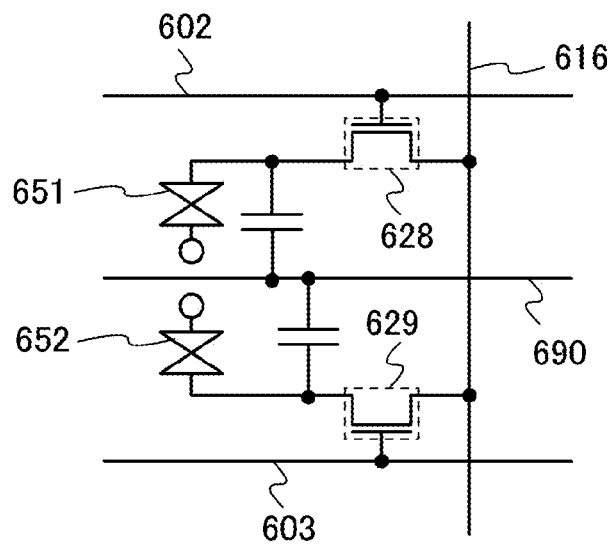

FIG. 18B illustrates one embodiment of a circuit configuration of the pixel portion. Here, a pixel structure of a VA liquid crystal display panel is shown.

In this pixel structure, a plurality of pixel electrodes is included in one pixel, and a transistor is connected to each of the pixel electrodes. The transistors are driven by different gate signals. That is, signals that are supplied to individual pixel electrodes in a multi-domain pixel are controlled independently.

A gate wiring 602 of a transistor 628 and a gate wiring 603 of a transistor 629 are separated so that different gate signals can be supplied thereto. In contrast, a source or drain electrode 616 functioning as a data line is used in common for the transistor 628 and the transistor 629. As each of the transistors 628 and 629, any of the transistors described in Embodiments 1 to 7 can be used as appropriate.

A first pixel electrode and a second pixel electrode have different shapes and are separated by a slit. The second pixel electrode is provided so as to surround the external side of the first pixel electrode which is spread in a V shape. Timings of voltage application are varied between the first pixel electrode and the second pixel electrode by the transistor 628 and the transistor 629 in order to control alignment of liquid crystal. The transistor 628 is connected to the gate wiring 602, and the transistor 629 is connected to the gate wiring 603. When different gate signals are supplied to the gate wiring 602 and the gate wiring 603, operation timings of the transistor 628 and the transistor 629 can be varied.

Further, a storage capacitor is formed using a capacitor wiring 690, a gate insulating film as a dielectric, and a capacitor electrode electrically connected to the first pixel electrode or the second pixel electrode.

The first pixel electrode, a liquid crystal layer, and a counter electrode overlap with each other to form a first liquid crystal element 651. The second pixel electrode, the liquid crystal layer, and the counter electrode overlap with each other to form a second liquid crystal element 652. The pixel structure is a multi-domain structure in which the first liquid crystal element 651 and the second liquid crystal element 652 are provided in one pixel.

Note that the pixel structure is not limited to that illustrated in FIG. 18B. For example, a switch, a resistor, a capacitor, a transistor, a sensor, or a logic circuit may be added to the pixel illustrated in FIG. 18B.

In this embodiment, an embodiment of a VA liquid crystal display panel is shown; however, one embodiment of the present invention is not particularly limited thereto and can be applied to various modes of liquid crystal display devices. For example, as a method for improving viewing angle characteristics, one embodiment of the present invention can be applied to a lateral electric field mode (also referred to as an IPS mode) in which an electric field in the horizontal direction to the main surface of a substrate is applied to a liquid crystal layer.

For example, it is preferable to use liquid crystal exhibiting a blue phase for which an alignment film is not necessary for an IPS liquid crystal display panel. A blue phase is one of liquid crystal phases, which appears just before a cholesteric phase changes into an isotropic phase while temperature of cholesteric liquid crystal is increased. Since the blue phase appears only in a narrow temperature range, a liquid crystal composition in which a chiral agent is mixed is used for the liquid crystal layer of the liquid crystal element in order to improve the temperature range. The liquid crystal composition which includes liquid crystal exhibiting a blue phase and a chiral agent has a short response time of 1 millisecond or less, and has optical isotropy, which makes the alignment process unneeded and viewing angle dependence small.

Further, in order to improve moving-image characteristics of a liquid crystal display device, a driving technique (e.g., a field sequential method) may be employed, in which a plurality of light-emitting diodes (LEDs) or a plurality of EL light sources is used as a backlight to form a surface light source, and each light source of the surface light source is independently driven in a pulsed manner in one frame period. As the surface light source, three or more kinds of LEDs may be used or an LED emitting white light may be used. In the case where three or more kinds of light sources emitting different colors (e.g., light sources of red (R), green (G), and blue (B)) are used as the surface light source, color display can be performed without a color filter. Further, in the case where an LED emitting white light is used as the surface light source, color display is performed with a color filter. Since a plurality of LEDs can be controlled independently, the light emission timing of LEDs can be synchronized with the timing at which the liquid crystal layer is optically modulated. The LEDs can be partly turned off, and thus power consumption can be reduced particularly in the case of displaying an image in which a black display region occupies a large area in one screen.

Figure 18C:
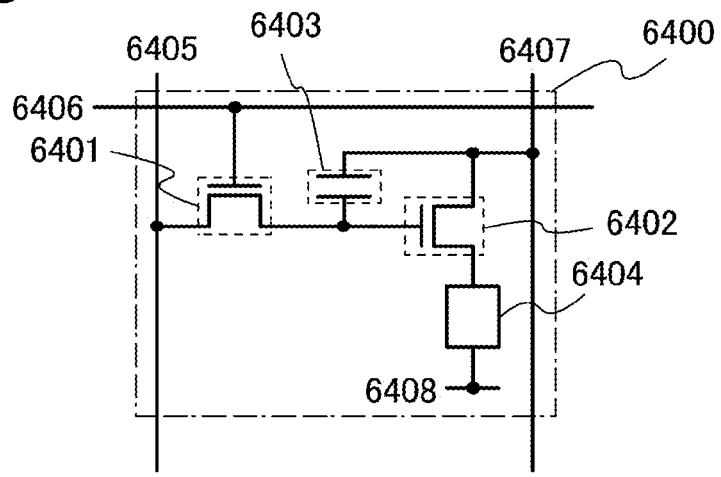

FIG. 18C illustrates one embodiment of a circuit configuration of the pixel portion. Here, a pixel structure of a display panel using an organic EL element is shown.

In an organic EL element, by application of voltage to a light-emitting element, electrons and holes are separately injected from a pair of electrodes into a film containing a light-emitting organic compound, and thus current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as a current-excitation light-emitting element.

FIG. 18C illustrates one embodiment of a pixel structure to which digital time grayscale driving can be applied, as an embodiment of a semiconductor device.

A structure and operation of a pixel to which digital time grayscale driving can be applied will be described. An embodiment is described in this embodiment, in which one pixel includes two n-channel transistors using an oxide semiconductor film in a channel region.

A pixel 6400 includes a switching transistor 6401, a driving transistor 6402, a light-emitting element 6404, and a capacitor 6403. A gate electrode of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate electrode of the driving transistor 6402. The gate electrode of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is a potential satisfying the relation, the low power supply potential<a high power supply potential with reference to the high power supply potential that is supplied to the power supply line 6407. As the low power supply potential, GND or 0 V may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is higher than or equal to forward threshold voltage of the light-emitting element 6404.

Note that gate capacitance of the driving transistor 6402 may be used as a substitute for the capacitor 6403, so that the capacitor 6403 can be omitted. The gate capacitance of the driving transistor 6402 may be formed between the channel region and the gate electrode.

In the case of a voltage-input voltage driving method, a video signal is input to the gate electrode of the driving transistor 6402 so that the driving transistor 6402 is either sufficiently turned on or sufficiently turned off. That is, the driving transistor 6402 operates in a linear region, and thus voltage higher than the voltage of the power supply line 6407 is applied to the gate electrode of the driving transistor 6402. Note that voltage higher than or equal to (voltage of the power supply line+Vth of the driving transistor 6402) is applied to the signal line 6405.

In the case of performing analog grayscale driving instead of digital time grayscale driving, the same pixel structure as FIG. 18C can be used by changing signal input.

In the case of performing analog grayscale driving, voltage higher than or equal to the sum of the forward voltage of the light-emitting element 6404 and Vth of the driving transistor 6402 is applied to the gate electrode of the driving transistor 6402. The forward voltage of the light-emitting element 6404 indicates voltage at which a desired luminance is obtained, and includes at least forward threshold voltage. By inputting a video signal which enables the driving transistor 6402 to operate in a saturation region, current can be supplied to the light-emitting element 6404. In order for the driving transistor 6402 to operate in the saturation region, the potential of the power supply line 6407 is set to be higher than the gate potential of the driving transistor 6402. When an analog video signal is used, it is possible to feed current to the light-emitting element 6404 in accordance with the video signal and perform analog grayscale driving.

Note that the pixel structure is not limited to that illustrated in FIG. 18C. For example, a switch, a resistor, a capacitor, a sensor, a transistor, or a logic circuit may be added to the pixel illustrated in FIG. 18C.

Next, structures of a light-emitting element will be described with reference to cross-sectional structures of a pixel, which are illustrated in FIGS. 19A to 19C. Here, cross-sectional structures of a pixel will be described by taking the case where a light-emitting element driving transistor is an n-channel transistor as an example. Light-emitting element driving transistors 7011, 7021, and 7001 which are used for semiconductor devices illustrated in FIGS. 19A to 19C can be manufactured in a manner similar to that of the transistor described in any of Embodiments 1 to 7.

At least one of a first electrode and a second electrode of the light-emitting element is formed using a conductive film that transmits visible light, and light emission is extracted from the light-emitting element. When attention is focused on the direction from which light emission is extracted, the following structures can be given: a top emission structure in which light emission is extracted from the side of a substrate on which a light-emitting element is formed without passing through the substrate over which the light-emitting element and a transistor are formed; a bottom emission structure in which light emission is extracted from the side where the light-emitting element is not formed through the substrate over which the light-emitting element is formed; and a dual emission structure in which light emission is extracted from both the side of the substrate on which the light-emitting element is formed and the other side of the substrate through the substrate. The pixel configuration illustrated in FIG. 18C can be applied to a light-emitting element having any of these emission structures.

A light-emitting element having a bottom emission structure will be described with reference to FIG. 19A. The light-emitting element having a bottom emission structure emits light in the direction indicated by an arrow in FIG. 19A.

In FIG. 19A, an embodiment in which the n-channel transistor described in Embodiment 1 is used as the light-emitting element driving transistor 7011 is shown; however, one embodiment of the present invention is not particularly limited thereto.

In FIG. 19A, an EL layer 7014 and a second electrode 7015 are stacked in this order over a first electrode 7017 having a light-transmitting property, which is electrically connected to a source electrode or a drain electrode of the light-emitting element driving transistor 7011.

The first electrode 7017 is formed using a conductive film that transmits visible light. For the conductive film that transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used. Further, a metal thin film having a thickness large enough to transmit light (preferably approximately 5 nm to 30 nm) can also be used. For example, an aluminum film with a thickness of 20 nm can be stacked over another conductive film having a light-transmitting property.

As for the second electrode 7015, a material which efficiently reflects light emitted from the EL layer 7014 is preferably used, in which case the light extraction efficiency can be improved. Note that the second electrode 7015 may have a stacked-layer structure. For example, a conductive film that transmits visible light, which is formed on the side in contact with the EL layer 7014, and a light-blocking film 7016 may be stacked. As the light-blocking film, although a metal film or the like which efficiently reflects light emitted from the EL layer is preferable, a resin or the like to which a black pigment is added can also be used, for example.

Note that one of the first electrode 7017 and the second electrode 7015 functions as an anode, and the other functions as a cathode. It is preferable to use a substance having a high work function for the electrode which functions as an anode, and a substance having a low work function for the electrode which functions as a cathode.

As a material having a high work function, for example, ZrN, Ti, W, Ni, Pt, Cr, ITO, or In—Zn—O can be used. As a material having a low work function, an alkali metal such as Li or Cs, an alkaline earth metal such as Mg, Ca, or Sr, an alloy containing any of these (such as Mg:Ag or Al:Li), a rare earth metal such as Yb or Er, or the like can be used.

Note that when power consumption is compared, it is preferable that the first electrode 7017 function as a cathode and the second electrode 7015 function as an anode because increase in voltage of a driver circuit portion can be suppressed and power consumption can be reduced.

The EL layer 7014 includes at least a light-emitting layer and may be either a single layer or a stack of plural layers. As the structure in which a plurality of layers is stacked, a structure in which an anode, a hole-injection layer, a hole-transport layer, a light-emitting layer, an electron-transport layer, and an electron-injection layer are stacked in this order can be given as an embodiment. Note that not all of these layers are necessarily provided in the EL layer 7014, and each of these layers may be provided in duplicate or more. Furthermore, another component such as an electron-relay layer may be added as appropriate as an intermediate layer, in addition to a charge generation layer.

A light-emitting element 7012 is provided with a partition wall 7019 which covers an edge of the first electrode 7017. As the partition wall 7019, an inorganic insulating film or an organic polysiloxane film can be applied in addition to an organic resin film of polyimide, acrylic, polyamide, epoxy, or the like. It is particularly preferable that the partition wall 7019 be formed using a photosensitive resin material so that a side surface of the partition wall 7019 is formed as a tilted surface with a continuous curvature. In the case where a photosensitive resin material is used for the partition wall 7019, a step of forming a resist mask can be omitted. Further, the partition wall can be formed using an inorganic insulating film. When the inorganic insulating film is used for the partition wall, the amount of moisture included in the partition wall can be reduced.

Note that a color filter layer 7033 is provided between the light-emitting element 7012 and a substrate 7010 (see FIG. 19A). A structure for emitting white light is employed for the light-emitting element 7012, whereby light emitted from the light-emitting element 7012 passes through the color filter layer 7033 and then passes through an insulating film 7032, a gate insulating film 7031, an oxide insulating film 7030, and the substrate 7010 so as to be emitted to the outside.

Plural kinds of the color filter layer 7033 may be formed. For example, a red color filter layer, a blue color filter layer, a green color filter layer can be provided in respective pixels. Note that the color filter layer 7033 is formed by a droplet discharge method such as an inkjet method, a printing method, an etching method using a photolithography technique, or the like.

The color filter layer 7033 is covered with an overcoat layer 7034 and a protective insulating film 7035 is further formed thereover. Note that the overcoat layer 7034 having a small thickness is illustrated in FIG. 19A; the overcoat layer 7034 is formed using a resin material such as an acrylic resin and has a function of reducing unevenness due to the color filter layer 7033.

A contact hole which is formed in the insulating film 7032, the color filter layer 7033, the overcoat layer 7034, and the protective insulating film 7035 and reaches the drain electrode is in a position which overlaps with the partition wall 7019.

Next, a light-emitting element having a dual emission structure will be described with reference to FIG. 19B. The light-emitting element having a dual emission structure emits light in the directions indicated by arrows in FIG. 19B.

In FIG. 19B, an embodiment in which the n-channel transistor described in Embodiment 1 is used as the light-emitting element driving transistor 7021 is shown; however, one embodiment of the present invention is not particularly limited thereto.

In FIG. 19B, an EL layer 7024 and a second electrode 7025 are stacked in this order over a first electrode 7027 having a light-transmitting property, which is electrically connected to a source electrode or a drain electrode of the light-emitting element driving transistor 7021.

The first electrode 7027 and the second electrode 7025 are each formed using a conductive film that transmits visible light. The material which can be used for the first electrode 7017 in FIG. 19A can be used for the conductive film that transmits visible light. Thus, the description of the first electrode 7017 is referred to for the details.

Note that one of the first electrode 7027 and the second electrode 7025 functions as an anode, and the other functions as a cathode. It is preferable to use a substance having a high work function for the electrode which functions as an anode, and a substance having a low work function for the electrode which functions as a cathode.

The EL layer 7024 may be either a single layer or a stack of plural layers. As for the EL layer 7024, the structure and material which can be used for the EL layer 7014 in FIG. 19A can be used. Thus, the description of the EL layer 7014 is referred to for the details.

A light-emitting element 7022 is provided with a partition wall 7029 which covers an edge of the first electrode 7027. As for the partition wall 7029, the structure and material which can be used for the partition wall 7019 in FIG. 19A can be used. Thus, the description of the partition wall 7019 is referred to for the details.

In addition, in the element structure illustrated in FIG. 19B, light is emitted from the light-emitting element 7022 to both the second electrode 7025 side and the first electrode 7027 side as indicated by the arrows, and light emitted to the first electrode 7027 side passes through an insulating film 7042, a gate insulating film 7041, an oxide insulating film 7040, and a substrate 7020 so as to be emitted to the outside.

In the structure in FIG. 19B, for performing full-color display, the light-emitting element 7022, one of light-emitting elements adjacent to the light-emitting element 7022, and the other of the light-emitting elements are, for example, a green light-emitting element, a red light-emitting element, and a blue light-emitting element, respectively. Alternatively, a light-emitting display device capable of full color display may be manufactured using four kinds of light-emitting elements which include a white light-emitting element in addition to three kinds of light-emitting elements.

Next, a light-emitting element having a top emission structure will be described with reference to FIG. 19C. The light-emitting element having a top emission structure emits light in the direction indicated by arrows in FIG. 19C.

In FIG. 19C, an embodiment in which the n-channel transistor described in Embodiment 1 is used as the light-emitting element driving transistor 7001 is shown; however, one embodiment of the present invention is not particularly limited thereto.

In FIG. 19C, an EL layer 7004 and a second electrode 7005 are stacked in this order over a first electrode 7003 which is electrically connected to a source electrode or a drain electrode of the light-emitting element driving transistor 7001.

As for the first electrode 7003, a material which efficiently reflects light emitted from the EL layer 7004 is preferably used, in which case the light extraction efficiency can be improved. Note that the first electrode 7003 may have a stacked-layer structure. For example, a conductive film that transmits visible light, which is formed on the side in contact with the EL layer 7004, may be stacked over a light-blocking film. As the light-blocking film, although a metal film or the like which efficiently reflects light emitted from the EL layer is preferable, a resin or the like to which a black pigment is added can also be used, for example.

The second electrode 7005 is formed using a conductive film that transmits visible light. The material which can be used for the first electrode 7017 in FIG. 19A can be used for the conductive film that transmits visible light. Thus, the description of the first electrode 7017 is referred to for the details.

Note that one of the first electrode 7003 and the second electrode 7005 functions as an anode, and the other functions as a cathode. It is preferable to use a substance having a high work function for the electrode which functions as an anode, and a substance having a low work function for the electrode which functions as a cathode.

The EL layer 7004 may be either a single layer or a stack of plural layers. As for the EL layer 7004, the structure and material which can be used for the EL layer 7014 in FIG. 19A can be used. Thus, the description of the EL layer 7014 is referred to for the details.

A light-emitting element 7002 is provided with a partition wall 7009 which covers an edge of the first electrode 7003. As for the partition wall 7009, the structure and material which can be used for the partition wall 7019 in FIG. 19A can be used. Thus, the description of the partition wall 7019 is referred to for the details.

In FIG. 19C, the source electrode or the drain electrode of the light-emitting element driving transistor 7001 is electrically connected to the first electrode 7003 through a contact hole provided in a gate insulating film 7051, a protective insulating film 7052, and an insulating film 7055. A planarization insulating film 7053 can be formed using a resin material such as polyimide, acrylic, benzocyclobutene, polyamide, or epoxy. Other than such resin materials, a low-dielectric constant material (a low-k material), a siloxane-based resin, or the like can be used. Note that the planarization insulating film 7053 may be formed by stacking a plurality of insulating films formed using these materials. There is no particular limitation on the method for forming the planarization insulating film 7053, and the planarization insulating film 7053 can be formed, depending on the material, by a sputtering method, an SOG method, spin coating, dip coating, spray coating, a droplet discharge method (such as an inkjet method, screen printing, or offset printing), or the like.

In the structure in FIG. 19C, for performing full-color display, the light-emitting element 7002, one of light-emitting elements adjacent to the light-emitting element 7002, and the other of the light-emitting elements are, for example, a green light-emitting element, a red light-emitting element, and a blue light-emitting element, respectively. Alternatively, a light-emitting display device capable of full color display may be manufactured using four kinds of light-emitting elements which include a white light-emitting element in addition to three kinds of light-emitting elements.

In the structure in FIG. 19C, a light-emitting display device capable of full color display may be manufactured in such a manner that all of a plurality of light-emitting elements which is arranged is white light-emitting elements and a sealing substrate having a color filter or the like is arranged over the light-emitting element 7002. When a material which exhibits a single color such as white is formed and combined with a color filter or a color conversion layer, full-color display can be performed.

Needless to say, display of single color light emission may also be performed. For example, a lighting device may be formed with the use of white light emission, or an area-color light-emitting device may be formed with the use of single color light emission.

If necessary, an optical film such as a polarizing film including a circularly polarizing plate may be provided.

Note that an example is described in which a transistor that controls the driving of a light-emitting element (a light-emitting element driving transistor) is electrically connected to the light-emitting element; however, a structure may be employed in which a current controlling transistor is connected between the light-emitting element driving transistor and the light-emitting element.

The semiconductor device described in this embodiment is not limited to the structures illustrated in FIGS. 19A to 19C and can be modified in various ways based on the spirit of techniques of the present invention.

(Embodiment 9)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone (also referred to as a cellular phone or a mobile phone device), a portable game machine, a portable information terminal, an audio reproducing device, and a large-sized game machine such as a pachinko machine. Embodiments of electronic devices each including the display device described in the above embodiment will be described.

Figure 20A:
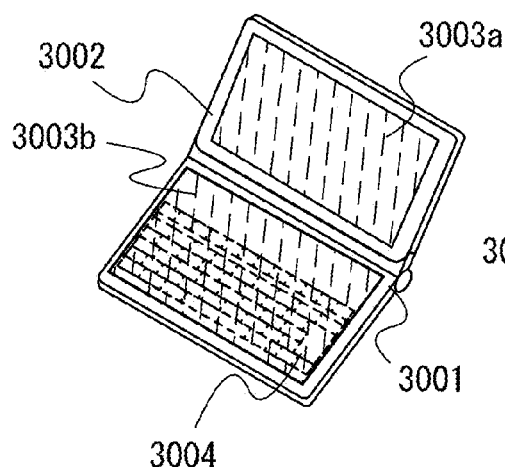
FIGS. 20A to 20D each illustrate one embodiment of an electronic device.

FIG. 20A illustrates a portable information terminal, which includes a main body 3001, a housing 3002, display portions 3003a and 3003b, and the like. The display portion 3003b is a panel having a touch-input function. By touching keyboard buttons 3004 displayed on the display portion 3003b, a screen can be operated and text can be input. Needless to say, the display portion 3003a may be a panel having a touch-input function. The liquid crystal panel or the organic light-emitting panel described in Embodiment 8 is manufactured using the transistor described in any of Embodiments 1 to 7 as a switching element and applied to the display portion 3003a or 3003b, whereby the portable information terminal can be obtained.

The portable information terminal illustrated in FIG. 20A can have a function of displaying various kinds of information (e.g., a still image, a moving image, and a text image); a function of displaying a calendar, the date, the time, and the like on the display portion; a function of operating or editing the information displayed on the display portion; a function of controlling processing by various kinds of software (programs); and the like. Furthermore, an external connection terminal (such as an earphone terminal or a USB terminal), a storage medium insertion portion, and the like may be provided on the back surface or the side surface of the housing.

The portable information terminal illustrated in FIG. 20A may transmit and receive data wirelessly. Through wireless communication, desired book data or the like can be purchased and downloaded from an electronic book server.

Figure 20B:
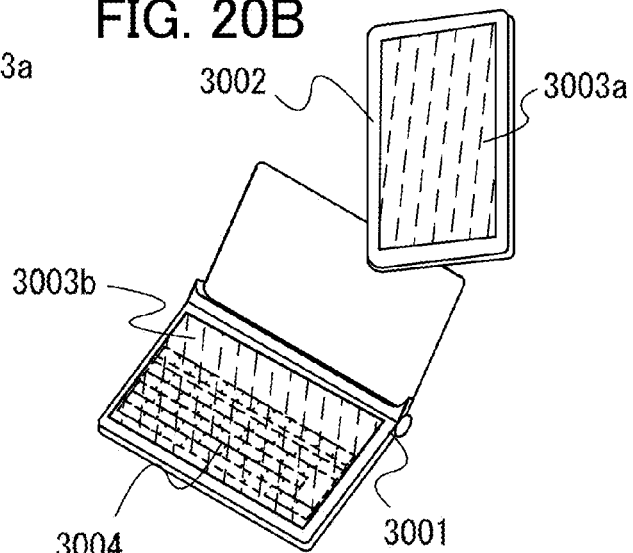

Further, one of the two display portions 3003a and 3003b of the portable information terminal illustrated in FIG. 20A can be detached as shown in FIG. 20B. The display portion 3003a can be a panel having a touch-input function, which contributes to further reduction in weight when it is carried around and to the convenience since operation can be performed by one hand with the housing 3002 supported by the other hand.

Further, the housing 3002 illustrated in FIG. 20B may be equipped with an antenna, a microphone function, or a wireless communication function to be used as a mobile phone.

Figure 20C:
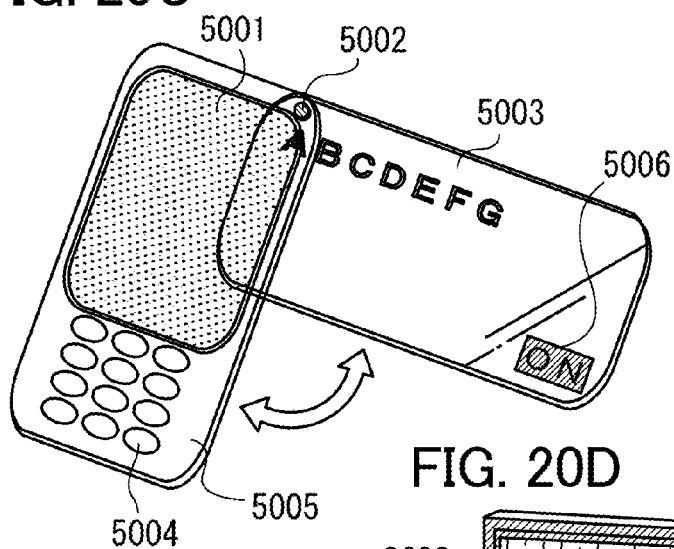

FIG. 20C illustrates an embodiment of a mobile phone. A mobile phone 5005 illustrated in FIG. 20C is provided with a display portion 5001 incorporated in a housing, a display panel 5003 attached to a hinge 5002, operation buttons 5004, a speaker, a microphone, and the like.

In the mobile phone 5005 illustrated in FIG. 20C, the display panel 5003 is slid to overlap with the display portion 5001, and the display panel 5003 also functions as a cover having a light-transmitting property. The display panel 5003 is a display panel including the light-emitting element having a dual emission structure illustrated in FIG. 19B in Embodiment 8, in which light emission is extracted through the surface opposite to the substrate side and the surface on the substrate side.

Since the light-emitting element having a dual emission structure is used for the display panel 5003, display can also be performed with the display portion 5001 overlapped; therefore, both the display portion 5001 and the display panel 5003 can perform display and a user can view both the displays. The display panel 5003 has a light-transmitting property and the view beyond the display panel can be seen. For example, when a map is displayed on the display portion 5001 and the location point of the user is displayed using the display panel 5003, the present location can be recognized easily.

Further, in the case where the mobile phone 5005 is provided with an image sensor to be used as a television telephone, it is possible to make conversation with plural persons while their faces are displayed; therefore, a television conference or the like can be performed. For example, when the face of a single person or the faces of plural persons are displayed on the display panel 5003 and further the face of another person is displayed on the display portion 5001, the user can make conversation while viewing the faces of two or more persons.

When a touch input button 5006 displayed on the display panel 5003 is touched with a finger or the like, data can be input into the mobile phone 5005. In addition, operations such as making calls and composing mails can be conducted by sliding the display panel 5003 and touching the operation buttons 5004 with a finger or the like.

Figure 20D:
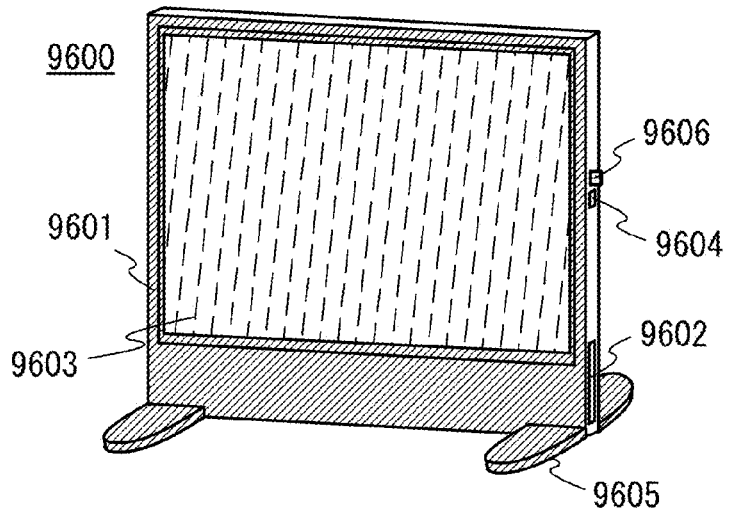

FIG. 20D illustrates an embodiment of a television set 9600. In the television set 9600, a display portion 9603 is incorporated in a housing 9601. The display portion 9603 can display images. Here, the housing 9601 is supported on a stand 9605 provided with a CPU. When the transistor described in any of Embodiments 1 to 7 is applied to the display portion 9603, the television set 9600 can be obtained.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the television set is connected to a communication network with or without wires via the modem, one-way (from a transmitter to a receiver) or two-way (between a transmitter and a receiver, between receivers, or the like) data communication can be performed.

Further, the television set 9600 is provided with an external connection terminal 9604, a storage medium recording and reproducing portion 9602, and an external memory slot. The external connection terminal 9604 can be connected to various types of cables such as a USB cable, and data communication with a personal computer or the like is possible. A disk storage medium can be inserted into the storage medium recording and reproducing portion 9602, and reading data stored in the storage medium and writing data into the storage medium can be performed. In addition, a picture, a video, or the like stored as data in an external memory 9606 inserted into the external memory slot can be displayed on the display portion 9603.

The methods, structures, and the like described in this embodiment can be combined as appropriate with any of the methods, structures, and the like described in the other embodiments.

EXPLANATION OF REFERENCE

101: substrate, 102: oxide insulating film, 103a: oxide semiconductor film, 103b: oxide semiconductor film, 103c: oxide semiconductor film, 104a: oxide semiconductor film, 104b: oxide semiconductor film, 104c: oxide semiconductor film, 105: oxide semiconductor stack, 105a: oxide semiconductor film, 105b: oxide semiconductor film, 105c: oxide semiconductor film, 106: electrode, 107: gate insulating film, 108: gate electrode, 109: insulating film, 113a: oxide semiconductor film, 113b: oxide semiconductor film, 113c: oxide semiconductor film, 114a: oxide semiconductor film, 114b: oxide semiconductor film, 114c: oxide semiconductor film, 115: oxide semiconductor stack, 115a: oxide semiconductor film, 115b: oxide semiconductor film, 115c: oxide semiconductor film, 116: electrode, 117: gate insulating film, 118: gate electrode, 119: insulating film, 120: wiring, 123b: oxide semiconductor film, 123c: oxide semiconductor film, 124b: oxide semiconductor film, 124c: oxide semiconductor film, 125: oxide semiconductor stack, 125b: oxide semiconductor film, 125c: oxide semiconductor film, 126: electrode, 127: gate insulating film, 128: gate electrode, 129: insulating film, 133b: oxide semiconductor film, 133c: oxide semiconductor film, 134b: oxide semiconductor film, 134c: oxide semiconductor film, 135: oxide semiconductor stack, 135b: oxide semiconductor film, 135c: oxide semiconductor film, 136: electrode, 137: gate insulating film, 138: gate electrode, 139: insulating film, 147a: gate insulating film, 147b: gate insulating film, 148a: gate electrode, 148b: gate electrode, 602: gate wiring, 603: gate wiring, 616: source or drain electrode, 628: transistor, 629: transistor, 651: liquid crystal element, 652: liquid crystal element, 690: capacitor wiring, 2000: crystal structure, 2001: crystal structure, 3001: main body, 3002: housing, 3003a: display portion, 3003b: display portion, 3004: keyboard button, 5001: display portion, 5002: hinge, 5003: display panel, 5004: operation button, 5005: mobile phone, 5006: touch input button, 5300: substrate, 5301: pixel portion, 5302: scan line driver circuit, 5303: scan line driver circuit, 5304: signal line driver circuit, 6400: pixel, 6401: switching transistor, 6402: driving transistor, 6403: capacitor, 6404: light-emitting element, 6405: signal line, 6406: scan line, 6407: power supply line, 6408: common electrode, 7001: light-emitting element driving transistor, 7002: light-emitting element, 7003: electrode, 7004: EL layer, 7005: electrode, 7009: partition wall, 7010: substrate, 7011: light-emitting element driving transistor, 7012: light-emitting element, 7014: EL layer, 7015: electrode, 7016:

film, 7017: electrode, 7019: partition wall, 7020: substrate, 7021: light-emitting element driving transistor, 7022: light-emitting element, 7024: EL layer, 7025: electrode, 7027: electrode, 7029: partition wall, 7030: oxide insulating film, 7031: gate insulating film, 7032: insulating film, 7033: color filter layer, 7034: overcoat layer, 7035: protective insulating film, 7040: oxide insulating film, 7041: gate insulating film, 7042: insulating film, 7051: gate insulating film, 7052: protective insulating film, 7053: planarization insulating film, 7055: insulating film, 9600: television set, 9601: housing, 9602: storage medium recording and reproducing portion, 9603: display portion, 9604: external connection terminal, 9605: stand, and 9606: external memory.

This application is based on Japanese Patent Application serial no. 2010-267901 filed with the Japan Patent Office on Nov. 30, 2010 and Japanese Patent Application serial no. 2010-267896 filed with the Japan Patent Office on Nov. 30, 2010, the entire contents of which are hereby incorporated by reference.

What is claimed is:

1. A semiconductor device comprising:
a first insulating film;
a second insulating film overlapping the first insulating film;
a stack of semiconductor films interposed between the first insulating film and the second insulating film, the stack of semiconductor films comprising:
a first oxide semiconductor film; and
a second oxide semiconductor film on and in contact with the first oxide semiconductor film; and
a gate electrode,
wherein the gate electrode and the stack of semiconductor films overlap, and
wherein a concentration in nitrogen of the first oxide semiconductor film is higher than a concentration in nitrogen of the second oxide semiconductor film.

2. The semiconductor device according to claim 1,
wherein a crystal structure of the second oxide semiconductor film is one of a $YbFe_2O_4$ structure, a $Yb_2Fe_3O_7$ structure, a deformed structure of a $YbFe_2O_4$ structure, and a deformed structure of a $Yb_2Fe_3O_7$.

3. The semiconductor device according to claim 1,
wherein a crystal structure of the second oxide semiconductor film is a wurtzite structure.

4. The semiconductor device according to claim 1,
wherein the second oxide semiconductor film contains nitrogen at a concentration higher than or equal to $1\times10^{17}/cm^3$ and lower than $5\times10^{19}/cm^3$ in a channel region.

5. The semiconductor device according to claim 1,
wherein the first oxide semiconductor film contains nitrogen at a concentration higher than or equal to $5\times10^{19}/cm^3$, and lower than 7 at. % in a channel region.

6. The semiconductor device according to claim 5,
wherein the concentration is higher than or equal to $1\times10^{20}/cm^3$.

7. The semiconductor device according to claim 1,
wherein the first oxide semiconductor film is non-single-crystal and comprises an amorphous region and a crystal region having c-axis alignment.

8. The semiconductor device according to claim 1,
wherein the second oxide semiconductor film is non-single-crystal and comprises an amorphous region and a crystal region having c-axis alignment.

9. The semiconductor device according to claim 1,
wherein the first oxide semiconductor film and the second oxide semiconductor film are each non-single-crystal and comprise each an amorphous region and a crystal region having c-axis alignment.

10. A semiconductor device comprising:
a gate electrode;
a first insulating film over the gate electrode;
a second insulating film overlapping the first insulating film; and
a stack of semiconductor films interposed between the first insulating film and the second insulating film, the stack of semiconductor films comprising:
a first oxide semiconductor film; and
a second oxide semiconductor film on and in contact with the first oxide semiconductor film,
wherein the gate electrode and the stack of semiconductor films overlap, and
wherein a concentration in nitrogen of the first oxide semiconductor film is higher than a concentration in nitrogen of the second oxide semiconductor film.

11. The semiconductor device according to claim 10,
wherein a crystal structure of the second oxide semiconductor film is one of a $YbFe_2O_4$ structure, a $Yb_2Fe_3O_7$ structure, a deformed structure of a $YbFe_2O_4$ structure, and a deformed structure of a $Yb_2Fe_3O_7$.

12. The semiconductor device according to claim 10,
wherein a crystal structure of the second oxide semiconductor film is a wurtzite structure.

13. The semiconductor device according to claim 10,
wherein the second oxide semiconductor film contains nitrogen at a concentration higher than or equal to $1\times10^{17}/cm^3$ and lower than $5\times10^{19}/cm^3$ in a channel region.

14. The semiconductor device according to claim 10,
wherein the first oxide semiconductor film contains nitrogen at a concentration higher than or equal to $5\times10^{19}/cm^3$, and lower than 7 at. % in a channel region.

15. A semiconductor device comprising:
a first insulating film;
a second insulating film overlapping the first insulating film;
a gate electrode over the second insulating film; and
a stack of semiconductor films interposed between the first insulating film and the second insulating film, the stack of semiconductor films comprising:
a first oxide semiconductor film; and
a second oxide semiconductor film on and in contact with the first oxide semiconductor film,
wherein the gate electrode and the stack of semiconductor films overlap, and
wherein a concentration in nitrogen of the first oxide semiconductor film is higher than a concentration in nitrogen of the second oxide semiconductor film.

16. The semiconductor device according to claim 15,
wherein a crystal structure of the second oxide semiconductor film is one of a $YbFe_2O_4$ structure, a $Yb_2Fe_3O_7$ structure, a deformed structure of a $YbFe_2O_4$ structure, and a deformed structure of a $Yb_2Fe_3O_7$.

17. The semiconductor device according to claim 15,
wherein a crystal structure of the second oxide semiconductor film is a wurtzite structure.

18. The semiconductor device according to claim 15,
wherein the second oxide semiconductor film contains nitrogen at a concentration higher than or equal to $1\times10^{17}/cm^3$ and lower than $5\times10^{19}/cm^3$ in a channel region.

19. The semiconductor device according to claim 15, wherein the first oxide semiconductor film contains nitrogen at a concentration higher than or equal to $5 \times 10^{19}/\text{cm}^3$, and lower than 7 at. % in a channel region.

20. A semiconductor device comprising:
a first gate electrode,
a first insulating film over the first gate electrode;
a second insulating film overlapping the first insulating film;
a second gate electrode over the second insulating film; and
a stack of semiconductor films interposed between the first insulating film and the second insulating film, the stack of semiconductor films comprising:
  a first oxide semiconductor film; and
  a second oxide semiconductor film on and in contact with the first oxide semiconductor film,
wherein the first gate electrode, the stack of semiconductor films, and the second gate electrode overlap,
wherein a concentration in nitrogen of the first oxide semiconductor film is higher than a concentration in nitrogen of the second oxide semiconductor film.

* * * * *